United States Patent
Takaki

(10) Patent No.: US 9,613,689 B1
(45) Date of Patent: Apr. 4, 2017

(54) SELF-SELECTING LOCAL BIT LINE FOR A THREE-DIMENSIONAL MEMORY ARRAY

(71) Applicant: SANDISK TECHNOLOGIES LLC, Plano, TX (US)

(72) Inventor: Seje Takaki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/205,576

(22) Filed: Jul. 8, 2016

(51) Int. Cl.
*G11C 13/04* (2006.01)
*G11C 13/00* (2006.01)
*H01L 23/528* (2006.01)
*H01L 27/24* (2006.01)
*H01L 45/00* (2006.01)
*G11C 11/56* (2006.01)

(52) U.S. Cl.
CPC ...... *G11C 13/0007* (2013.01); *G11C 13/0069* (2013.01); *H01L 23/528* (2013.01); *H01L 27/249* (2013.01); *H01L 27/2427* (2013.01); *H01L 45/08* (2013.01); *H01L 45/1233* (2013.01); *H01L 45/142* (2013.01); *H01L 45/143* (2013.01); *H01L 45/144* (2013.01); *H01L 45/146* (2013.01); *G11C 11/5678* (2013.01); *G11C 13/0004* (2013.01); *G11C 2013/0078* (2013.01); *G11C 2213/32* (2013.01); *G11C 2213/71* (2013.01); *G11C 2213/72* (2013.01)

(58) Field of Classification Search
CPC ............ G11C 13/0004; G11C 13/0069; G11C 11/5678
USPC ........................................ 365/163, 148, 175
See application file for complete search history.

(56) References Cited

U.S. PATENT DOCUMENTS

| 5,915,167 A | 6/1999 | Leedy |
| 8,014,185 B2 | 9/2011 | Scheuerlein |
| 8,557,654 B2 | 10/2013 | Rabkin et al. |

(Continued)

FOREIGN PATENT DOCUMENTS

WO    WO 2007/004843 A1    1/2007

OTHER PUBLICATIONS

Jo, S.H. et al., "Cross-Point Resistive RAM Based on Field-Assisted Superlinear Threshold Selector," IEEE Transactions on Electron Devices, vol. 62, No. 11, pp. 3477-3481, (2015).

(Continued)

*Primary Examiner* — Jason Lappas
(74) *Attorney, Agent, or Firm* — The Marbury Law Group PLLC

(57) ABSTRACT

A three-dimensional memory device includes an alternating stack of word lines and insulating layers, a plurality of gate lines, a plurality of global bit lines, and a plurality of local bit lines contacting a respective gate line and global bit line. A plurality of memory elements is located at each overlap region between the word lines and the local bit lines. A plurality of diodes located in electrical series between each of the local bit lines and the respective one of the plurality of gate lines. A plurality of selector elements located in electrical series between each of the local bit lines and the respective one of the plurality of global bit lines. The plurality of selector elements includes a material that provides a conductivity change of at least one order of magnitude upon application of a voltage.

22 Claims, 62 Drawing Sheets

(56) References Cited

U.S. PATENT DOCUMENTS

| | | | |
|---|---|---|---|
| 2010/0124097 A1* | 5/2010 | Takase | G11C 5/02 |
| | | | 365/148 |
| 2013/0043455 A1 | 2/2013 | Bateman | |
| 2015/0263069 A1 | 9/2015 | Jo | |
| 2016/0043143 A1 | 2/2016 | Sakotsubo et al. | |

OTHER PUBLICATIONS

U.S. Appl. No. 14/635,419, filed Mar. 2, 2015, SanDisk 3D LLC.
U.S. Appl. No. 14/851,296, filed Sep. 11, 2015, SanDisk 3D LLC.
U.S. Appl. No. 14/924,144, filed Oct. 27, 2015, SanDisk 3D LLC.
U.S. Appl. No. 15/157,945, filed May 18, 2016, SanDisk Technologies LLC.

* cited by examiner

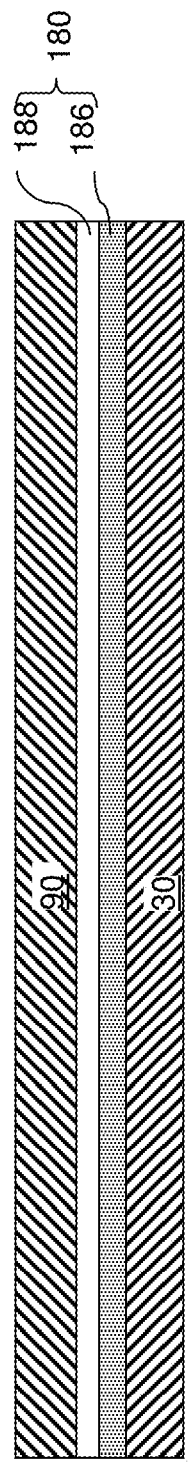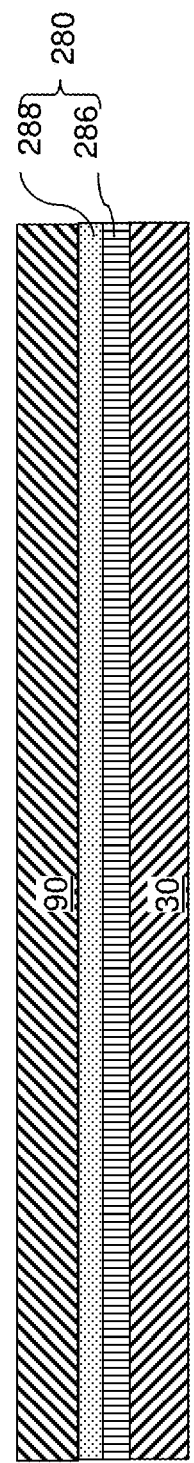
FIG. 4
FIG. 5

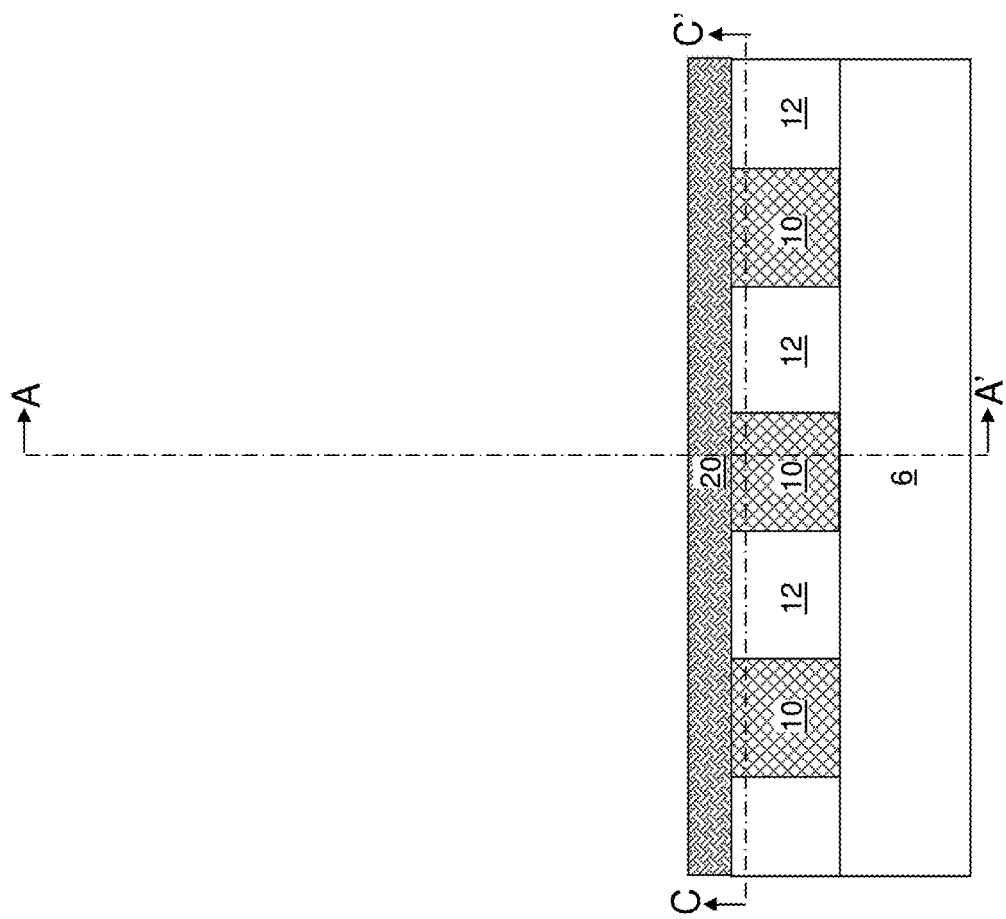

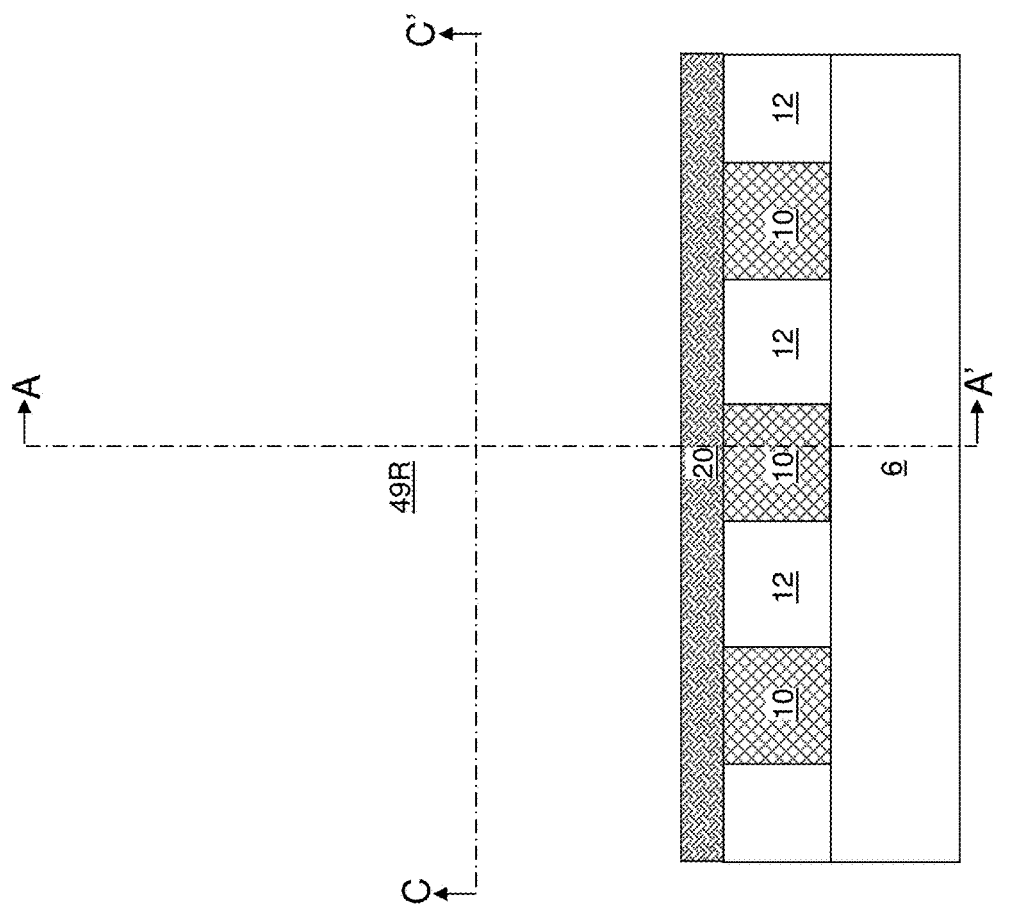

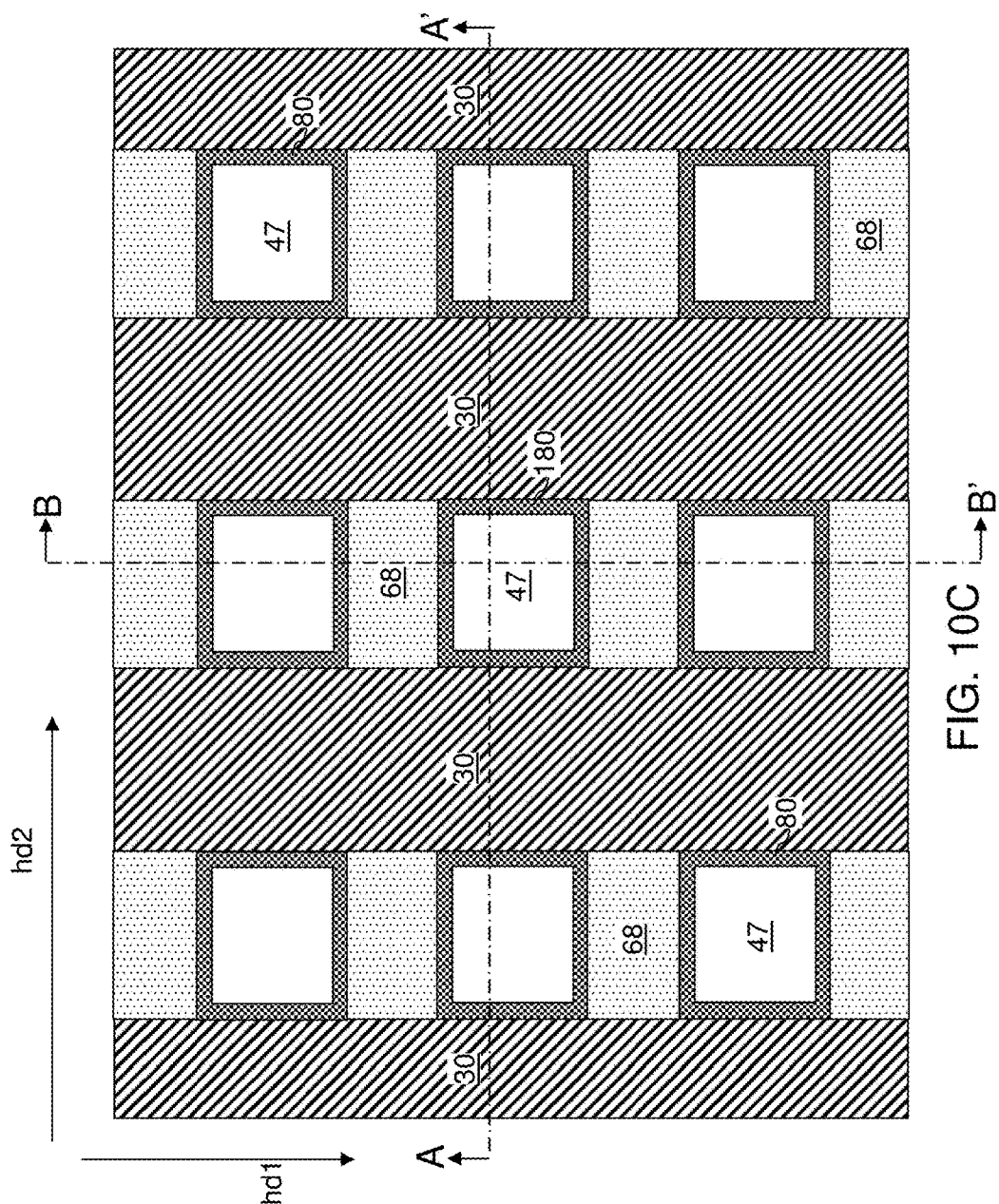

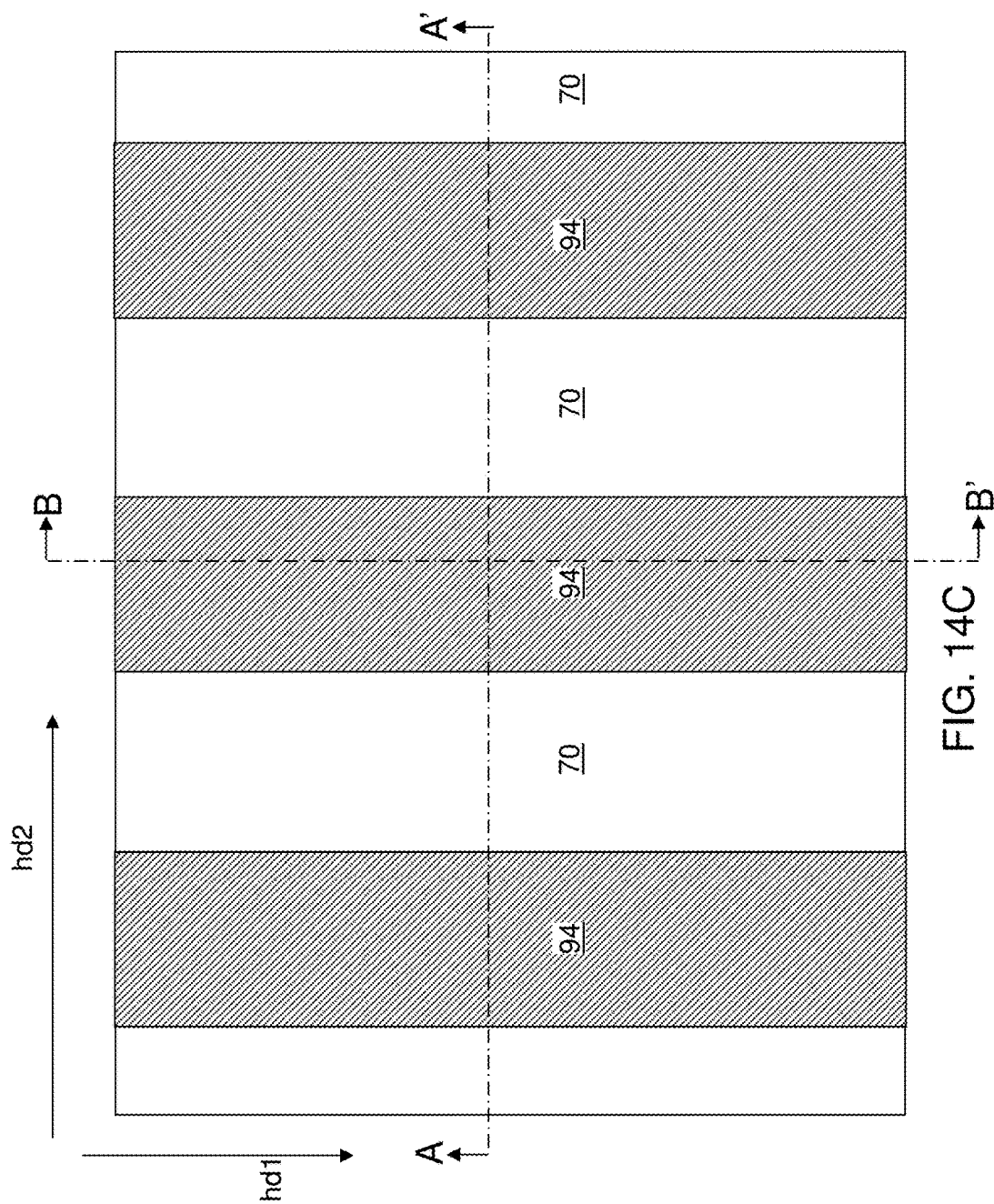

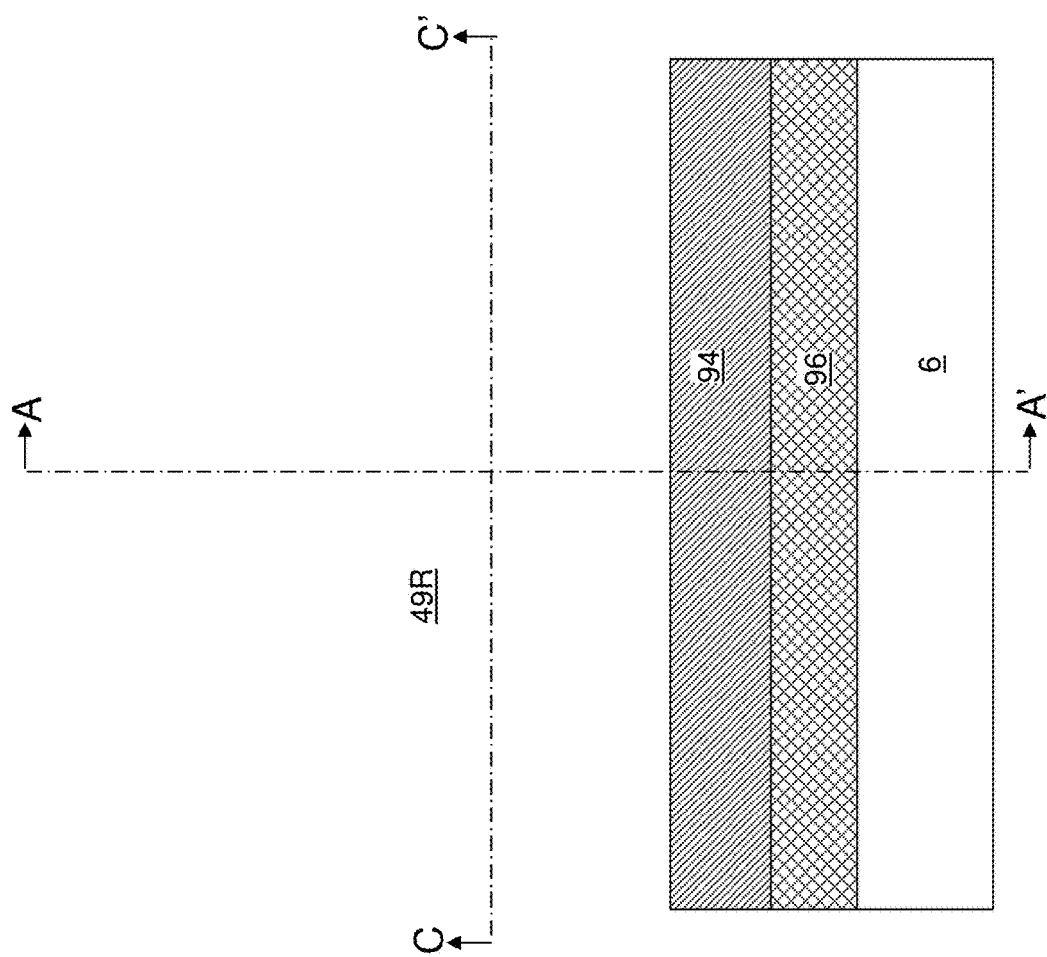

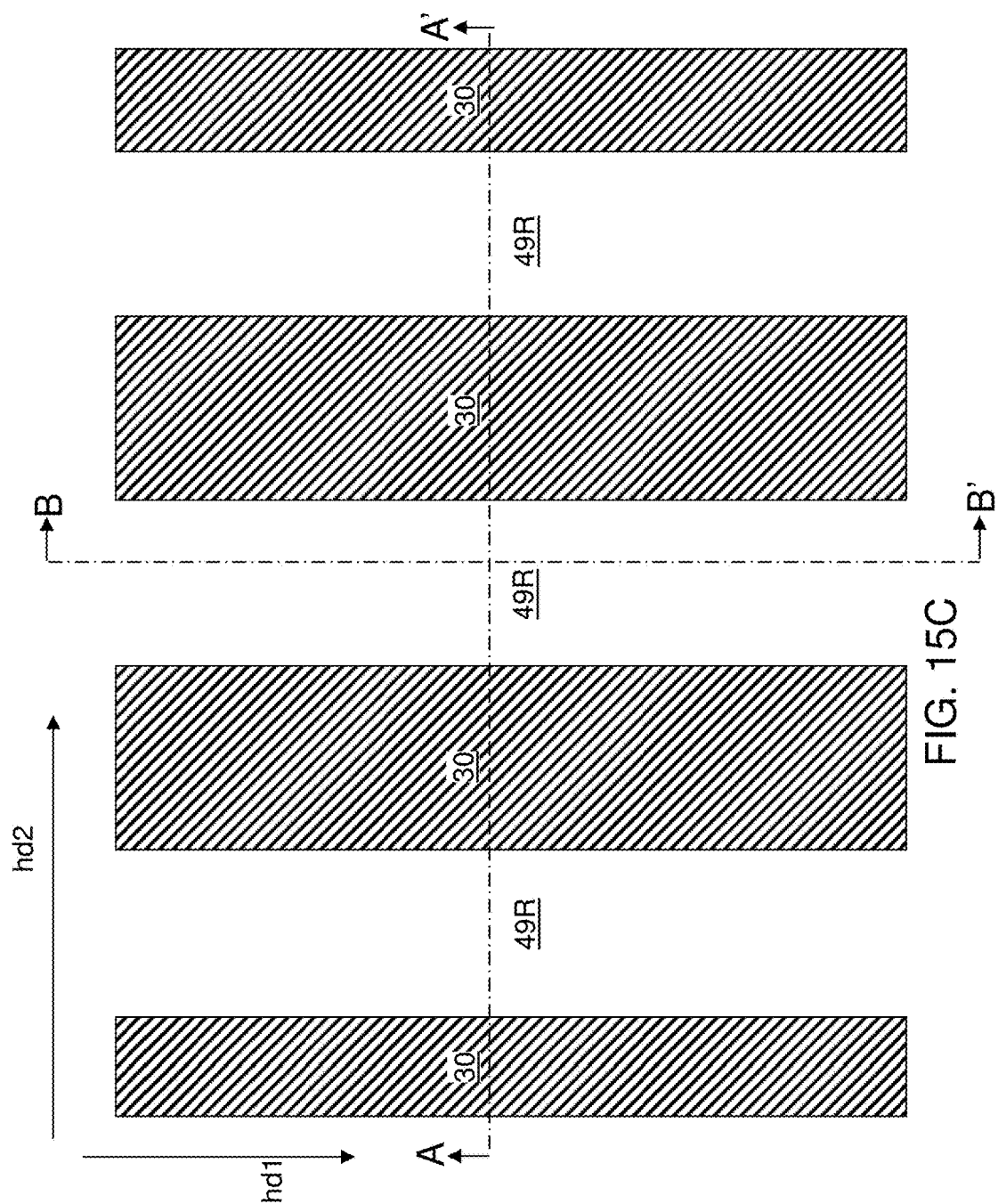

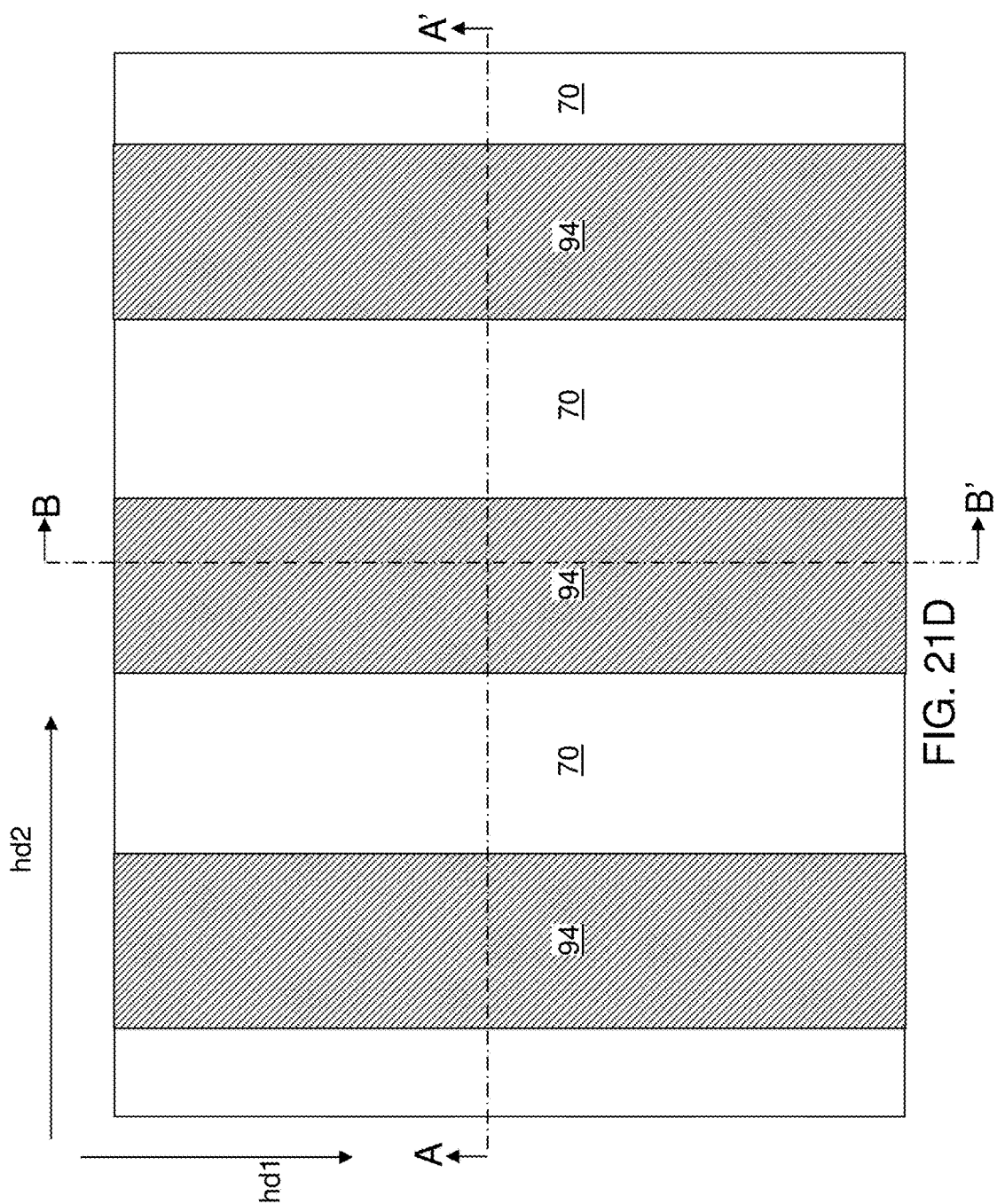

SELF-SELECTING LOCAL BIT LINE FOR A THREE-DIMENSIONAL MEMORY ARRAY

FIELD

The present disclosure relates generally to the field of semiconductor devices and specifically to three-dimensional memory devices including self-selecting local bit lines, and methods of making the same.

BACKGROUND

A resistance random access memory, or a "ReRAM," is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths or by increasing a crystallinity of the thin film. Application of a different type of electrical voltage bias can cause reversal of the resistance of the thin film to an original high-resistance state, such as by removal of the filaments from the thin film or by decreasing the crystallinity of the thin film.

Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A vacancy-modulated conductive oxide (VMCO) resistive random access memory (ReRAM) device is a ReRAM in which the resistance of a memory element is modulated by separation or recombination of oxygen vacancies and interstitial oxygen ions. When the interstitial oxygen ions combine with the oxygen vacancies, a zone with a low density of charge carriers is formed due to reduction in oxygen vacancies, thereby increasing the resistance of the memory element. This operation is herein referred to as a "resetting" operation. When the interstitial oxygen ion and oxygen vacancy pairs are created due to the separation of the interstitial oxygen ion from the vacancy lattice site, a zone with a high density of charge carriers is formed due to creation of oxygen vacancies, thereby decreasing the resistance of the memory element. This operation is herein referred to as a "setting" operation.

SUMMARY

According to an aspect of the present disclosure, a three-dimensional memory device is provided, which comprises an alternating stack of word lines and insulating layers, a plurality of gate lines, a plurality of global bit lines, a plurality of local bit lines vertically extending through the alternating stack, wherein each local bit line of the plurality of local bit lines contacts a respective one of the plurality of gate lines and a respective one of the plurality of global bit lines, a plurality of memory elements located at each overlap region between the word lines and the local bit lines, a plurality of diodes, and a plurality of selector elements. Each of the plurality of diodes is located in electrical series between each of the local bit lines and the respective one of the plurality of gate lines, and a plurality of selector elements. Each of the plurality of selector elements is located in electrical series between each of the local bit lines and the respective one of the plurality of global bit lines. The plurality of selector elements comprise a material that provides a conductivity change of at least one order of magnitude upon application of a voltage.

According to another aspect of the present disclosure, a method of operating a three-dimensional memory device is provided. The three-dimensional memory device comprises a plurality of gate lines, a plurality of global bit lines, a plurality of word lines, a plurality of diodes, a plurality of selector elements, a plurality of local bit lines, and a plurality of memory elements. Each local bit line of the plurality of bit lines contacts a respective one of the plurality of gate lines and a respective one of the plurality of global bit lines, and each memory element of the plurality of memory elements is located at each overlap region between the word lines and the local bit lines. The method comprises applying a word line select voltage to a selected word line, and applying a switching voltage to a selected local bit line through one of the plurality of selector elements and through one of the plurality of diodes to program a selected memory element located between the selected word line and the selected local bit line.

According to another aspect of the present disclosure, a method of operating a three-dimensional memory device is provided. A three-dimensional memory device is provided, which comprises: an alternating stack of electrically conductive layers and insulating layers, wherein each layer in the alternating stack laterally extends along a first horizontal direction, local bit lines located over sidewalls of layers within the alternating stack and vertically extending from a bottommost layer within the alternating stack to a topmost layer within the alternating stack, memory elements located at each overlap region between the electrically conductive layers and the local bit lines, diodes located at a first end of each of the local bit lines, and a selector material layer located at a second end of each of the local bit lines and comprising a material that provides a conductivity change of at least one order of magnitude upon application of an electrical bias voltage. A selected local bit line is activated by locally lowering resistance of a region of the selector material layer that underlies, or overlies, the selected bit line. A selected electrically conductive layer is activated by applying a word line select voltage thereto, wherein a memory element located between the selected local bit line and the selected electrically conductive layer is selected for programming or sensing.

BRIEF DESCRIPTION OF THE DRAWINGS

In the figures including one or more planes of cross-sectional views, the letters represent the plane of the cross-sectional view for the figure having the same prefix numeral as the respective figure and having the same suffix letter as the letter represented by the respective plane.

For example, the plane A-A' in FIG. 6B represents the plane of the cross-sectional view for FIG. 6A, the plane C-C' in FIG. 6A represents the plane of the cross-sectional view for FIG. 6C, etc.

FIG. 4 illustrates a first exemplary memory film that can be employed in the three-dimensional memory device of the present disclosure.

FIG. 5 illustrates a second exemplary memory film that can be employed in the three-dimensional memory device of the present disclosure.

FIG. 6B is a second vertical cross-sectional view of the first exemplary structure of FIG. 6A along the vertical plane B-B'.

FIG. 7B is a second vertical cross-sectional view of the first exemplary structure of FIG. 7A along the vertical plane B-B'.

FIG. 10C is a horizontal cross-sectional view of the first exemplary structure of FIGS. 10A and 10B along the horizontal plane C-C'.

FIG. 14C is a horizontal cross-sectional view of the second exemplary structure of FIGS. 14A and 14B along the horizontal plane C-C'.

FIG. 15B is a second vertical cross-sectional view of the second exemplary structure of FIG. 15A along the vertical plane B-B'.

FIG. 15C is a horizontal cross-sectional view of the second exemplary structure of FIGS. 15A and 15B along the horizontal plane C-C'.

FIG. 21D is a horizontal cross-sectional view of the second exemplary structure of FIGS. 21A and 21B along the horizontal plane D-D'.

DETAILED DESCRIPTION

Figure 1:
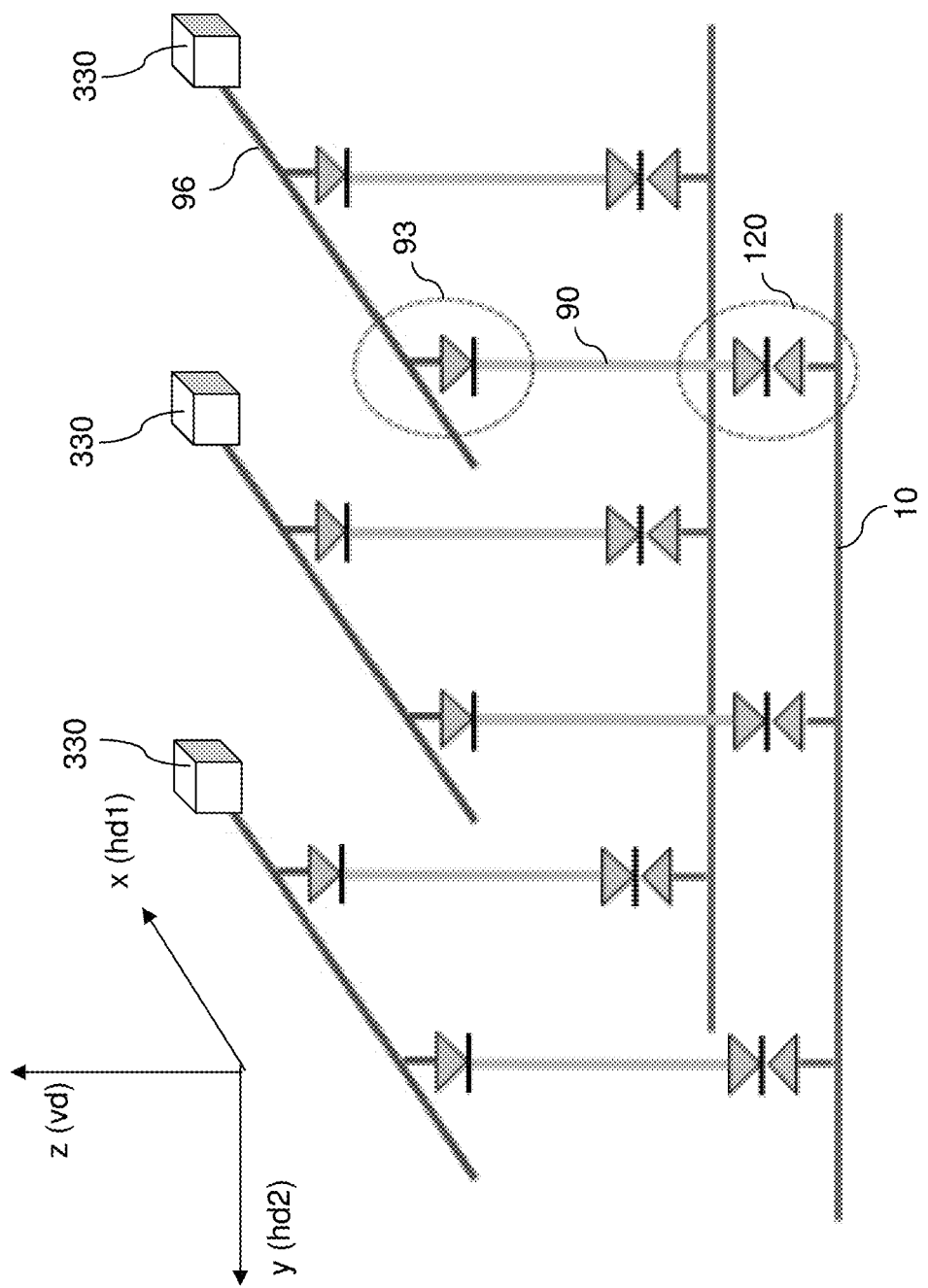
FIG. 1 is a schematic diagram of a circuit for an exemplary three-dimensional memory device in which local bit lines, global bit lines, gate lines, selector elements, and diodes are illustrated.

As discussed above, the present disclosure is directed to three-dimensional memory devices including self-selecting local bit lines, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

As used herein, a "semiconductor material" refers to a material having electrical conductivity in the range from 1.0×10$^{-6}$ S/cm to 1.0×10$^5$ S/cm, and is capable of producing a doped material having electrical conductivity in a range from 1.0 S/cm to 1.0×10$^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than 1.0×10$^5$ S/cm. As used herein, an "insulating material" or a "dielectric material" refers to a material having electrical conductivity less than 1.0×10$^{-6}$ S/cm. All measurements for electrical conductivities are made at the standard condition. Optionally, at least one doped well (not expressly shown) can be formed within the substrate semiconductor layer 9.

Referring to FIG. 1, a schematic diagram of a circuit for an exemplary three-dimensional memory device of the present disclosure is illustrated. The schematic diagram illustrates local bit lines 90, global bit lines 10, gate lines 96, a current limiting circuitry 330, selector elements 120, and diodes 93 within the exemplary memory device. The schematic diagram omits resistive memory elements and word lines for the sake of clarity. The exemplary three-dimensional memory device can include a three-dimensional array of resistive memory elements that are accessible through selection of a global bit line 10, gate line 96, and a word line. The three-dimensional array of resistive memory elements can be arranged over a substrate in a volume of a rectangular parallelepiped, of which three directions of sides are herein referred to as an x-direction (also referred to as a first horizontal direction hd1), a y-direction (also referred to as a second horizontal direction hd2), and a z-direction (also referred to as a vertical direction). It is understood that the three-dimensional array of resistive memory elements can be arranged in a volume of a non-rectangular parallelepiped, in which case the first horizontal direction hd1 and the second horizontal direction are not mutually perpendicular to each other, and/or the vertical direction is replaced with an oblique direction. Further, it is understood that the exemplary three-dimensional memory device can be rotated in any arbitrary orientation during manufacturing or usage.

The global bit lines 10 can extend along the second horizontal direction hd2 (which may be the direction of the y-axis), and can be spaced from one another along the first horizontal direction hd1 (which may be the direction of the x-axis). The gate lines 96 can extend along the first horizontal direction hd1, and can be spaced from one another along the second horizontal direction hd2. The local bit lines 90 extend in the vertical direction vd (which may be the direction of the z-axis) perpendicular to the top surface of the substrate. The local bit lines 90 provide a two-dimensional array of vertical conductive paths at each two-dimensional grid point at which the global bit lines 10 and the gate lines 96 overlap in a plan view (i.e., a view along the vertical direction).

A selector element 120 can be provided between each local bit line 90 and an underlying (or overlying) global bit line 10. In other words, the selector element 120 is located in electrically series between the local bit line 90 and the global bit line 10. This location of the selector element 120 different from a selector element which is located in each memory cell between the resistive memory element and its respective word line. Optionally, additional selector elements, such as diodes, etc. may be located in each memory cell between the resistive memory element and its respective word line in addition to the selector element 120 located between each local bit line 90 and its respective underlying (or overlying) global bit line 10. As used herein, a selector element 120 is an element that displays a non-linear voltage-current characteristic such that the element functions as an electrical insulator in a first voltage range and functions as an electrical conductor in a second voltage range. In an embodiment, the selector element 120 may be used to replace an active switching transistor, such as a metal oxide semiconductor (MOS) thin film transistor (TFT) which is used as a select transistor for each local bit line in prior art ReRAM devices. Thus, in one embodiment, a switching transistor is omitted between each local bit line 90 and its respective global bit line 10 such that no transistor is located in electrical series between the local bit line 90 and its respective global bit line 10 to which the local bit line is electrically connected.

The selector element 120 may be a non-volatile or volatile passive selector element. In one embodiment, the selector element 120 may comprise an ovonic threshold switch. An example of an ovonic threshold switch ("OTS") is a chalcogenide alloy material (e.g., compound semiconductor material containing at least one chalcogen element) which switches between the high resistance amorphous (or smaller grain polycrystalline) and low resistance polycrystalline (or larger grain polycrystalline) phases upon application of reset and set current to the OTS. Exemplary OTS materials include Ge—Sb—Te (e.g., Ge$_2$Sb$_2$Te$_5$), Ag—Ge—S, Cu—Ge—S, Ag—Ge—Te, Cu—Ge—Te, Ag—In—Sb—Te, and As—Te—Ge—Si—N.

In another embodiment, the selector element 120 may comprise an oxide material that functions as an insulator in a lower electric field (e.g., at a lower voltage) and functions as a conductor at a higher electric field (e.g., at a higher voltage). Examples of such oxide materials include sub-stoichiometric (i.e., oxygen poor) oxides, such as SiO$_x$, TiO$_x$, AlO$_x$, WO$_x$, Ti(N$_{1-y}$O$_y$)$_x$, Si(N$_{1-y}$O$_y$)$_x$, where x is a value which makes the material sub-stoichiometric (i.e., oxygen deficient compared to the stoichiometric oxide). For example, for silicon oxide the value of x is less than 2, and for aluminum oxide, the value of x is less than 1.5. Examples of such materials in each memory cell are described in U.S. Published Application 2015/0263069 A1 (published Sep. 17, 2015 and naming Sung Hyun Jo as the inventor) and in an article by Sung Hyun Jo et al., "Cross-Point Resistive RAM Based on Field-Assisted Superlinear Threshold Selector", IEEE Transactions on Electron Devices, Vol. 62, No. 11, November 2015. In another embodiment, the selector element 120 may comprise the above described sub-stoichiometric oxide material layer located between two above described chalcogenide layers, as described in U.S. Published Application 2015/0263069, which is incorporated herein by reference in its entirety.

Figure 2:
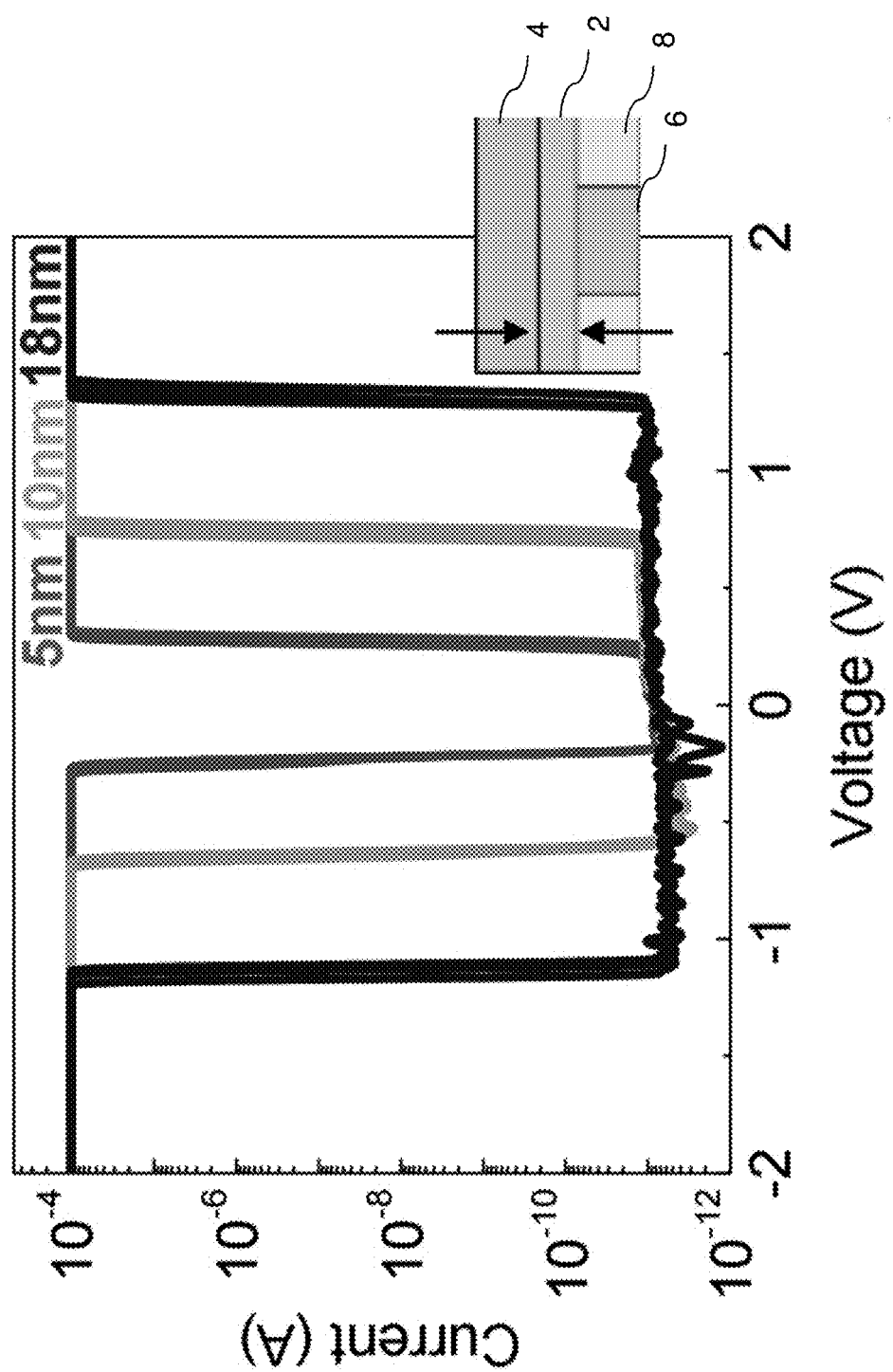
FIG. 2 illustrates a current-voltage characteristic of a selector element that can be employed in the three-dimensional memory devices of the present disclosure.
Figure 3:
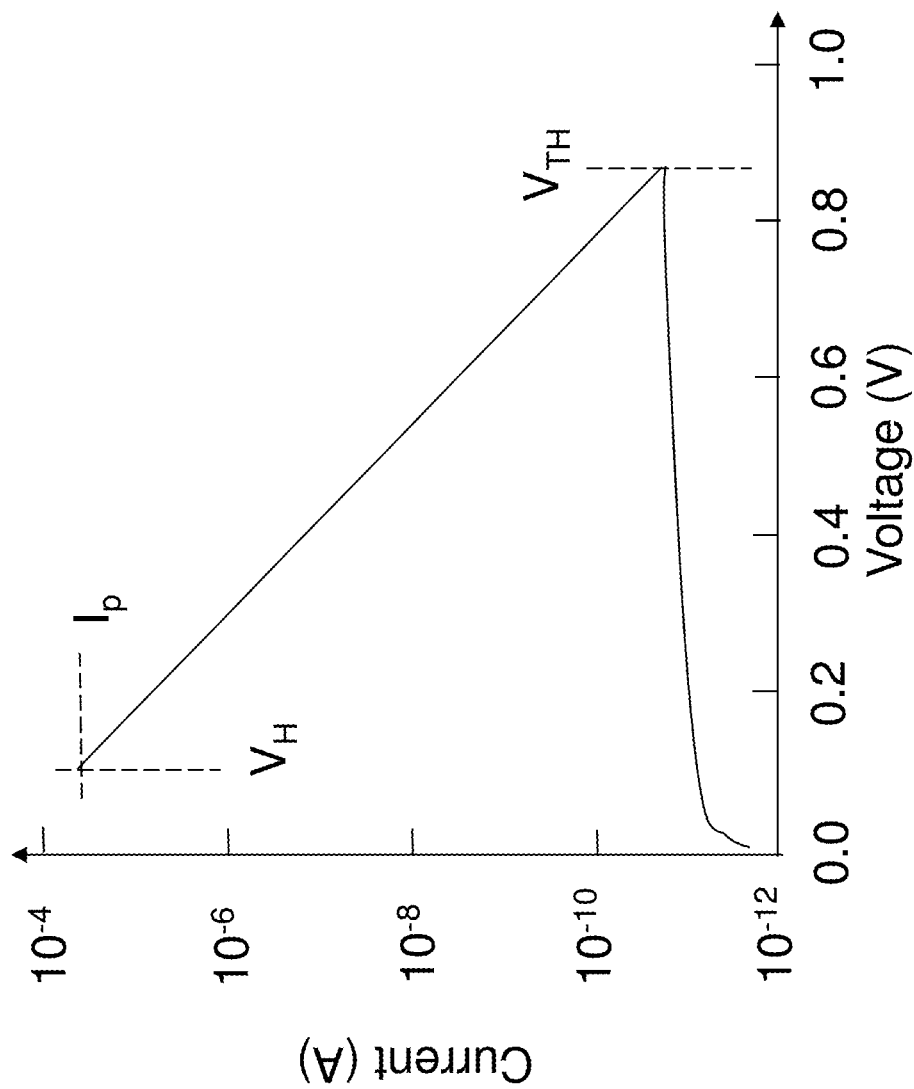
FIG. 3 illustrates the correlation between the electrical current and the voltage drop across a selector element that can be employed in the three-dimensional memory devices of the present disclosure.

FIG. 2 illustrates a current-voltage plot and a memory cell containing a sub-stoichiometric, non-Ohmic oxide selector element of the type disclosed in the Sung Hyun Jo et al. article, which can be employed as the selector element 120 located between the local and global bit lines of the present disclosure. FIG. 3 illustrates the correlation between the electrical current and the voltage drop across the selector element of FIG. 2. The selector element shown in FIG. 2 includes a non-Ohmic oxide material layer 2 having a non-linear current-voltage characteristic located between top and bottom electrodes (4, 6) of a memory cell described in the above article. An insulating layer 8 may be located around the bottom electrode 6. The thickness of the non-Ohmic oxide material layer 2 between the two vertical arrows may be 5 nm, 10 nm or 18 nm as shown by the corresponding lines in the current-voltage plot of FIG. 2.

The non-Ohmic oxide material is a dielectric material when no electric field (i.e., no voltage) is applied to the material. The non-Ohmic oxide material remains a dielectric material (i.e., electrically insulating) until the field strength of the applied electric field exceeds a critical electric field strength (i.e., until the applied voltage exceeds a threshold voltage, $V_{TH}$). The non-Ohmic oxide material becomes electrically conductive under an electric field strength above the critical electric field strength (i.e., when the applied voltage exceeds a threshold voltage, $V_{TH}$). The non-Ohmic oxide material remains conductive while the electrical current flows and an electric field having a field strength above a minimum electric field strength (i.e., while the applied voltage exceeds a threshold voltage, $V_{TH}$) is maintained. The non-Ohmic material provides a conductivity change (i.e., increased in the electrical conductivity or a corresponding decrease in electrical resistance or resistivity) of at least one order of magnitude, and preferably greater than two orders of magnitude, and even more preferably greater than three orders of magnitude, upon and during application of a voltage having a magnitude (e.g., equal to or greater than $V_{TH}$) sufficient to generate at least the critical field strength. Thus, the voltage that triggers the transition from the non-conductive state to the conductive state is herein referred to as the threshold voltage, $V_{TH}$. If another resistive element (or any other current limiting element) is connected in series with the selector element, the voltage drop across the selector element can be reduced to a high conductivity state voltage drop $V_H$, which can be substantially lower than the threshold voltage $V_{TH}$. The electrical current through the selector element correspondingly increases to a higher value (such as $I_p$ illustrated in FIG. 3).

Once the electric field is completely turned off and the electrical current flow stops accordingly, the material becomes a dielectric material, and remains non-conductive until, and unless, another electric field exceeding the critical filed strength (i.e., a voltage equal to or greater than the threshold voltage) is applied again. This makes the non-Ohmic oxide a volatile switch. The threshold voltage $V_{TH}$ at which the critical field strength is applied varies depending on the dimensions (which include the thickness of non-Ohmic oxide) of the selector element. Thus, by scaling the thickness of the material of the selector element, the threshold voltage $V_{TH}$ of the selector element can be adjusted. Thus, the selector element functions as a bimodal switch that remains non-conductive unless a voltage greater than the threshold voltage $V_{TH}$ is applied across the selector element, becomes conductive when a voltage equal to, or greater than, the threshold voltage $V_{TH}$ is applied across the selector element, and remains conductive as long as a voltage having a magnitude greater than the high conductivity state voltage drop $V_H$ is applied across the selector element.

Referring back to FIG. 1, a diode 93, such as a p-n junction diode or a p-i-n junction diode, can be provided between each local bit line 90 and an overlying (or underlying) gate line 96. Thus, the diode is located in electrical series between the local bit line 90 and the respective gate line 96 to which the local bit line is electrically connected. Thus, the diode 93 is not located in each memory cell but between the local bit line and a respective gate line. If desired, optional additional diodes may be located in each memory cell. The diodes 93 enable a unidirectional current flow therethrough. The direction of the diodes can be selected to enable current flow through a local bit line 90 when a global bit line select voltage is applied to a connected global bit line 10 and a gate line select voltage is applied to a connected gate line 96. For example, the diode can include a first conductivity type semiconductor layer (e.g., an n-doped semiconductor layer) including dopants of a first conductivity type (e.g., n-type dopants) at an atomic concentration greater than $5.0 \times 10^{19}/cm^3$, and a second conductivity type semiconductor region (e.g., a p-doped semiconductor layer) including dopants of a second conductivity type (which is the opposite of the first conductivity type, e.g., p-type dopants) at an atomic concentration less than $5.0 \times 10^{19}/cm^3$. The thickness of the first conductivity type semiconductor layer can be in a range from 20 nm to 1 micron, and the thickness of the second conductivity type semiconductor layer can be in a range from 2 nm to 100 nm, although lesser and greater thicknesses can also be employed. In an alternative embodiment, the diode 93 may comprise a p-i-n diode in which an intrinsic semiconductor region is located between p-type and n-type semiconductor regions or a Schottky diode in which a layer of doped semiconductor material contacts an electrically conductive Schottky barrier material.

The gate lines 96 extend along the first horizontal direction hd1, which is different from, and may be perpendicular to, the direction of the global bit lines 10. The device may include optional current limiting circuitry 330 configured to limit electrical current passing through each of the gate lines 96. Components of the current limiting circuitry 330 can be connected between each gate line 96 and a respective voltage source that biases the gate line 96. Any current limiting device known in the art can be employed for the current limiting circuitry 330 provided that the current limiting circuitry 330 limit electrical current passing through each of the gate lines 96 to a level less than 20% of an on-current for a single memory element (which may be a resistive memory element) among the memory elements. In one embodiment, the current limiting circuitry 330 limit electrical current passing through each of the gate lines 96 to a level less than 10% (such as less than 5%) of the on-current for a single memory element among the memory elements. In an alternative embodiment, the current limiting circuitry 330 is omitted if the diode 93 provides a sufficient current limitation on the passing current.

The word lines (not illustrated in FIG. 1 for clarity, see word lines 30 in FIGS. 13A-13D, 21A-21D, 23, and 25) can be arranged as strips extending along the first horizontal direction hd1, stacked along the vertical direction (vd), and vertically spaced among one another by insulating layers. An alternating stack of word lines and insulating layers can be provided between each adjacent pair of rows of local bit lines 90 that extend along the first horizontal direction hd1.

The resistive memory elements (not illustrated in FIG. 1, see resistive memory elements 80 in FIGS. 13A-13D, 21A-21C and 27-30) are located at each intersection point between the local bit lines 90 and the word lines. In one embodiment, each local bit line 90 can be located adjacent to two vertical stacks of resistive memory elements. Each vertical stack of resistive memory elements can include as many number of resistive memory elements as the total number of word lines within the alternating stack of word lines and insulating layers.

In order to select a given resistive memory element in the exemplary three-dimensional memory device, a global bit line 10 having the same x-coordinate as the resistive memory element can be selected, for example, by applying a global bit line select voltage, while all other global bit lines 10 are biased at a global bit line standby voltage (or a global bit line "unselect voltage"). Further, a gate line 96 having the same y-coordinate as the resistive memory element can be selected, for example, by applying a gate line select voltage, while all other gate lines 96 are biased at a gate line standby voltage (or a gate line "unselect voltage"). In addition, a word line that is adjacent to the resistive memory element can be selected, for example, by applying a word line select voltage to the word line. Unselected word lines can be biased at a word line standby voltage.

The resistive memory elements each ReRAM memory cell may be filamentary or non-filamentary resistive memory elements. FIG. 4 illustrates a first exemplary filamentary memory film 180 that can be employed in the three-dimensional memory device of the present disclosure. The first exemplary memory film 180 can be located at each intersection point between word lines 30 and local bit line 90. The first exemplary memory film 180 includes an optional tunneling dielectric layer 86 and a filament-forming memory material layer 88 in contact with each other. As used herein, a "tunneling dielectric" refers to a dielectric material portion in which the predominant mode of electrical current conduction therethrough is charge carrier tunneling such as electron tunneling or hole tunneling. As used herein, a tunneling dielectric layer refers to a layer including at least one tunneling dielectric.

The filament-forming memory material layer 88 includes a dielectric material having multiple states providing different electrical resistance depending on an electrical bias that is previously applied thereto. The word line 30 can contact one of the tunneling dielectric layer 86 and the filament-forming memory material layer 88, and the local bit line 90 can contact the other of the tunneling dielectric layer 86 and the filament-forming memory material layer 88.

In one embodiment, the tunneling dielectric layer 86 comprises a dielectric material having a dielectric constant greater than 7.0, which can be silicon nitride or a dielectric metal oxide. In one embodiment, the tunneling dielectric layer 86 can include a dielectric material selected from silicon nitride and aluminum oxide. In one embodiment, the tunneling dielectric layer 86 can have a thickness in a range from 0.6 nm to 4 nm (such as from 1 nm to 3 nm), although lesser and greater thicknesses can also be employed.

In one embodiment, the filament-forming memory material layer 88 comprises a dielectric oxide providing a reduction in resistivity upon formation of conductive filaments therein. In one embodiment, the filament-forming memory material layer 88 comprises a dielectric oxide of a metal selected from Hf, Ti, Zr, Al, and Ta. Any other resistive memory material can be employed for the filament-forming memory material layer 88.

FIG. 5 illustrates a second exemplary non-filamentary memory film 280 that can be employed in the three-dimensional memory device of the present disclosure. The second exemplary memory film 280 can be located at each intersection point between word lines 30 and local bit line 90. The second exemplary memory film 280 includes a vacancy modulated resistive memory material layer 286 and an optional barrier material layer 288 in contact with each other. The word line 30 can contact one of the vacancy modulated resistive memory material layer 286 and the barrier material layer 288, and the local bit line can contact the other of the vacancy modulated resistive memory material layer 286 and the barrier material layer 288.

The vacancy modulated resistive memory material layer 286 includes a material that provides different resistance depending on the state of oxygen vacancies therein. Specifically, when oxygen vacancies are depleted at an interface with the barrier material layer 288, the vacancy modulated resistive memory material is in a high resistance state, or a "reset" state. When oxygen vacancies are repopulated at the interface with the barrier material layer 288, the vacancy modulated resistive memory material is in a low resistance state, or a "set" state. For example, the vacancy modulated resistive memory material layer 286 can include titanium oxide (e.g., sub-stoichiometric titanium oxide having less than two oxygen atoms for each one titanium atom). The thickness of the vacancy modulated resistive memory material layer 286 can be in a range from 10 nm to 120 nm, although lesser and greater widths can also be employed. The barrier material layer 288 includes a barrier material that provides a suitable band gap in a range from 0.6 eV to 7.6 eV in order to provide a suitable level of electrical isolation between the vacancy modulated resistive memory material layer 286 and one of a word line 30 and the local bit line 90 contacting the barrier material layer 288. For example, the barrier material portion can include a material portion that provides a suitable electronic barrier to limit current through the vacancy modulated resistive memory material layer 286. In one embodiment, the barrier material layer 288 can include a material such as amorphous silicon or aluminum oxide. The width of the barrier material layer 288 can be in a range from 10 nm to 120 nm, although lesser and greater widths can also be employed. Generally, a wide band gap material requires a lesser thickness, and a narrow band gap material requires a greater thickness.

In other embodiments, any other suitable resistivity switching memory material may be used in the memory elements of the present disclosure. For example, the memory elements may comprise the above described phase change chalcogenide material.

Figure 6A:
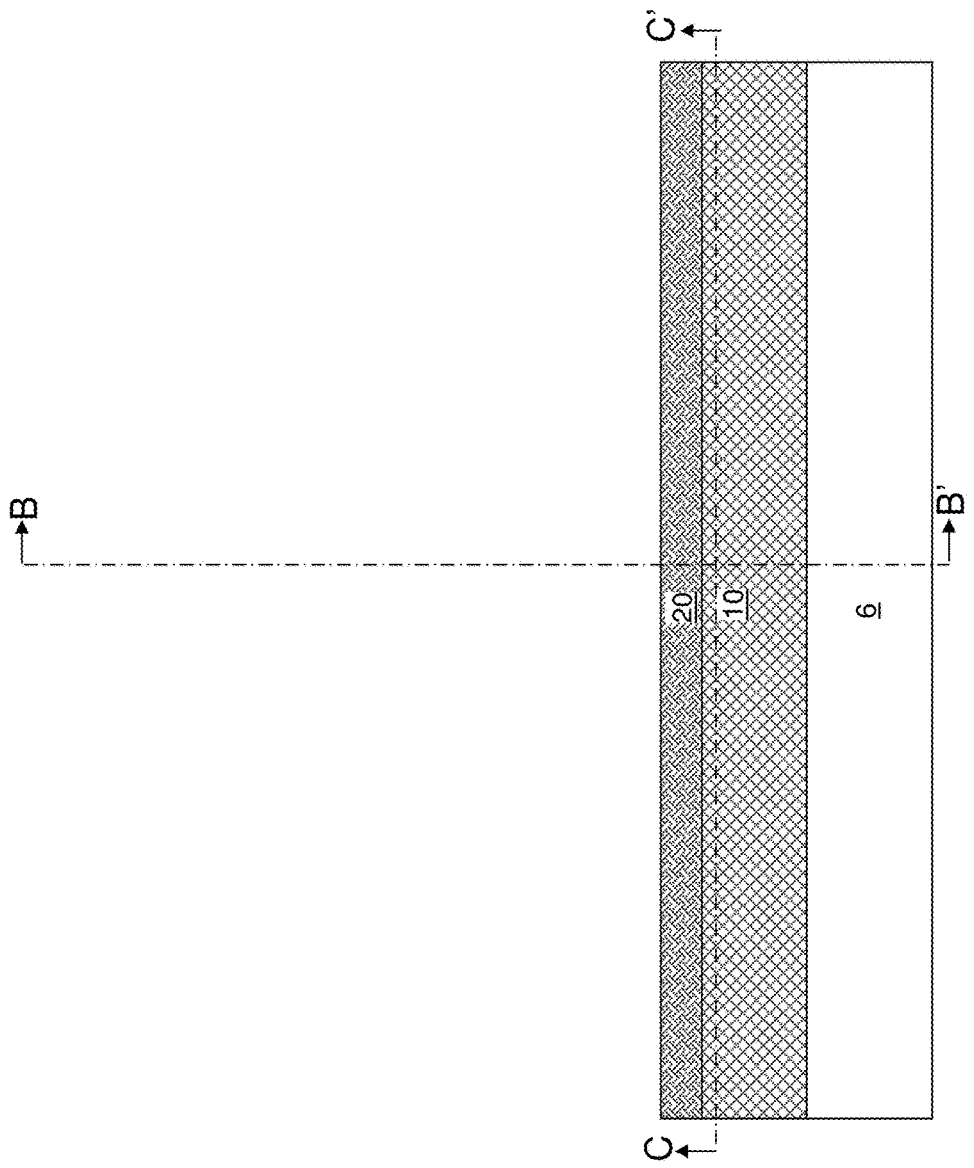
FIG. 6A is a first vertical cross-sectional view of a first exemplary structure for forming a three-dimensional memory device after forming global bit lines and a selector material layer according to a first embodiment of the present disclosure.
Figure 6C:
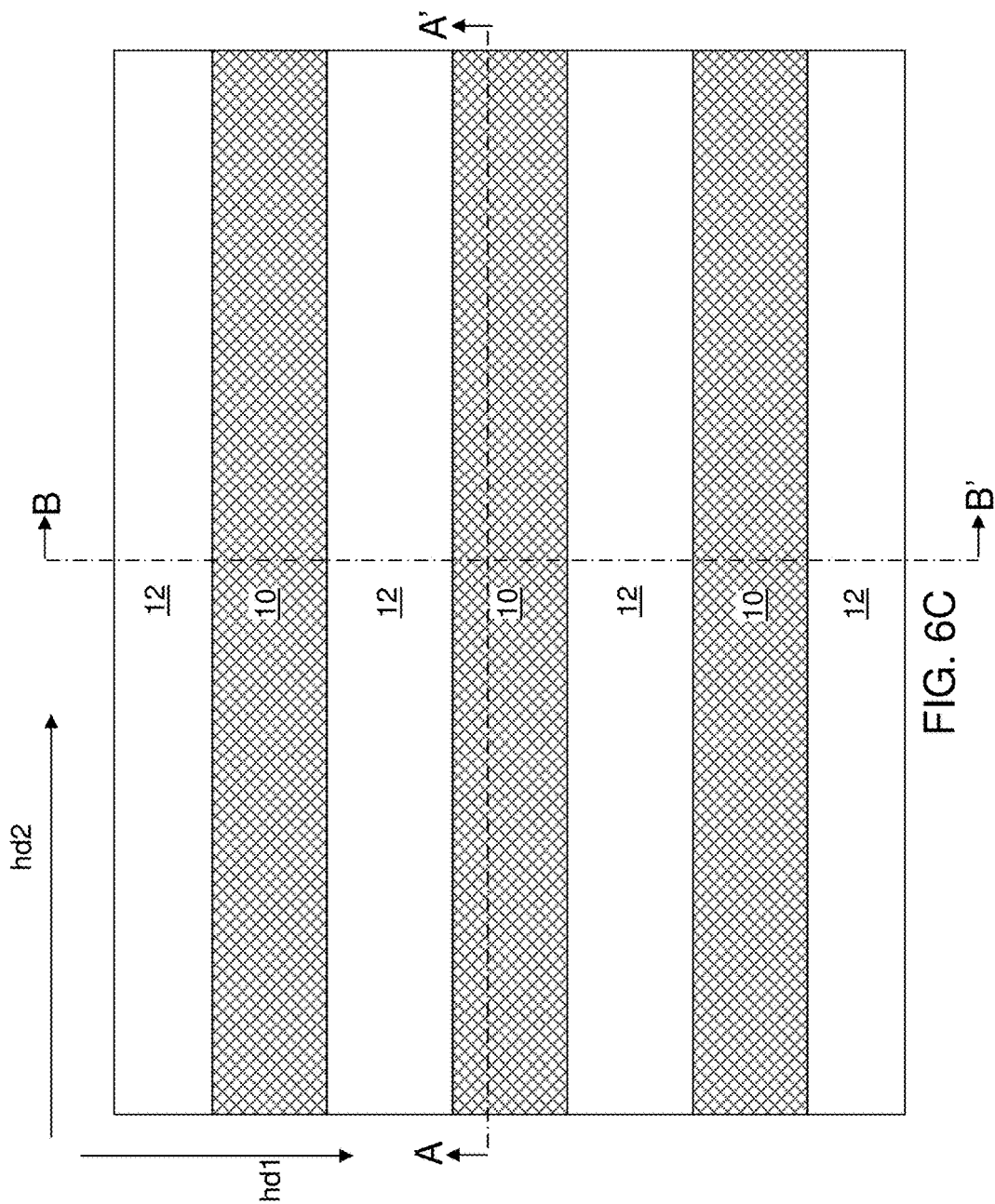
FIG. 6C is a horizontal cross-sectional view of the first exemplary structure of FIGS. 6A and 6B along the horizontal plane C-C'.

Referring to FIGS. 6A-6C, a first exemplary structure for forming a resistive random access memory device is illustrated, which can be an in-process ReRAM device. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense circuitries, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A selector material layer 20 is formed over the top surface of the global bit lines 10 and the separator dielectric material portions 12. The selector material layer 20 includes a planar layer of the above described phase change chalcogenide and/or non-Ohmic oxide material that can be employed for selector element 120. Portions of the selector material layer 20 that underlies local bit lines to be subsequently formed can constitute selector elements 120 described above. The thickness of the selector material layer 20 can be in a range from 4 nm to 20 nm, although lesser and greater thicknesses can also be employed.

Figure 7A:
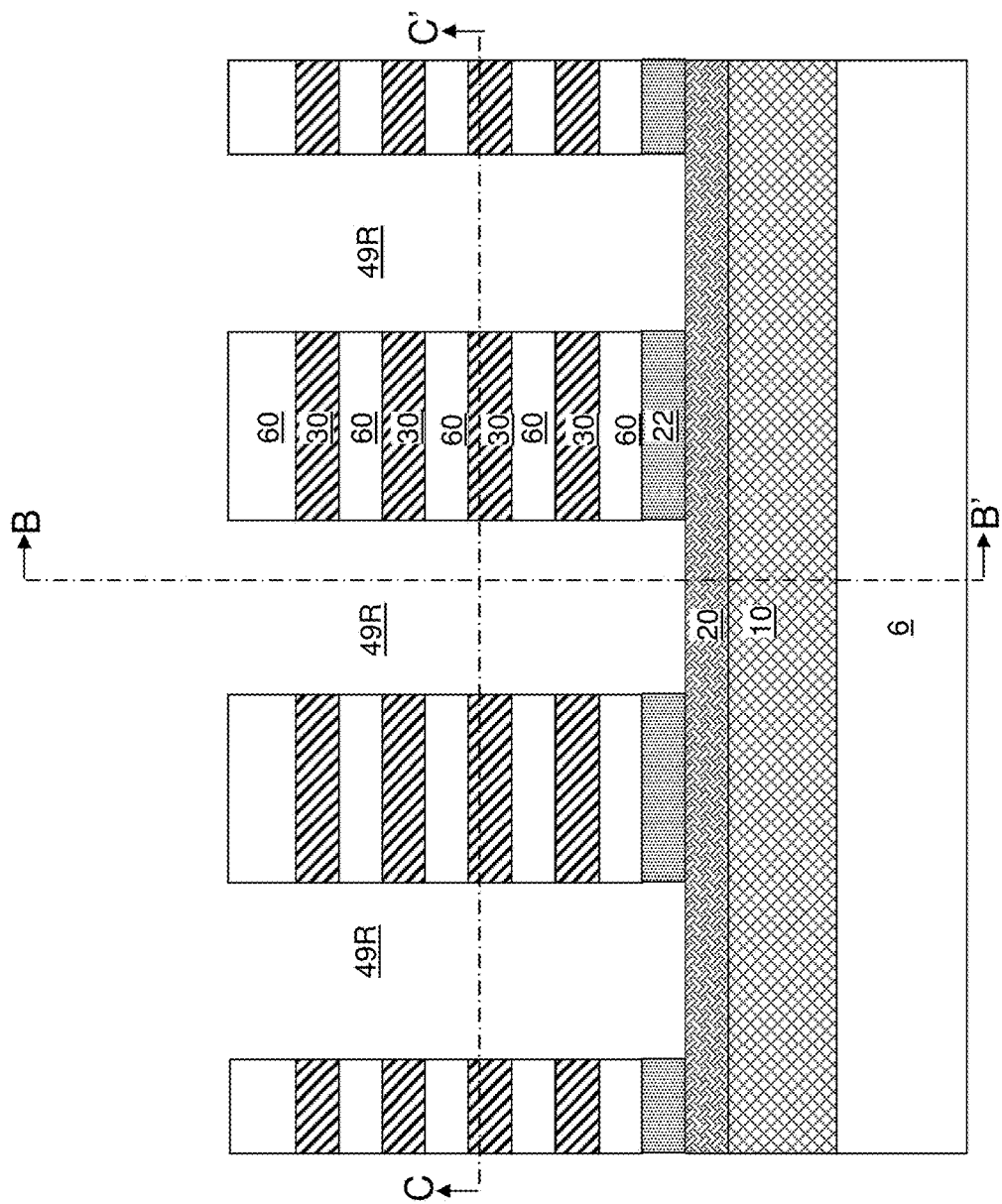
FIG. 7A is a first vertical cross-sectional view of the first exemplary structure after forming alternating stacks of insulating layers and electrically conductive layers and rail trenches according to the first embodiment of the present disclosure.
Figure 7C:
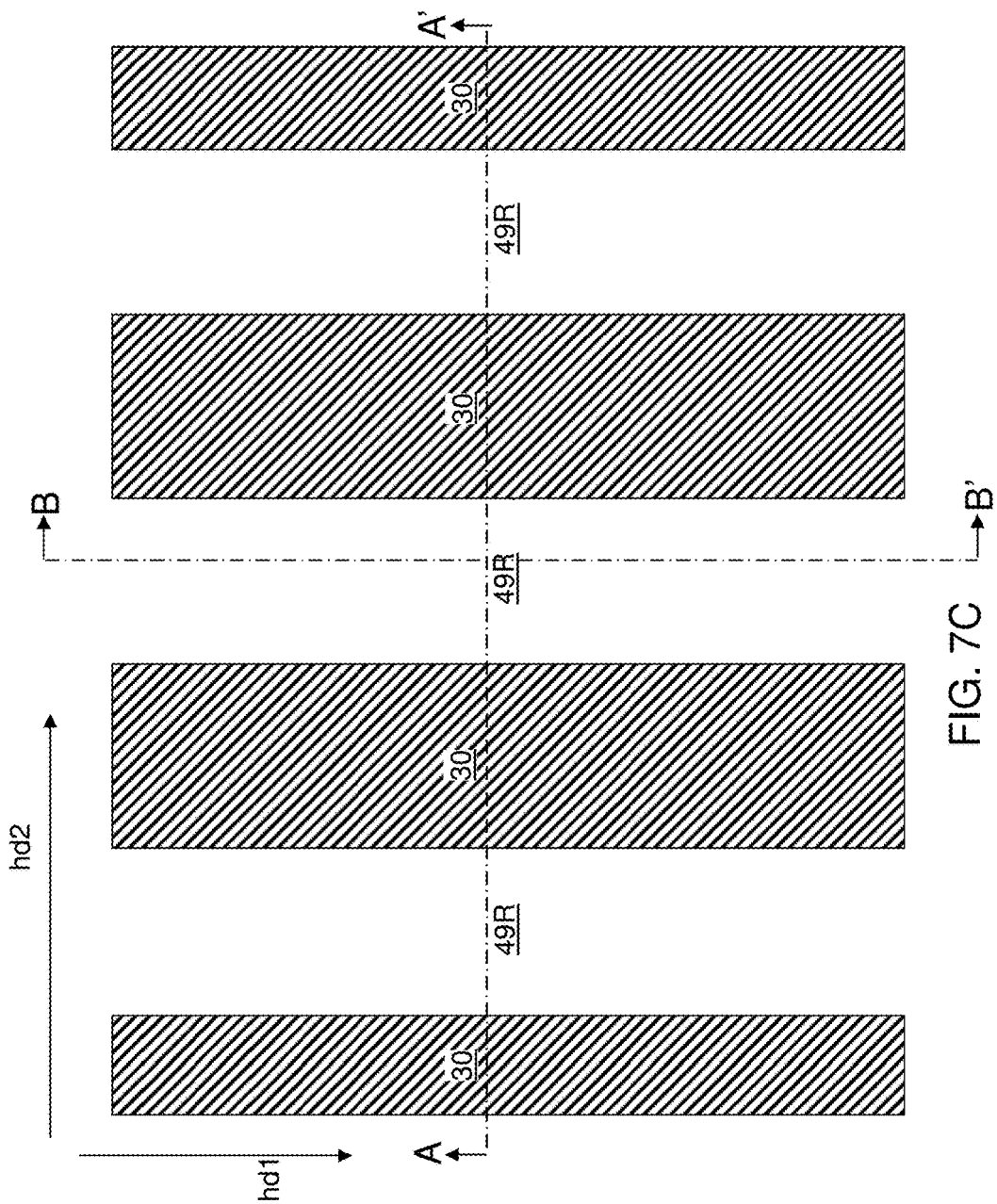
FIG. 7C is a horizontal cross-sectional view of the first exemplary structure of FIGS. 7A and 7B along the horizontal plane C-C'.

Referring to FIGS. 7A-7C, an alternating stack of spacer material layers and insulating layers 60 can be formed over the selector material layer 20. In one embodiment, the spacer material layers can include a conductive material that form word lines 30, which remain in a final device structure. In another embodiment, the spacer material layers can be sacrificial material layers that are subsequently replaced electrically conductive layers, as will be described in more detail below. Each word line 30 can have a thickness in a range from 5 nm to 100 nm, and each insulating layer 60 can have a thickness in a range from 5 nm to 100 nm, although lesser and greater thicknesses can be employed for each of the word lines 30 and the insulating layers 60. In one embodiment, the alternating stack (30, 60) can include a one-dimensional array having a periodicity along the vertical direction (the z-direction). In one embodiment, the topmost layer of the alternating stack (30, 60) can be an insulating layer 60 having a greater thickness than underlying insulating layers 60 in order to compensate for loss of material in subsequent planarization processes.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the alternating stack of the word lines 30 and the insulating layers 60 can be patterned to form line trenches 49R. A patterned photoresist layer (not shown) and an anisotropic etch that is selective to the selector material layer 20 can be employed to form the line trenches 49R. Each line trench 49R can extend along the first horizontal direction hd1. Each contiguous set of remaining portions of the word lines 30 and the insulating layers 60 between a pair of line trenches 49R constitutes an alternating stack (30, 60) that is a rail structure. Each alternating stack (30, 60) extends along the first horizontal direction hd1, and is laterally spaced apart from other alternating stacks (30, 60) along the second horizontal direction hd2. Each patterned word line 30 can constitute a word line of a resistive random access memory device.

In one embodiment, the word lines 30 comprise a first electrically conductive material. In one embodiment, the first electrically conductive material can include an elemental metal, an intermetallic alloy, and/or a conductive metal nitride.

A pair of a word line 30 and an insulating layer 60 can constitute a unit of repetition in the alternating stack (30, 60) of the word lines 30 and the insulating layers 60. The total number of repetitions can be in a range from 8 to 1,024, although lesser and greater number of repetitions can also be employed. Thus, a plurality of alternating stacks (30, 60) of insulating layers 60 and word lines 30 is formed over a substrate 6. Each of the insulating layers 60 and the word lines 30 extends along the first horizontal direction (i.e., the word line direction) hd1. The alternating stacks (30, 60) are laterally spaced from one another along the second horizontal direction hd2 (i.e., the global bit line direction).

Figure 8A:
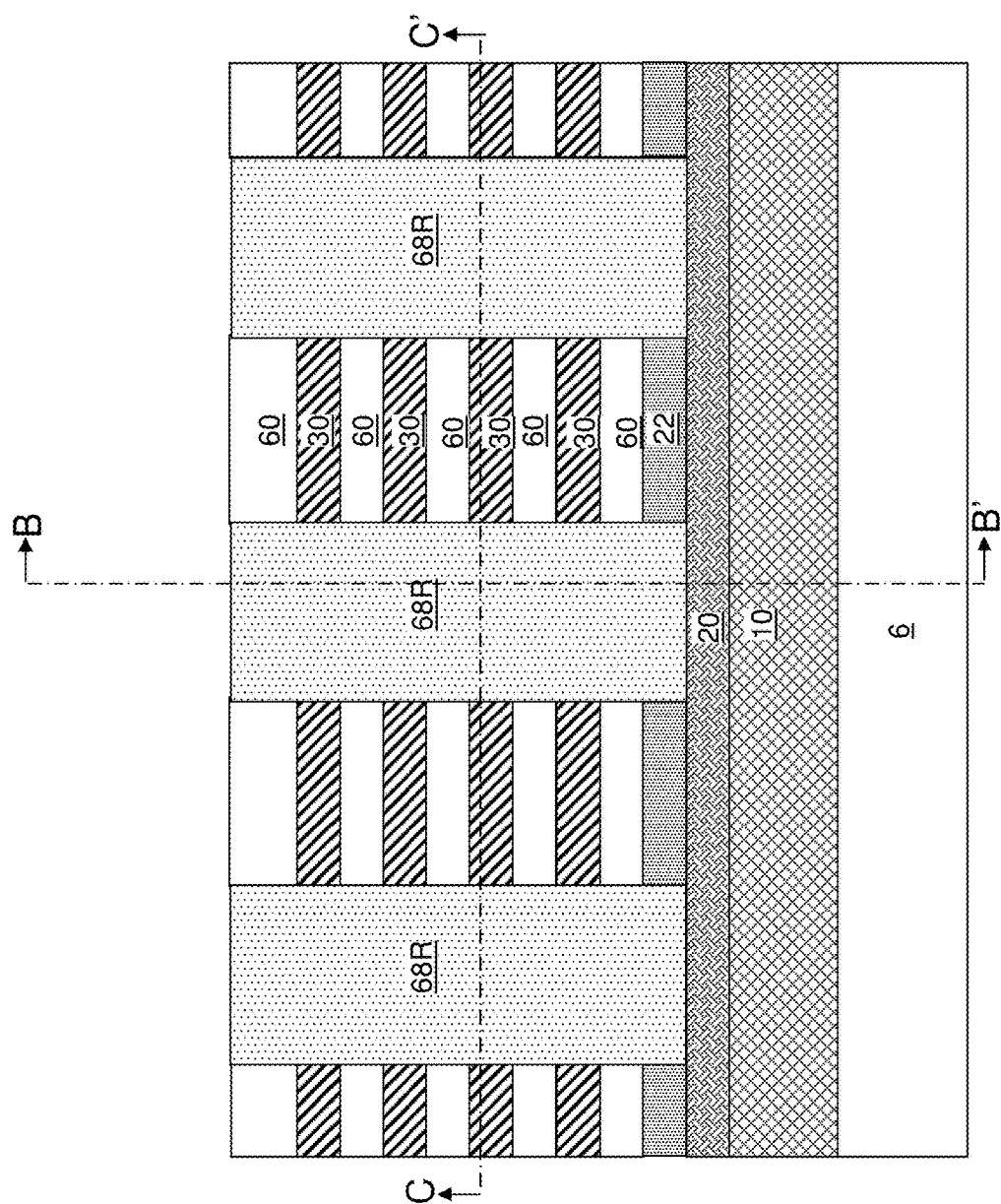
FIG. 8A is a first vertical cross-sectional view of the first exemplary structure after forming dielectric rail structures according to the first embodiment of the present disclosure.
Figure 8B:
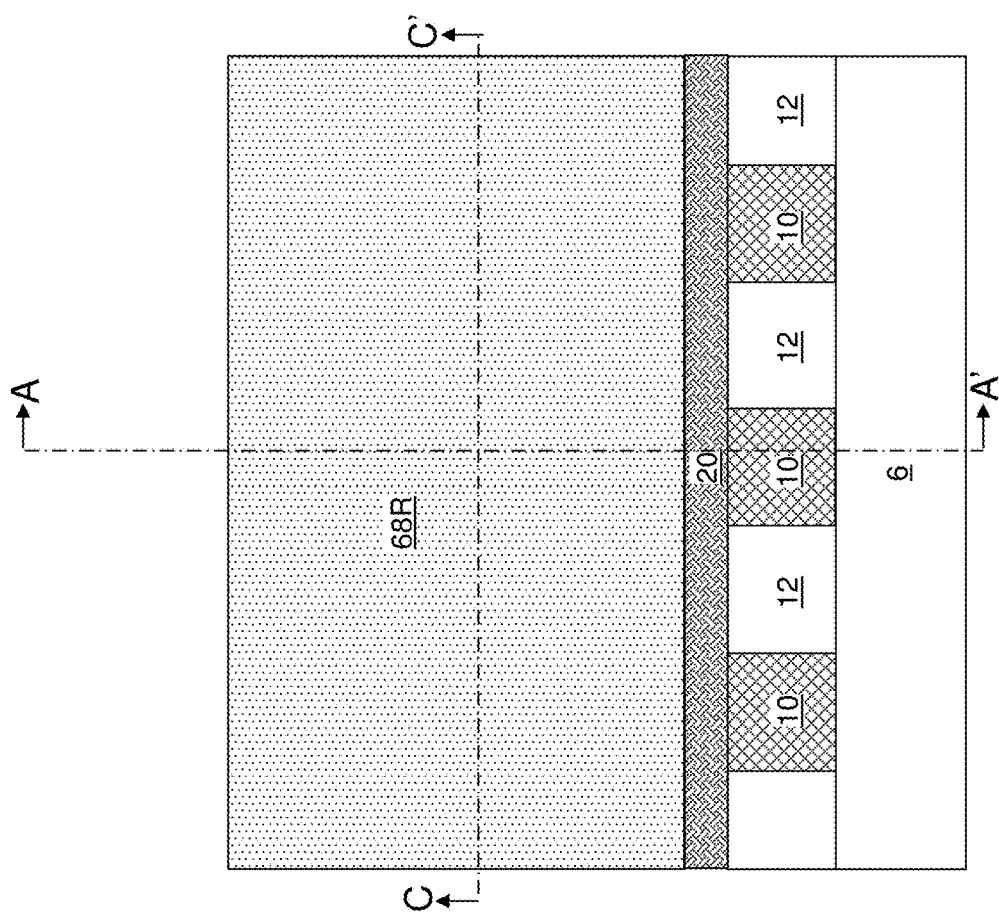
FIG. 8B is a second vertical cross-sectional view of the first exemplary structure of FIG. 8A along the vertical plane B-B'.
Figure 8C:
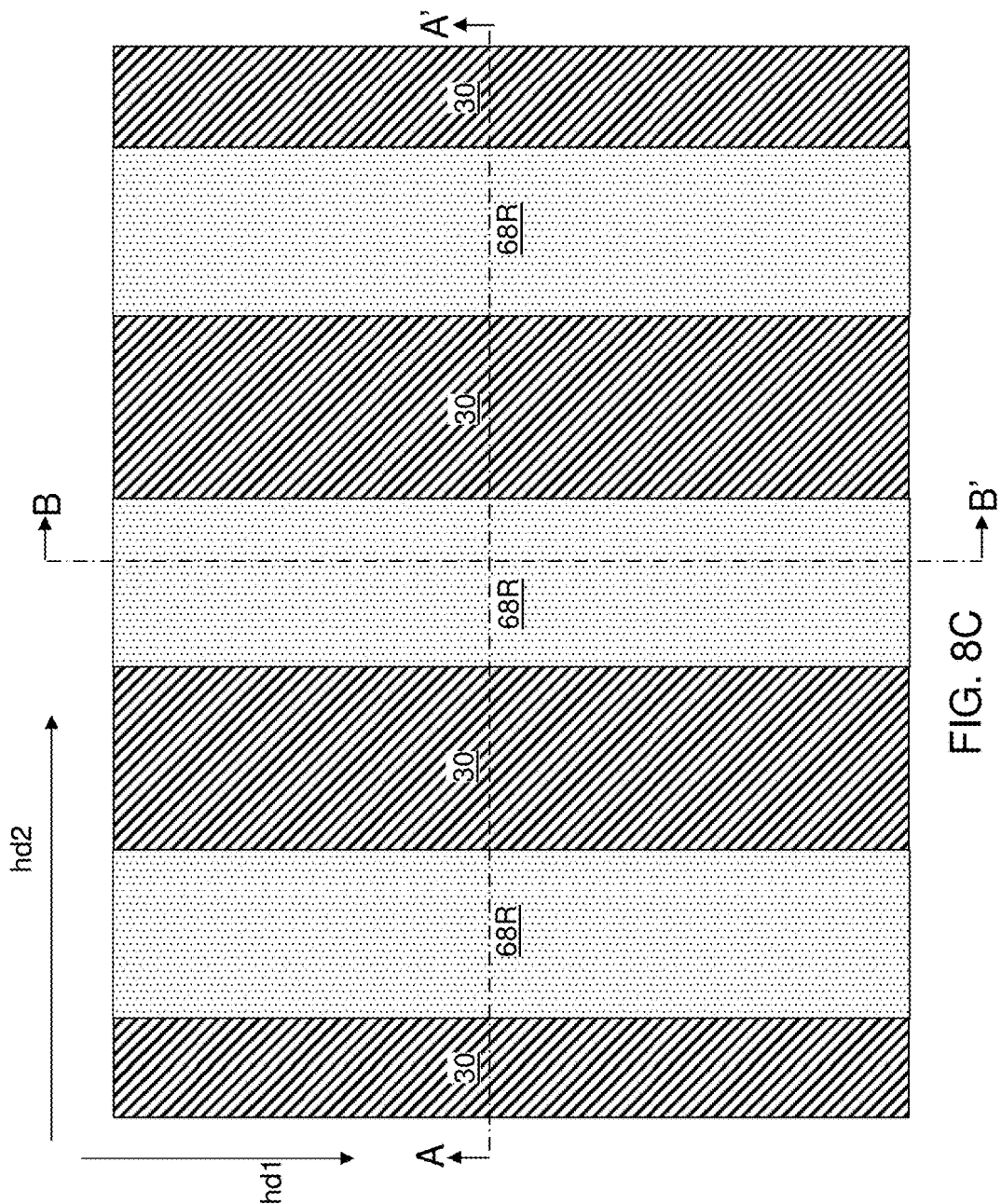
FIG. 8C is a horizontal cross-sectional view of the first exemplary structure of FIGS. 8A and 8B along the horizontal plane C-C'.

Referring to FIGS. 8A-8C, a dielectric material is deposited to fill the line trenches 49R. The dielectric material can be removed from above the alternating stacks (30, 60) by a planarization process such as chemical mechanical planarization (CMP). Each remaining portion of the dielectric material filling a line trench 49R constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass, silicon nitride, organosilicate glass, or porous derivatives thereof. In an illustrative example, the insulating layers 60 can include undoped silicate glass or doped silicate glass, and the separator rail structures 68R can include doped silicate glass, undoped silicate glass, or organosilicate glass.

Figure 9A:
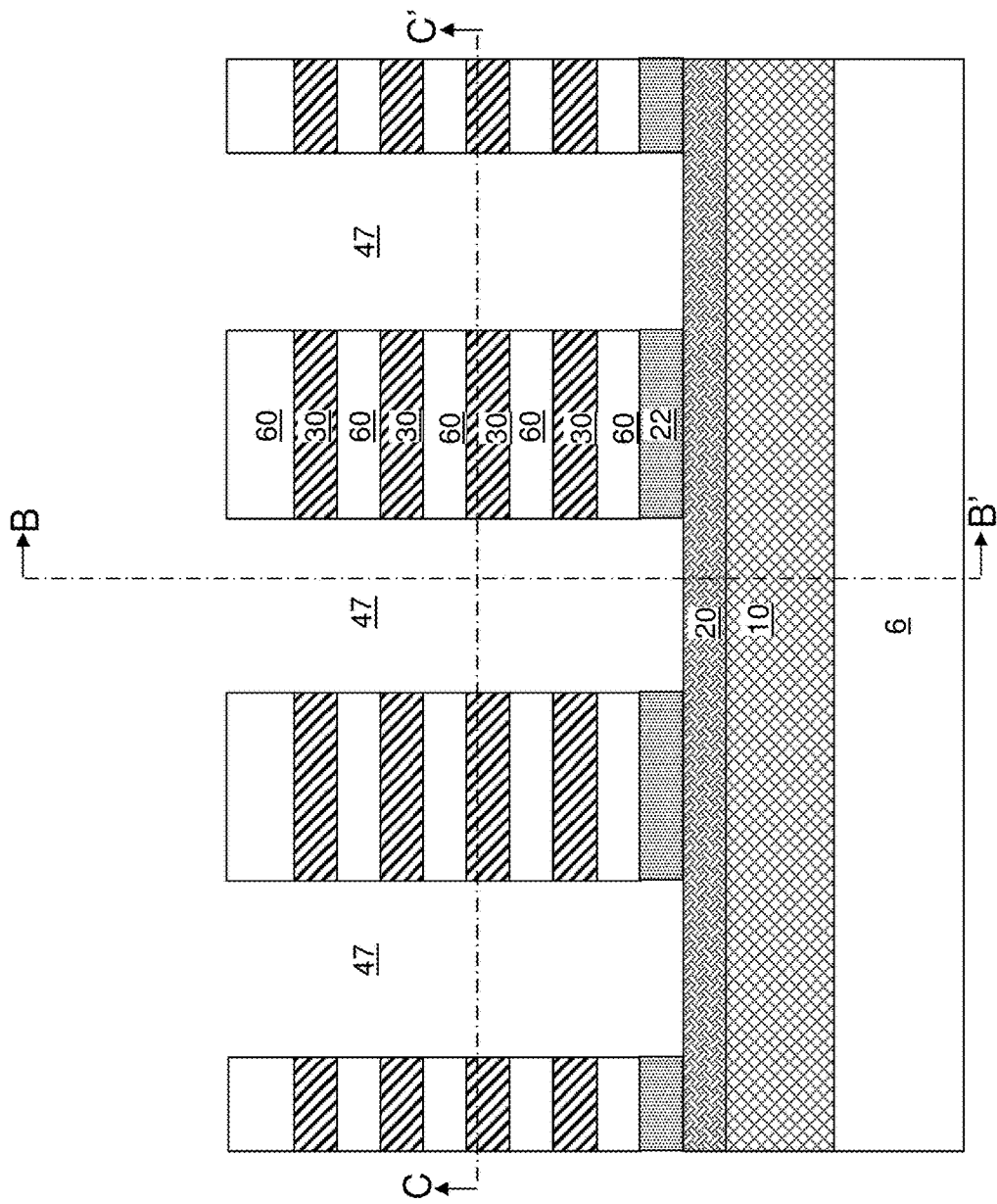
FIG. 9A is a first vertical cross-sectional view of the first exemplary structure after forming dielectric pillar structures according to the first embodiment of the present disclosure.
Figure 9B:
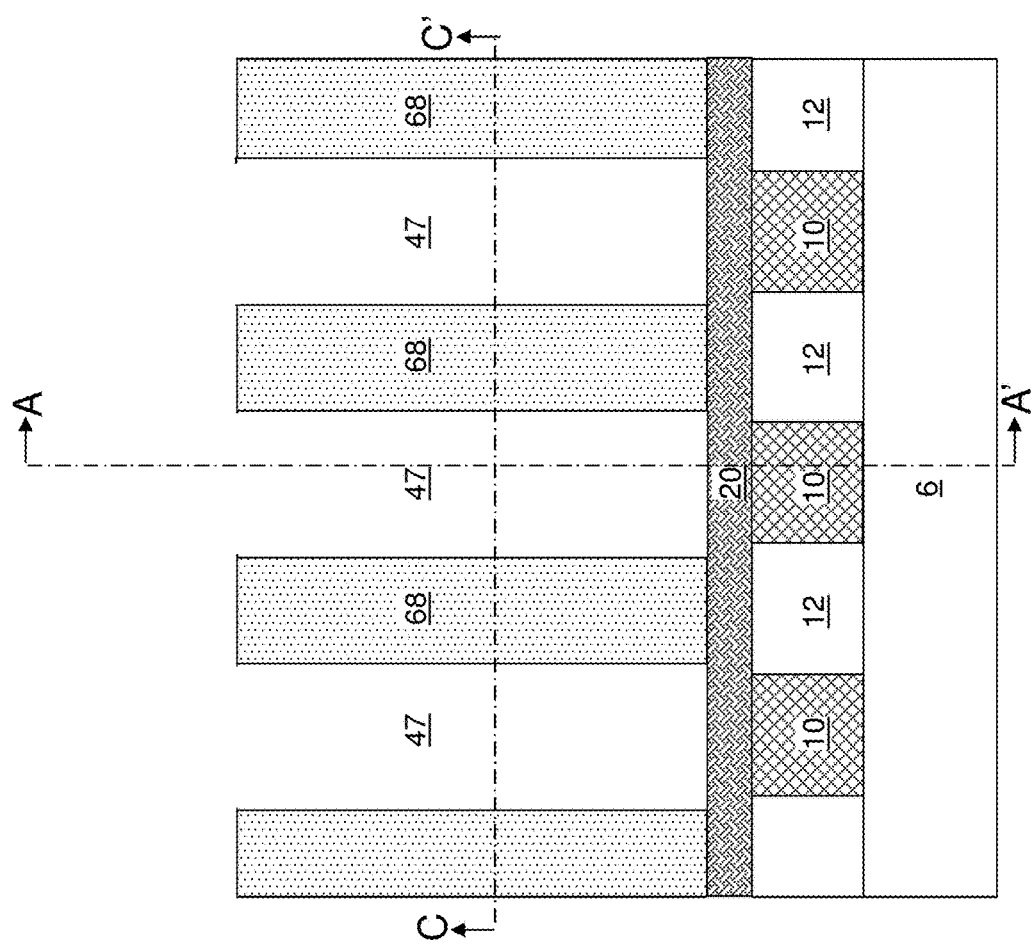
FIG. 9B is a second vertical cross-sectional view of the first exemplary structure of FIG. 9A along the vertical plane B-B'.
Figure 9C:
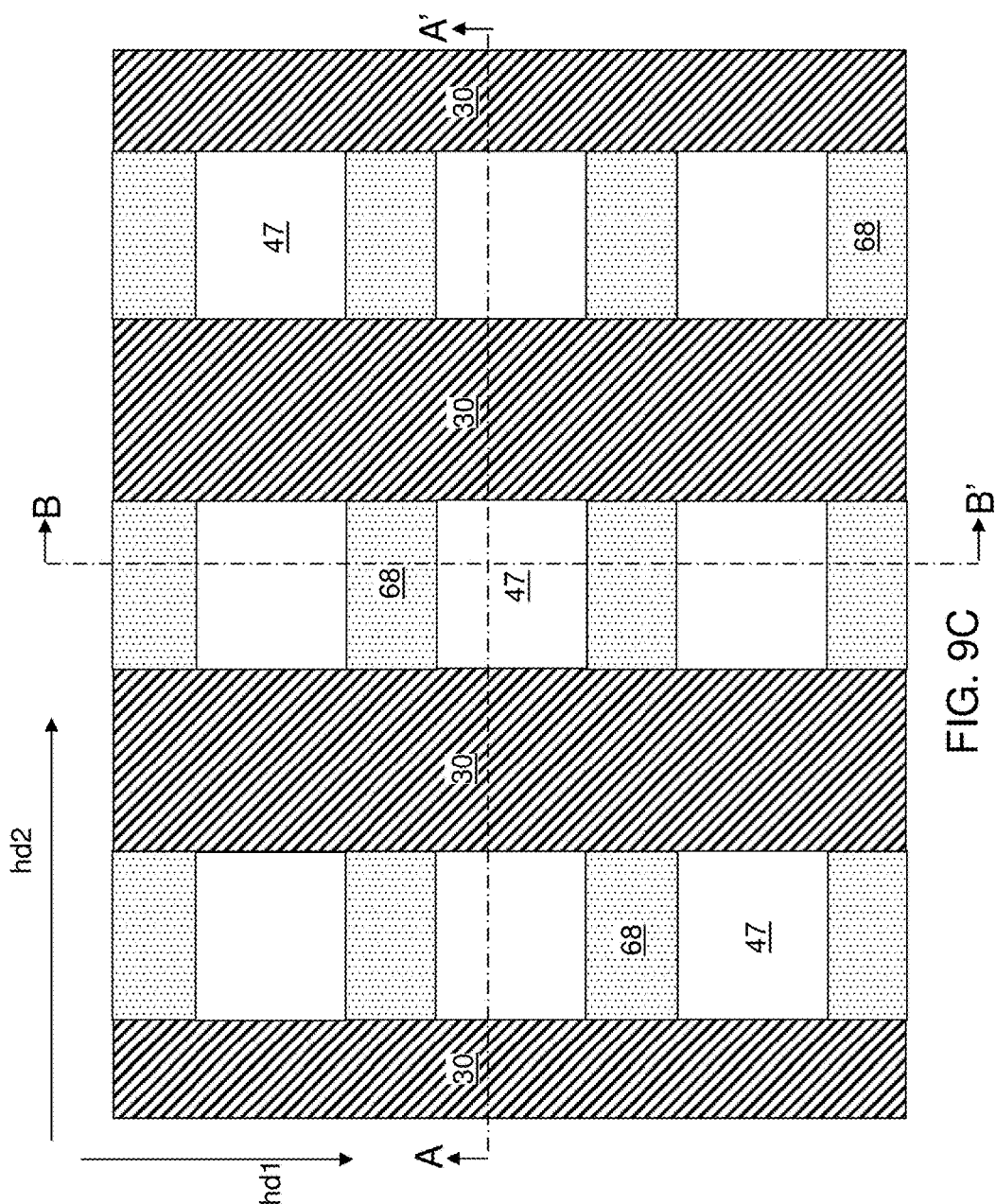
FIG. 9C is a horizontal cross-sectional view of the first exemplary structure of FIGS. 9A and 9B along the horizontal plane C-C'.

Referring to FIGS. 9A-9C, bit line cavities 47 can be formed by patterning the separator rail structures 68R into separator pillar structures 68. Specifically, a photoresist layer (not shown) can be applied over the alternating stacks (30, 60) and the separator rail structures 68R, and can be lithographically patterned to form linear portions that extend along the second horizontal direction hd2 and overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the topmost layer of the alternating stack (30, 60) can be performed to remove portions of the separator rail structures 68R that are not covered by a combination of the photoresist layer portions and the topmost layer of the alternating stack (30, 60). Bit line cavities 47 having rectangular horizontal cross-sectional areas and extending through the alternating stacks (30, 60) to top surfaces of the selector material layer 20 can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

Figure 10A:
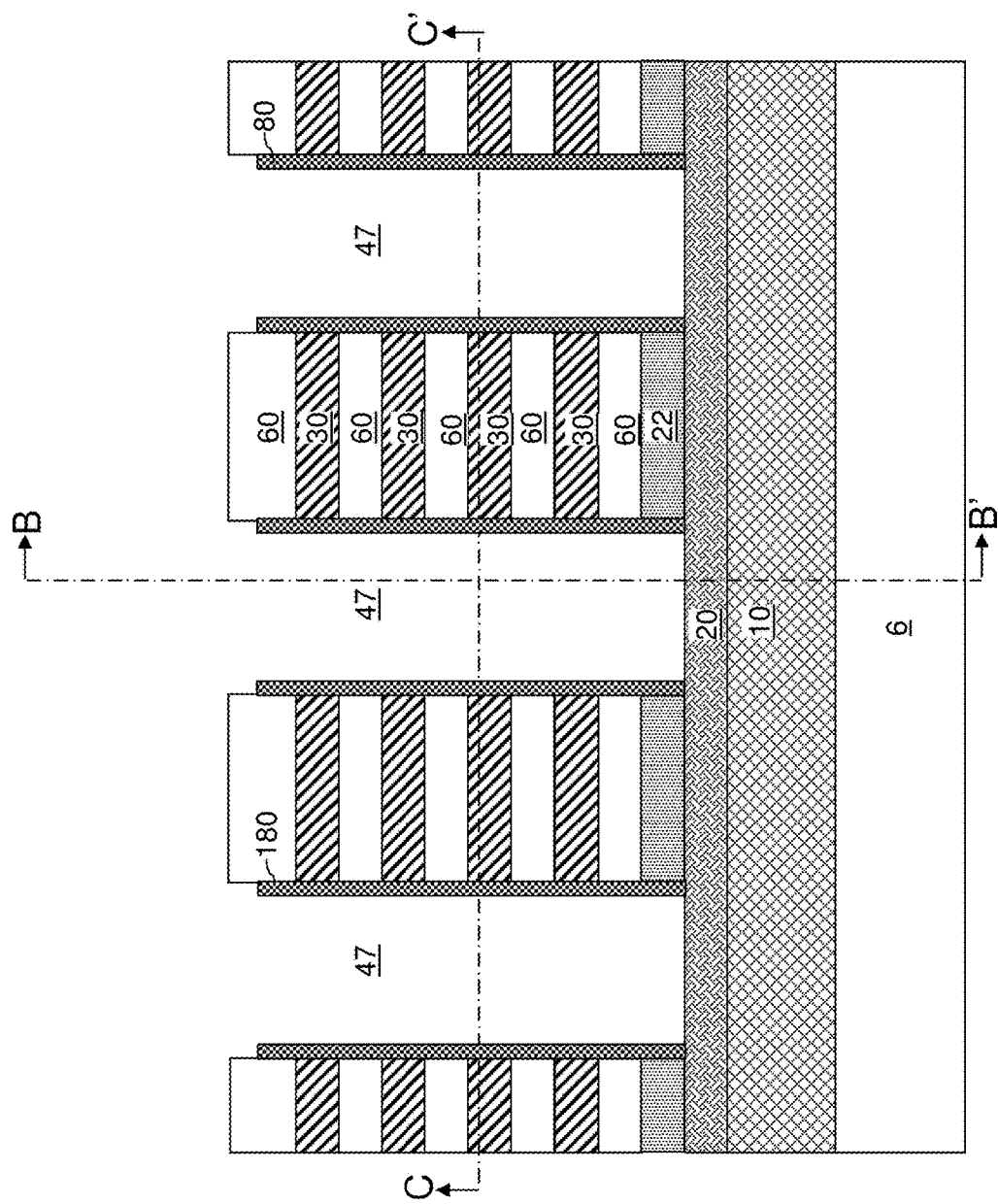
FIG. 10A is a first vertical cross-sectional view of the first exemplary structure after formation of memory material layers according to the first embodiment of the present disclosure.
Figure 10B:
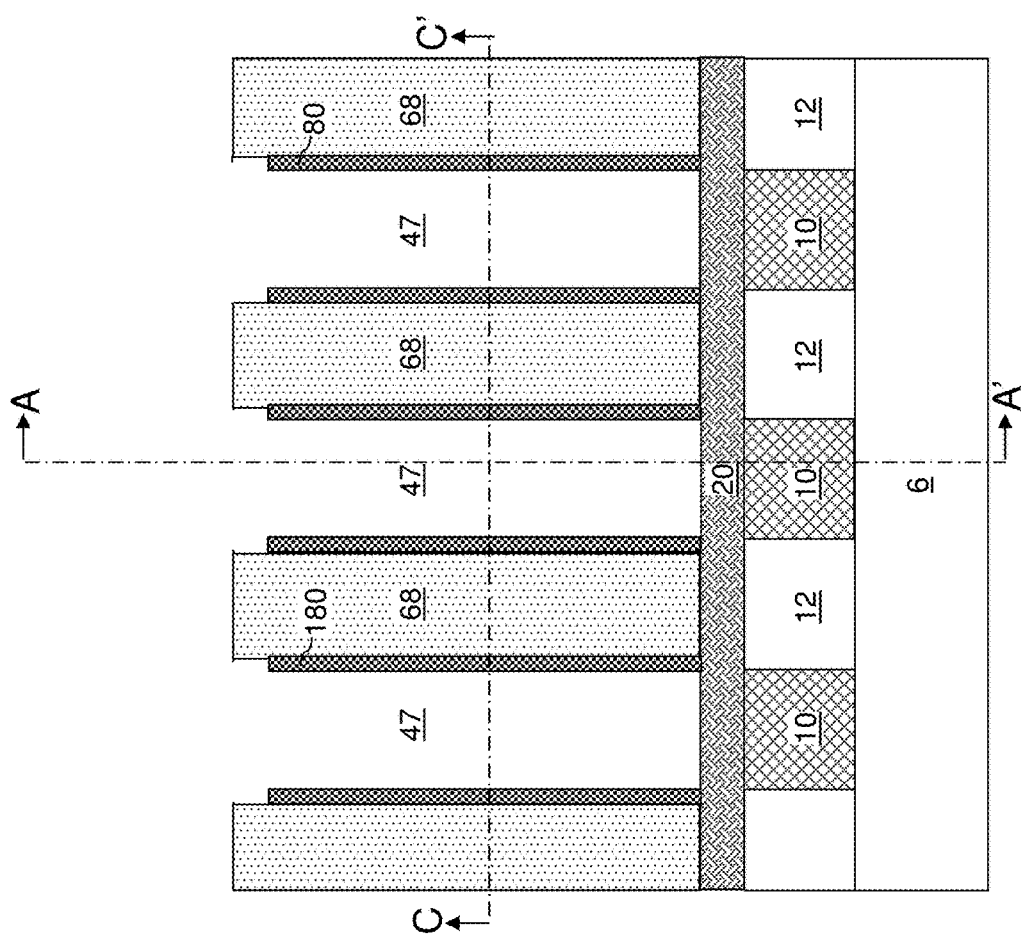
FIG. 10B is a second vertical cross-sectional view of the first exemplary structure of FIG. 10A along the vertical plane B-B'.

Referring to FIGS. 10A-10C, a memory film 180 can be formed on each sidewall of the bit line cavities 47. For example, a continuous memory film such as the first exemplary memory film 180 of FIG. 4 or the second exemplary memory film 280 of FIG. 5 can be deposited as a continuous layer stack, and can be anisotropically etched to remove horizontal portions thereof. Each remaining vertical portion of the continuous memory film constitutes a memory film 180. Each memory film 180 can be topologically homeomorphic to a torus. As used herein, an element is "topologically homeomorphic to a torus" if the element has a geometrical shape that can be continuously stretched to match a torus without creating or destroying a new hole.

Figure 11A:
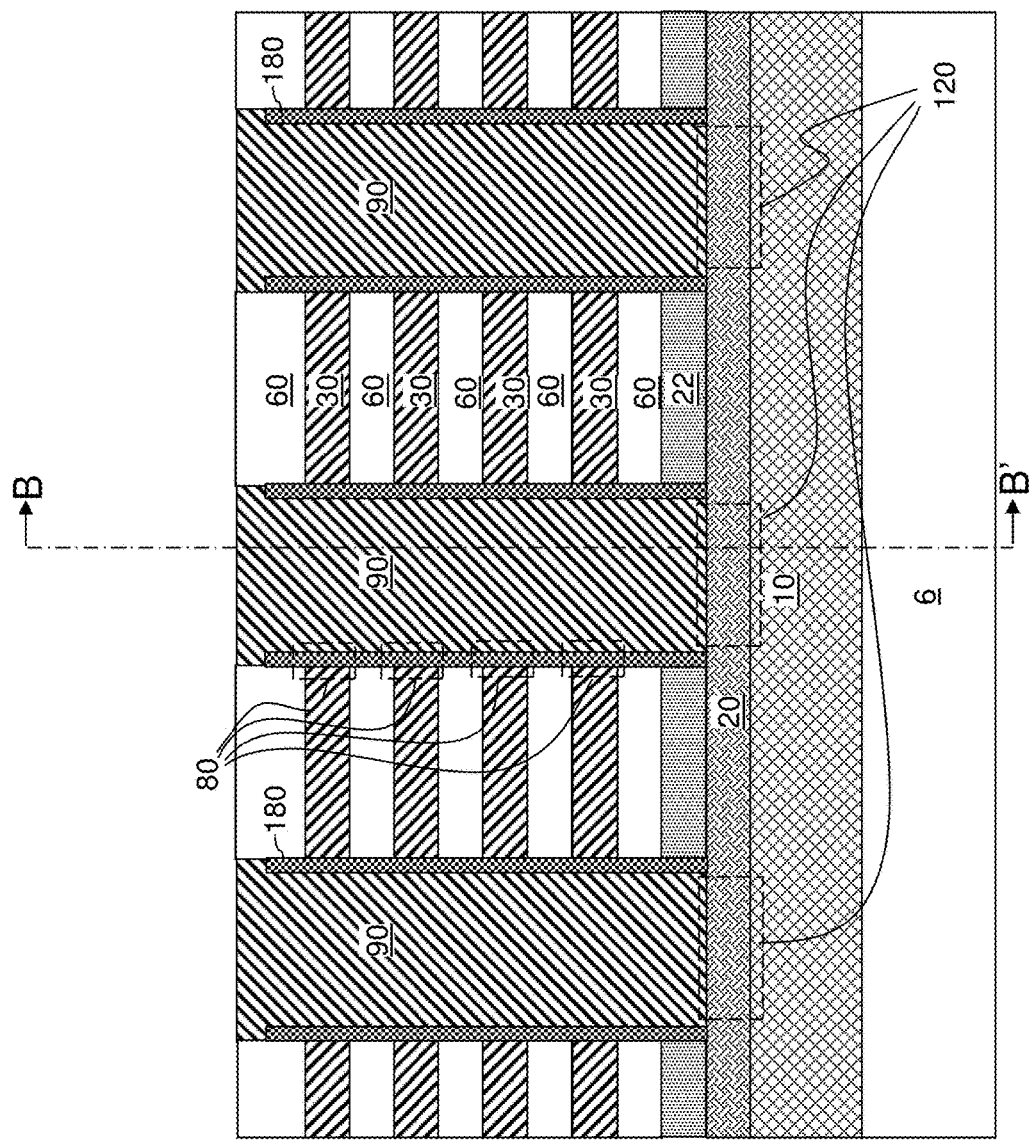
FIG. 11A is a first vertical cross-sectional view of the first exemplary structure after formation of local bit lines according to the first embodiment of the present disclosure.
Figure 11B:
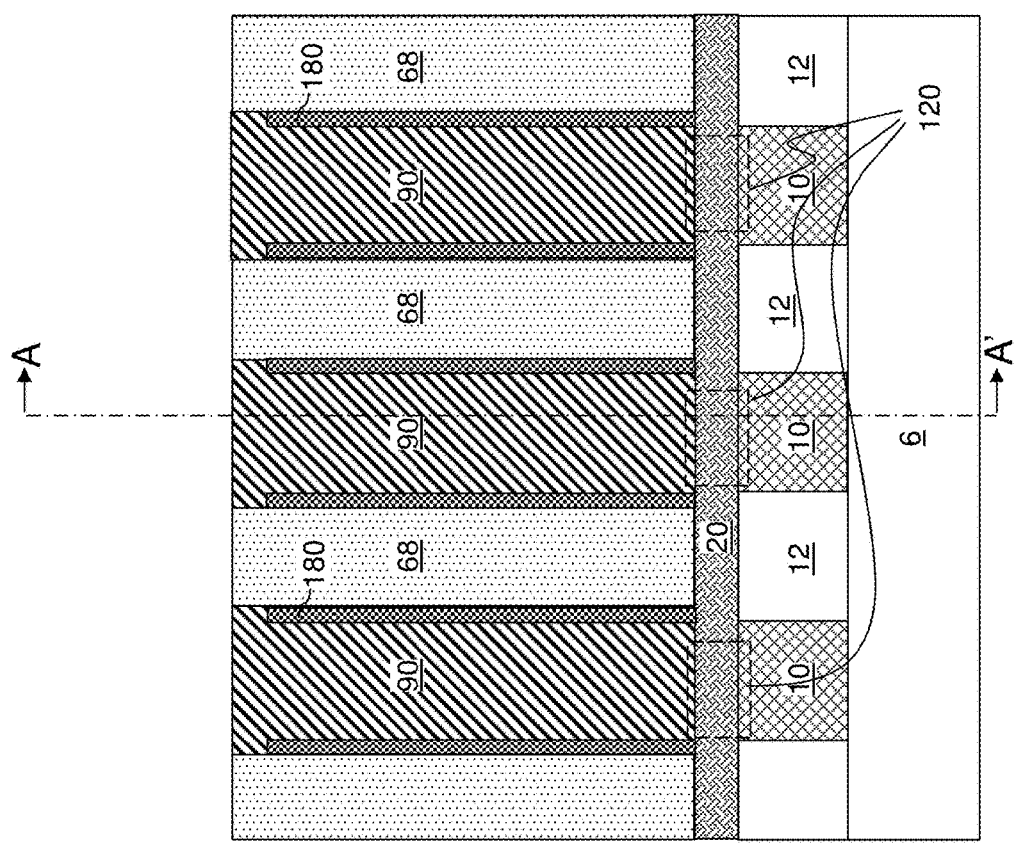
FIG. 11B is a second vertical cross-sectional view of the first exemplary structure of FIG. 11A along the vertical plane B-B'.

Referring to FIGS. 11A and 11B, at least one conductive material is deposited in each remaining volume of the bit line cavities 47 to form local bit lines 90. The at least one conductive material can include a conductive doped semiconductor material, an elemental metal (e.g., tungsten, etc.), an intermetallic alloy, and/or a conductive compound including at least one metal and at least one non-metal element such as a conductive metal nitride (e.g., TiN). In one embodiment, the at least one conductive material can include a heavily n-doped semiconductor material having n-type dopants at an atomic concentration greater than $5.0 \times 10^{19}/cm^3$, or a p-doped semiconductor material having p-type dopants at an atomic concentration greater than $5.0 \times 10^{19}/cm^3$. Excess portions of the at least one conductive material can be removed from above the top surface of the alternating stack (30, 60), for example, by a planarization process (such as chemical mechanical planarization and/or a recess etch).

Each region of a memory film 180 that contacts a word line 30 and a local bit line 90 constitutes a memory element, which can be resistive memory element 80. The resistive memory elements 80 form a three-dimensional array. Two one-dimensional arrays that extent vertically can be located within a same memory film 180.

Each region of the selector material layer that 20 contacts a global bit line 10 and a local bit line 90 constitutes a selector element 120. The selector elements 120 form a two-dimensional array having the same horizontal cross-sectional areas as the bottom surfaces of the local bit lines 90.

Figure 12A:
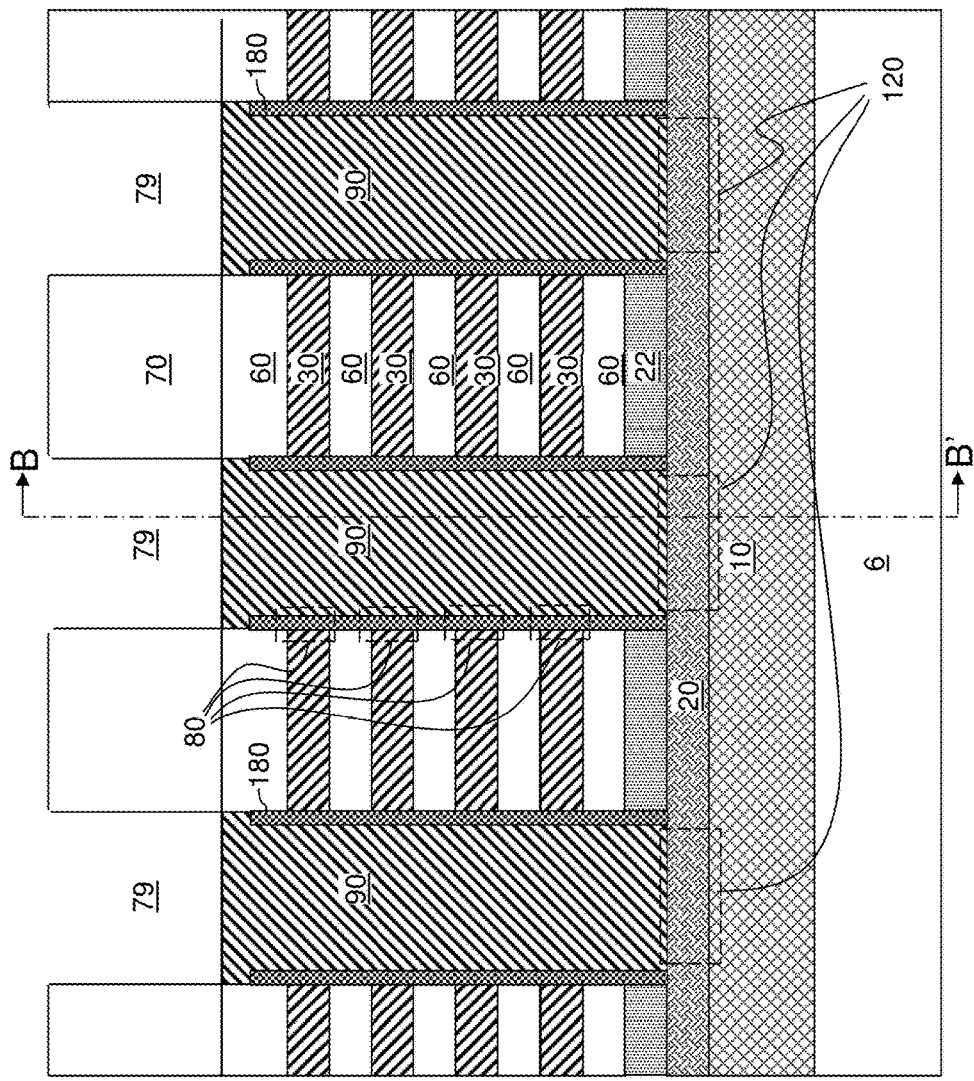
FIG. 12A is a first vertical cross-sectional view of the first exemplary structure after formation of a gate-level dielectric layer and gate trenches therethrough according to the first embodiment of the present disclosure.
Figure 12B:
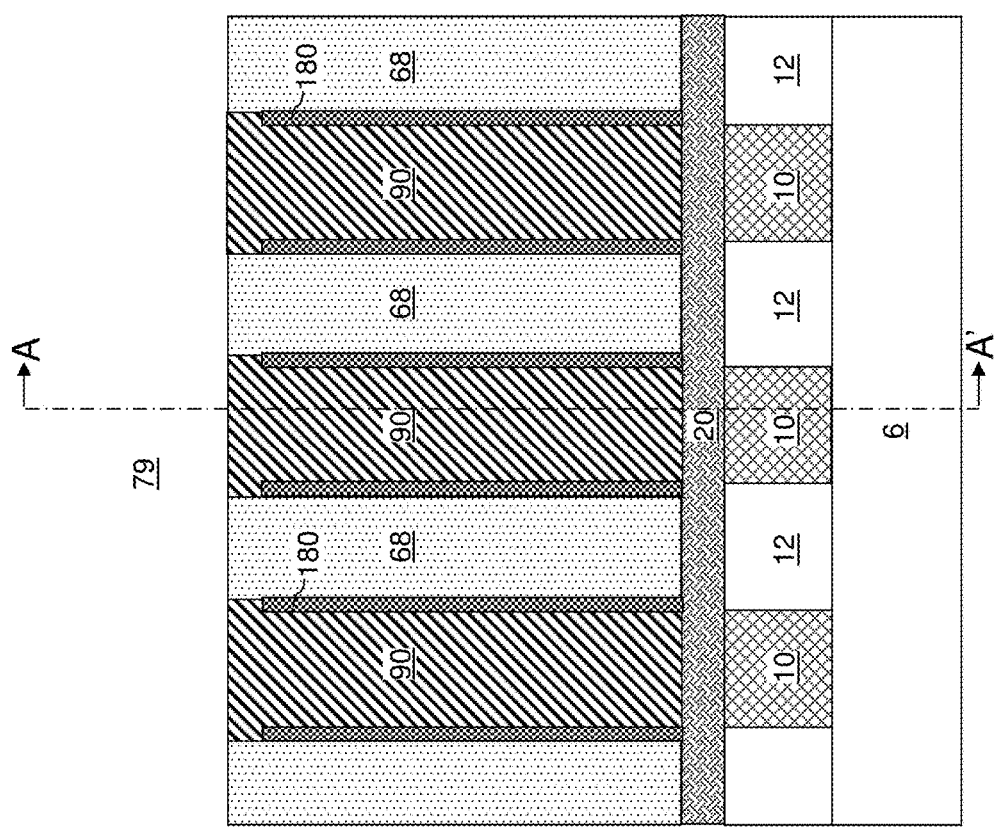
FIG. 12B is a second vertical cross-sectional view of the first exemplary structure of FIG. 12A along the vertical plane B-B'.
Figure 13A:
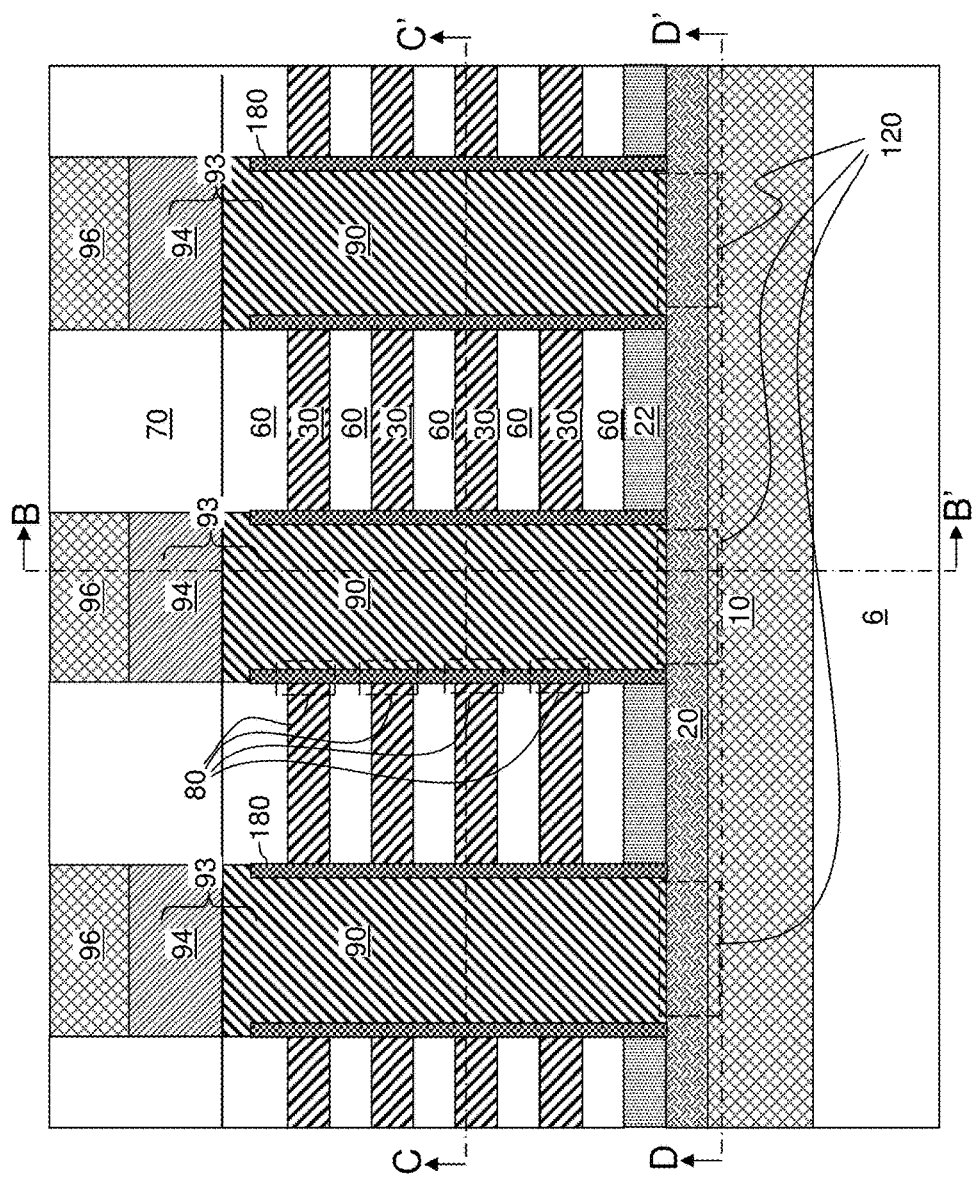
FIG. 13A is a first vertical cross-sectional view of the first exemplary structure after formation of diodes and gate lines therethrough according to the first embodiment of the present disclosure.
Figure 13B:
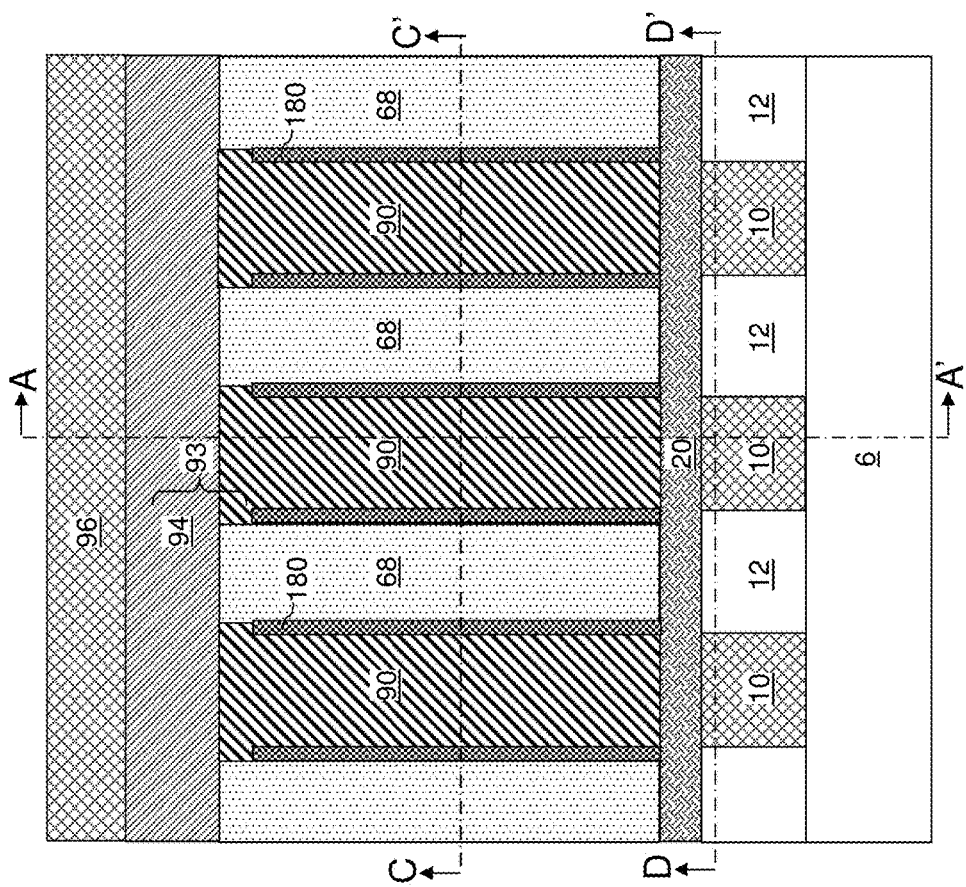
FIG. 13B is a second vertical cross-sectional view of the first exemplary structure of FIG. 13A along the vertical plane B-B'.
Figure 13C:
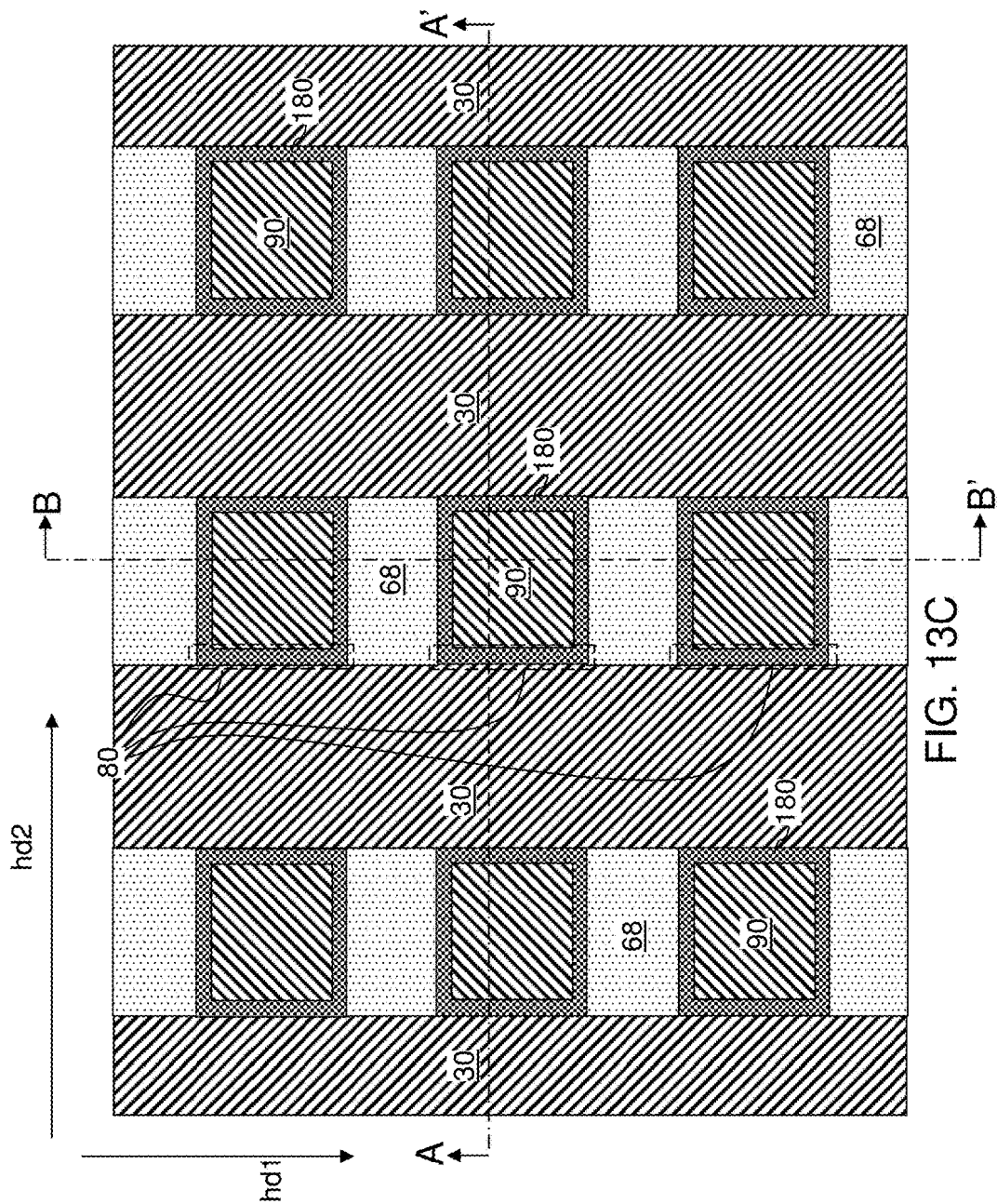
FIG. 13C is a first horizontal cross-sectional view of the first exemplary structure of FIGS. 13A and 13B along the horizontal plane C-C'.
Figure 13D:
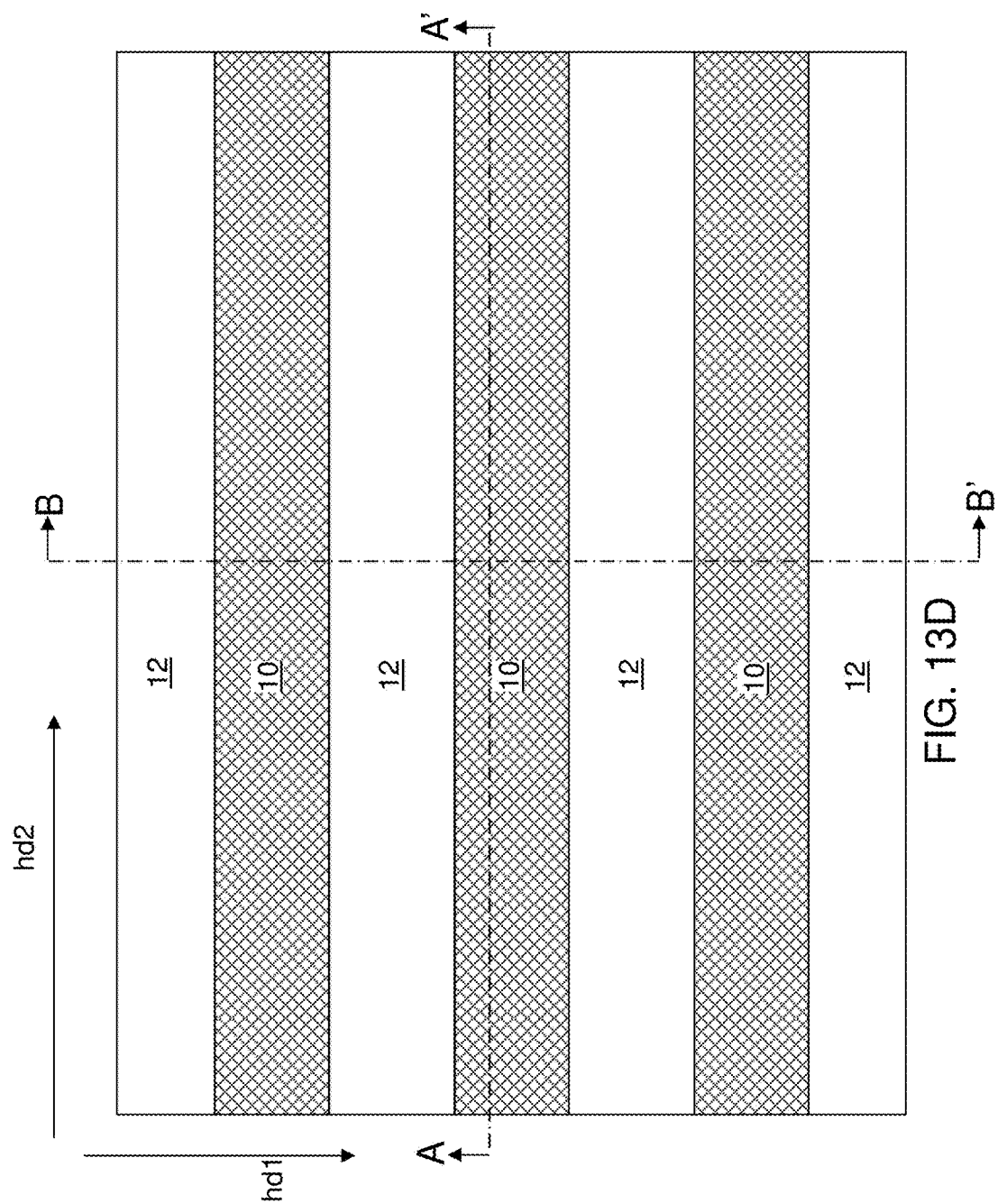
FIG. 13D is a second horizontal cross-sectional view of the first exemplary structure of FIGS. 13A and 13B along the horizontal plane D-D'.

Referring to FIGS. 12A and 12B, a gate level dielectric layer 70 can be deposited over the alternating stacks (30, 60) and the local bit lines 90. The gate level dielectric layer 70 includes a dielectric material such as silicon oxide, silicon nitride, organosilicate glass, a dielectric metal oxide, or a combination thereof. For example, the gate level dielectric layer 70 can include silicon oxide. Gate line trenches 79 can be formed though the gate level dielectric layer 70 along the first horizontal direction hd1 such that each gate line trench 79 overlies a row of local bit lines 90.

Referring to FIGS. 13A-13D, gate lines 96 are formed in the gate line trenches 79. In case the bit lines 90 include a doped semiconductor material having a doping of a first conductivity type, another doped semiconductor material having a doping of a second conductivity type that is the opposite of the first conductivity type can be deposited at bottom portions of the gate line trenches 79 to form doped semiconductor material portions 94. The doped semiconductor material portions 94 can include electrical dopants at an atomic concentration greater than $5.0 \times 10^{18}/cm^3$, and preferably at an atomic concentration greater than $5.0 \times 10^{19}/cm^3$, although lesser atomic concentrations can also be employed. In this case, each interfacial region between a doped semiconductor material portion 94 and a local bit line 90 forms a diode 93 illustrated in FIG. 1. Optionally, at least one metallic material can be deposited in an upper portion of each gate line trench 79 to form a metallic gate line 96.

If a metal (e.g., tungsten) or metal alloy is used instead of a doped semiconductor material for the local bit lines 90, then instead of a single portion 94, two oppositely doped semiconductor material portions can be deposited at a bottom portion of each gate line trench 79 to form a diode 93 illustrated in FIG. 1. Alternatively, a Schottky diode 93 may be formed between the doped semiconductor portion 94 and a metal or metal alloy local bit line 90. In another embodiment a p-i-n junction diode 93 may be used instead of a p-n junction diode or a Schottky diode by forming an additional intrinsic semiconductor layer between p-type and n-type semiconductor layers. The word lines 30, the global bit lines 10, and the gate lines 96 can be suitably electrically wired for operations as a resistive random access memory device.

Figure 14A:
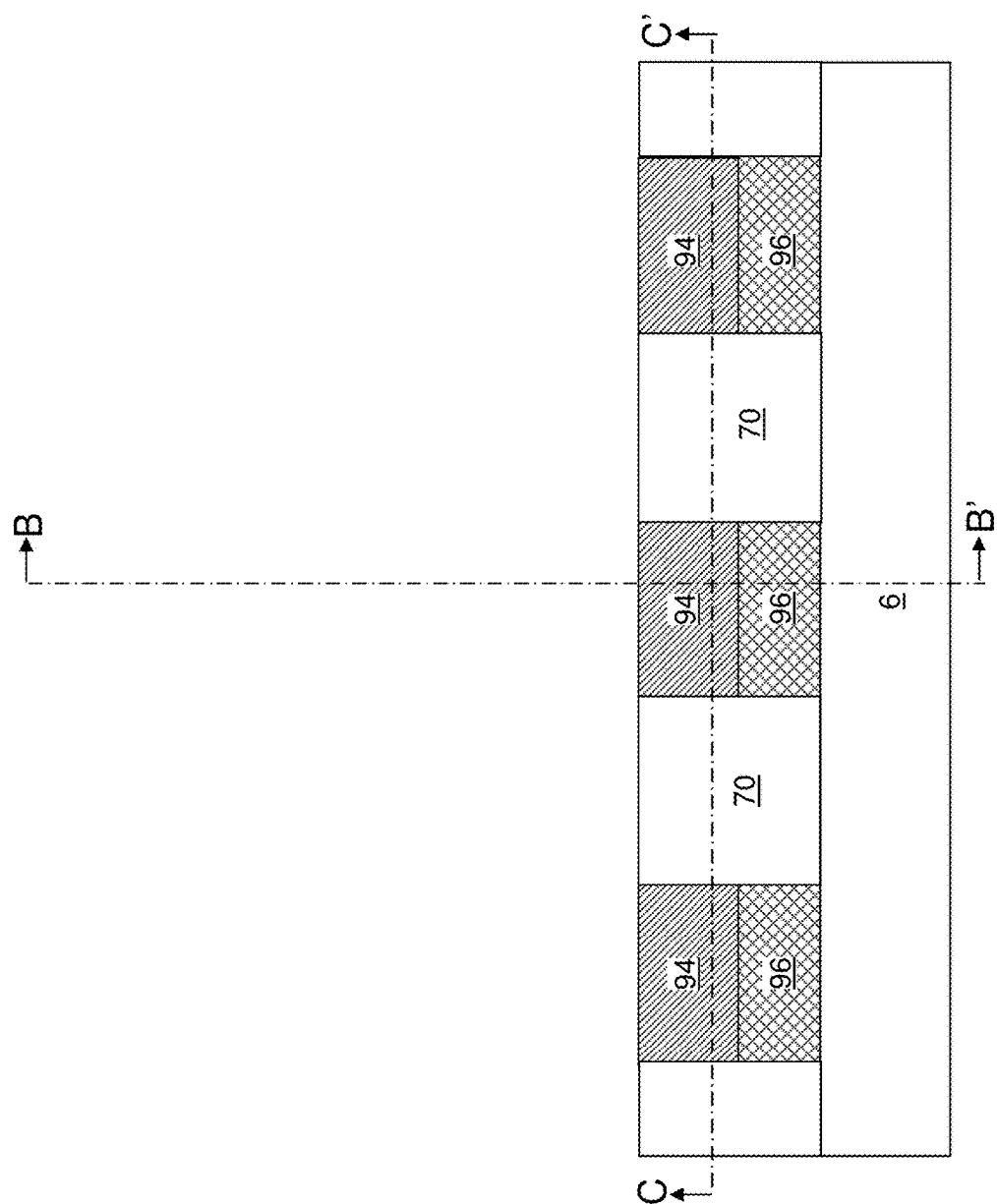
FIG. 14A is a first vertical cross-sectional view of a second exemplary structure after forming gate lines and doped semiconductor lines according to a second embodiment of the present disclosure.
Figure 14B:
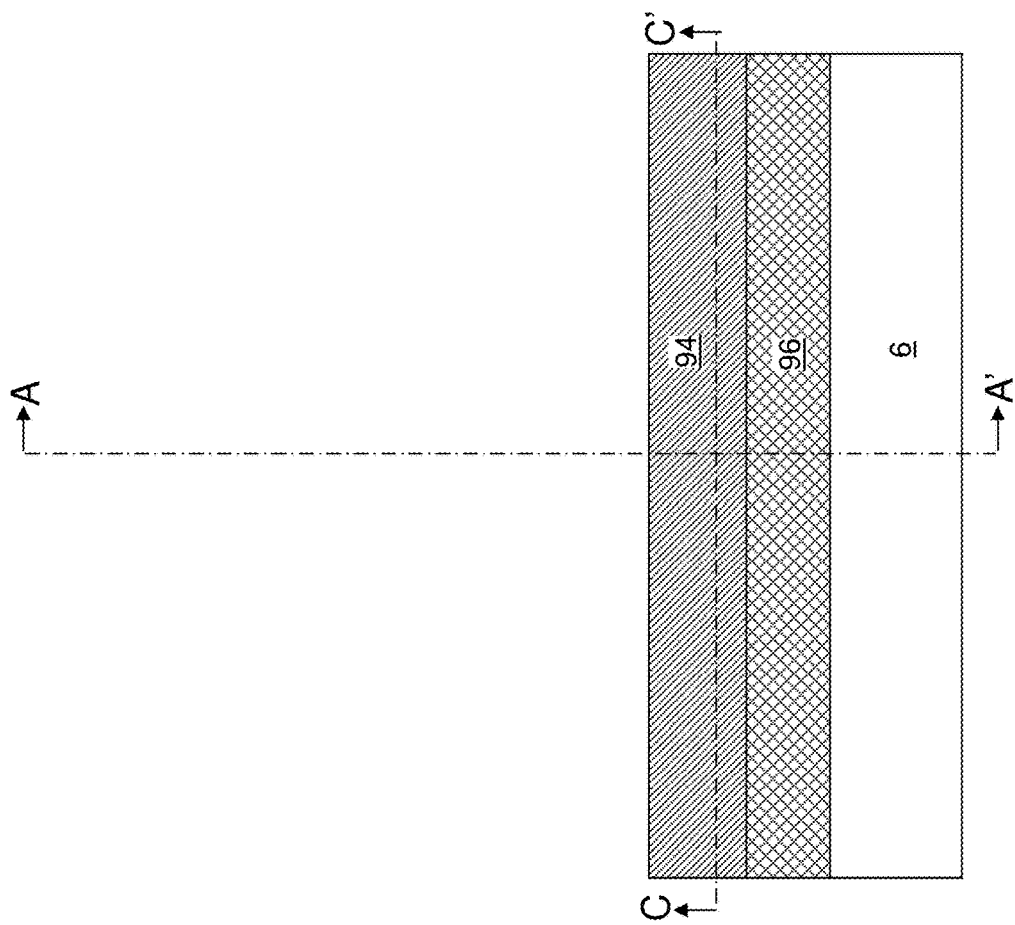
FIG. 14B is a second vertical cross-sectional view of the second exemplary structure of FIG. 14A along the vertical plane B-B'.

Referring to FIGS. 14A-14C, a second exemplary structure according to an embodiment of the present disclosure is shown. In this structure, the diodes 93 are located below and the selector elements 120 are located above the array of memory elements 80 and local bit lines 90. A gate level dielectric layer 70 can be formed over the substrate 6. The gate level dielectric layer 70 includes a dielectric material such as silicon oxide, silicon nitride, organosilicate glass, a dielectric metal oxide, or a combination thereof. For example, the gate level dielectric layer 70 can include silicon oxide. Gate line trenches 79 can be formed though the gate level dielectric layer 70 along the first horizontal direction hd1.

Gate lines 96 are formed in the gate line trenches 79. At least one metallic material can be deposited in a lower portion of each gate line trench 79 to form a metallic gate line 96. A doped semiconductor material can be deposited at upper portions of the gate line trenches 79 to form doped semiconductor material portions 94. The doped semiconductor material portions 94 can include electrical dopants at an atomic concentration greater than $5.0 \times 10^{18}/cm^3$, and preferably at an atomic concentration greater than $5.0 \times 10^{19}/cm^3$, although lesser atomic concentrations can also be employed. In an alternate embodiment, two oppositely doped semiconductor material portions can be deposited at an upper portion of each gate line trench 79 to form a diode 93 illustrated in FIG. 1. In another alternate embodiment, the diode 93 may be a Schottky diode. Each gate line 96 can extend along the first horizontal direction. The gate lines 96 can form a one-dimensional periodic array with a periodicity along the second horizontal direction.

Figure 15A:
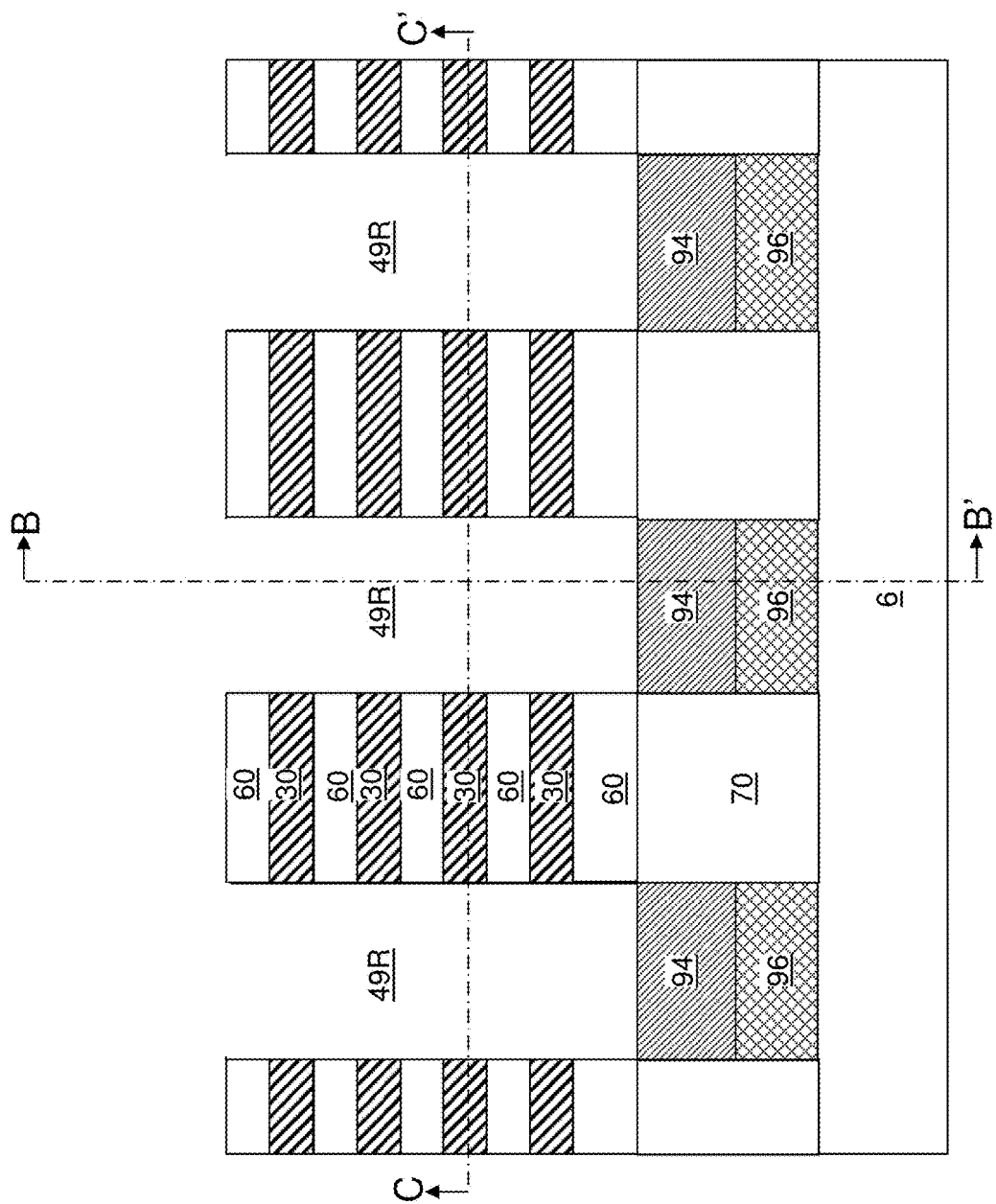
FIG. 15A is a first vertical cross-sectional view of the second exemplary structure after forming alternating stacks of insulating layers and electrically conductive layers and rail trenches according to a second embodiment of the present disclosure.

Referring to FIGS. 15A-15C, an alternating stack of spacer material layers and insulating layers 60 can be formed over the gate lines 96, doped semiconductor material portions 94 and the gate level dielectric layer 70. In one embodiment, the spacer material layers can include a conductive material that form word lines 30, which remain in a final device structure. In another embodiment, the spacer material layers can be sacrificial material layers that are subsequently replaced electrically conductive layers, as will be described in more detail below. Each word line 30 can have a thickness in a range from 5 nm to 100 nm, and each insulating layer 60 can have a thickness in a range from 5 nm to 100 nm, although lesser and greater thicknesses can be employed for each of the word lines 30 and the insulating layers 60. In one embodiment, the alternating stack (30, 60) can form a one-dimensional array having a periodicity along the vertical direction (the z-direction). In one embodiment, the topmost layer of the alternating stack (30, 60) can be an insulating layer 60 having a greater thickness than underlying insulating layers 60 in order to compensate for loss of material in subsequent planarization processes.

Subsequently, the alternating stack of the word lines 30 and the insulating layers 60 can be patterned to form line trenches 49R that extend along the first horizontal direction hd1. Each line trench 49R can extend along the first horizontal direction hd1 and overlies a respective gate line 96. In one embodiment, a top surface of a doped semiconductor material portion 94 is physically exposed at the bottom of each line trench 49R. In one embodiment, an entire top surface of a predominant portion of the top surface of a doped semiconductor material portion 94 can be physically exposed at the bottom of each line trench 49R. Each contiguous set of remaining portions of the word lines 30 and the insulating layers 60 between a pair of line trenches 49R constitutes an alternating stack (30, 60) that is a rail structure. Each alternating stack (30, 60) extends along the first horizontal direction hd1, and is laterally spaced apart from other alternating stacks (30, 60) along the second horizontal direction hd2. Each patterned word line 30 can constitute a word line of a resistive random access memory device.

In one embodiment, the word lines 30 comprise a first electrically conductive material. In one embodiment, the first electrically conductive material can include an elemental metal, an intermetallic alloy, and/or a conductive metal nitride.

A pair of a word line 30 and an insulating layer 60 can constitute a unit of repetition in the alternating stack (30, 60) of the word lines 30 and the insulating layers 60. The total number of repetitions can be in a range from 8 to 1,024, although lesser and greater number of repetitions can also be employed. Thus, a plurality of alternating stacks (30, 60) of insulating layers 60 and word lines 30 is formed over a substrate 6. Each of the insulating layers 60 and the word lines 30 extends along the first horizontal direction (i.e., the word line direction) hd1. The alternating stacks (30, 60) are laterally spaced from one another along the second horizontal direction hd2 (i.e., the global bit line direction).

Figure 16A:
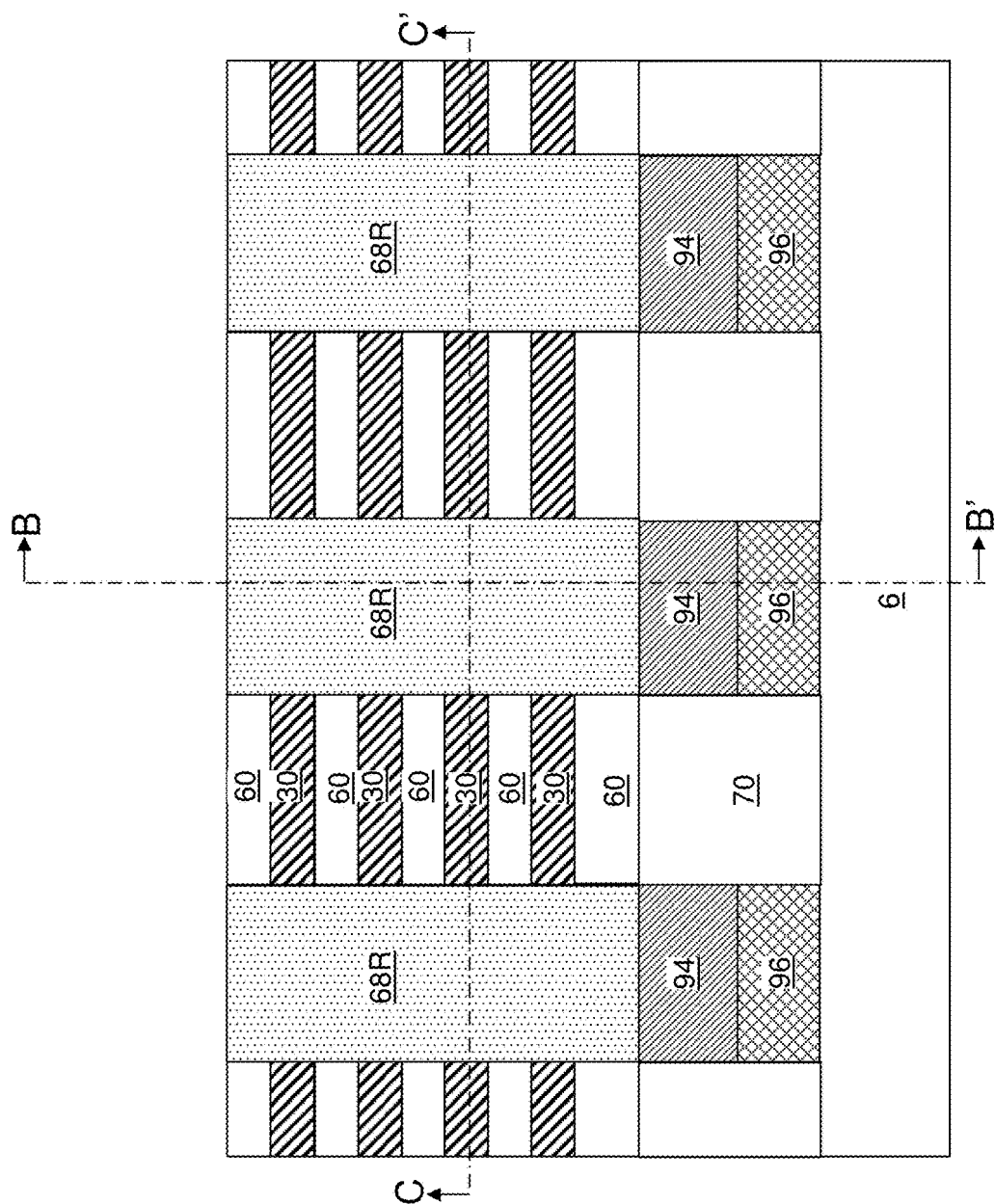
FIG. 16A is a first vertical cross-sectional view of the second exemplary structure after forming dielectric rail structures according to the second embodiment of the present disclosure.
Figure 16B:
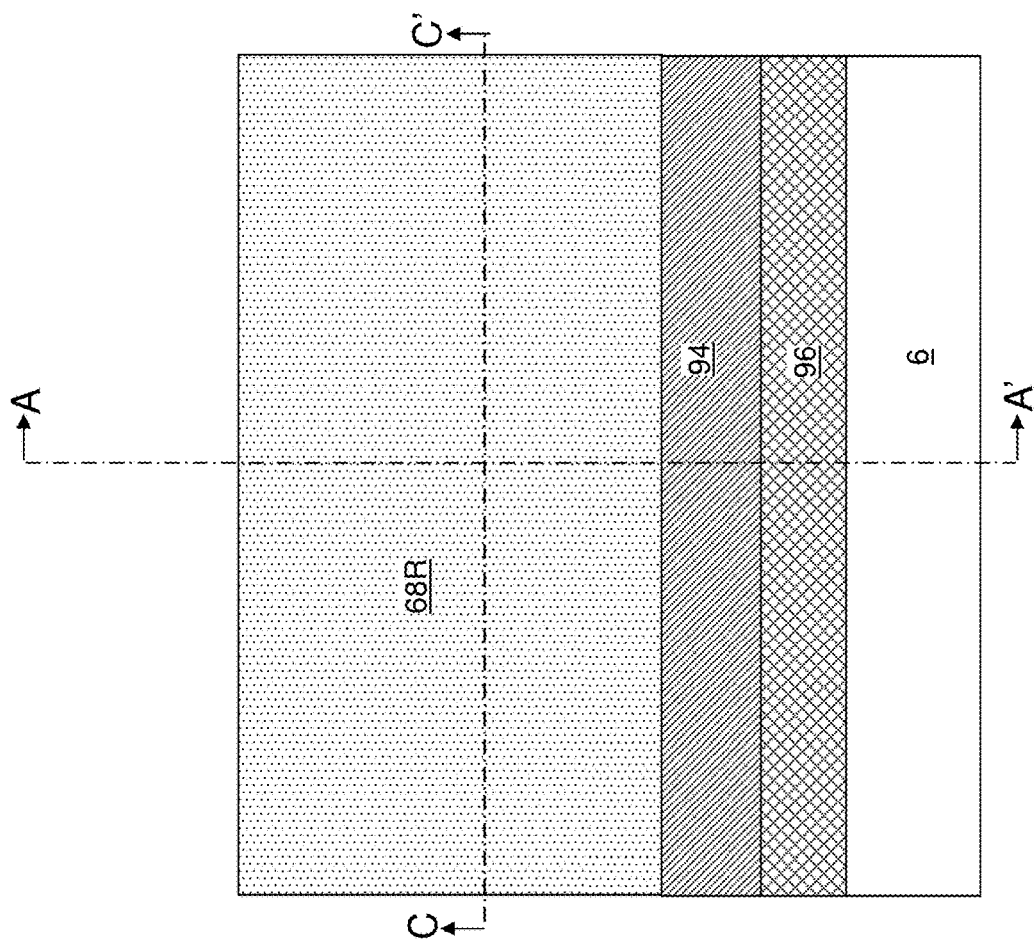
FIG. 16B is a second vertical cross-sectional view of the second exemplary structure of FIG. 16A along the vertical plane B-B'.
Figure 16C:
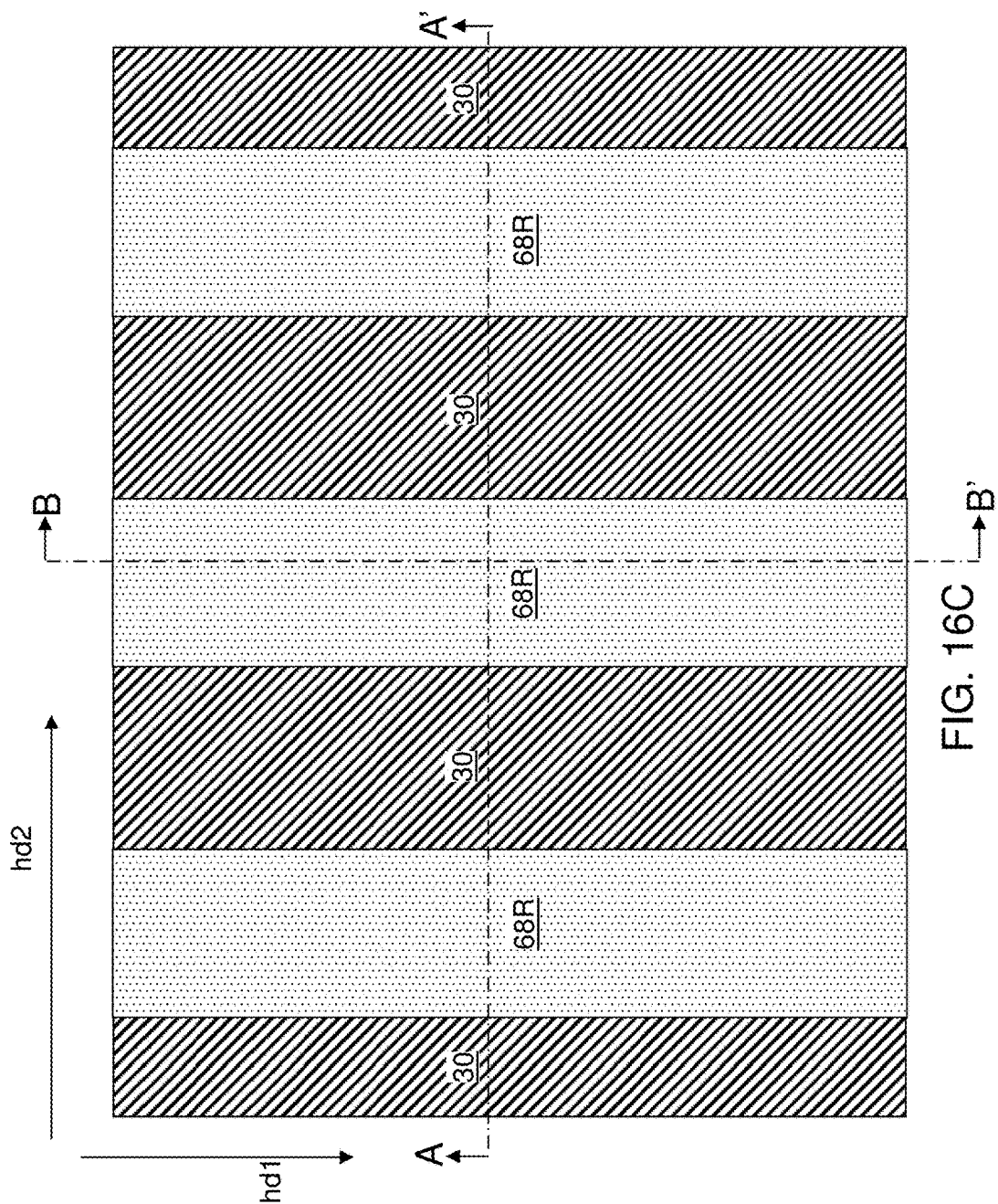
FIG. 16C is a horizontal cross-sectional view of the second exemplary structure of FIGS. 16A and 16B along the horizontal plane C-C'.

Referring to FIGS. 16A-16C, a dielectric material is deposited to fill the line trenches 49R. The dielectric material can be removed from above the alternating stacks (30, 60) by a planarization process such as chemical mechanical planarization (CMP). Each remaining portion of the dielectric material filling a line trench 49R constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass or doped silicate glass, the insulating cap layers 62 can include silicon nitride or a dielectric metal oxide, and the separator rail structures 68R can include doped silicate glass, undoped silicate glass, or organosilicate glass.

Figure 17A:
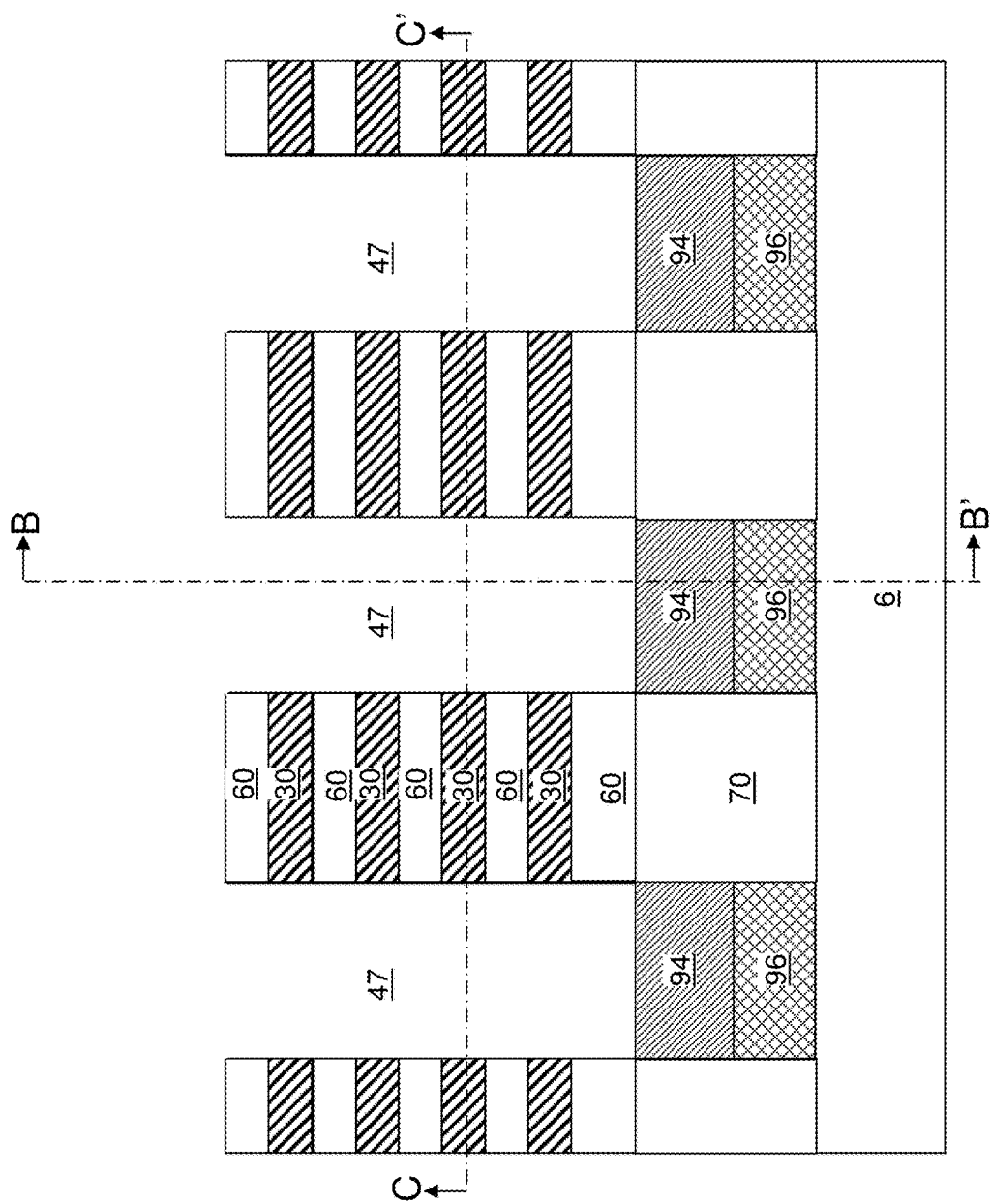
FIG. 17A is a first vertical cross-sectional view of the second exemplary structure after forming dielectric pillar structures according to the second embodiment of the present disclosure.
Figure 17B:
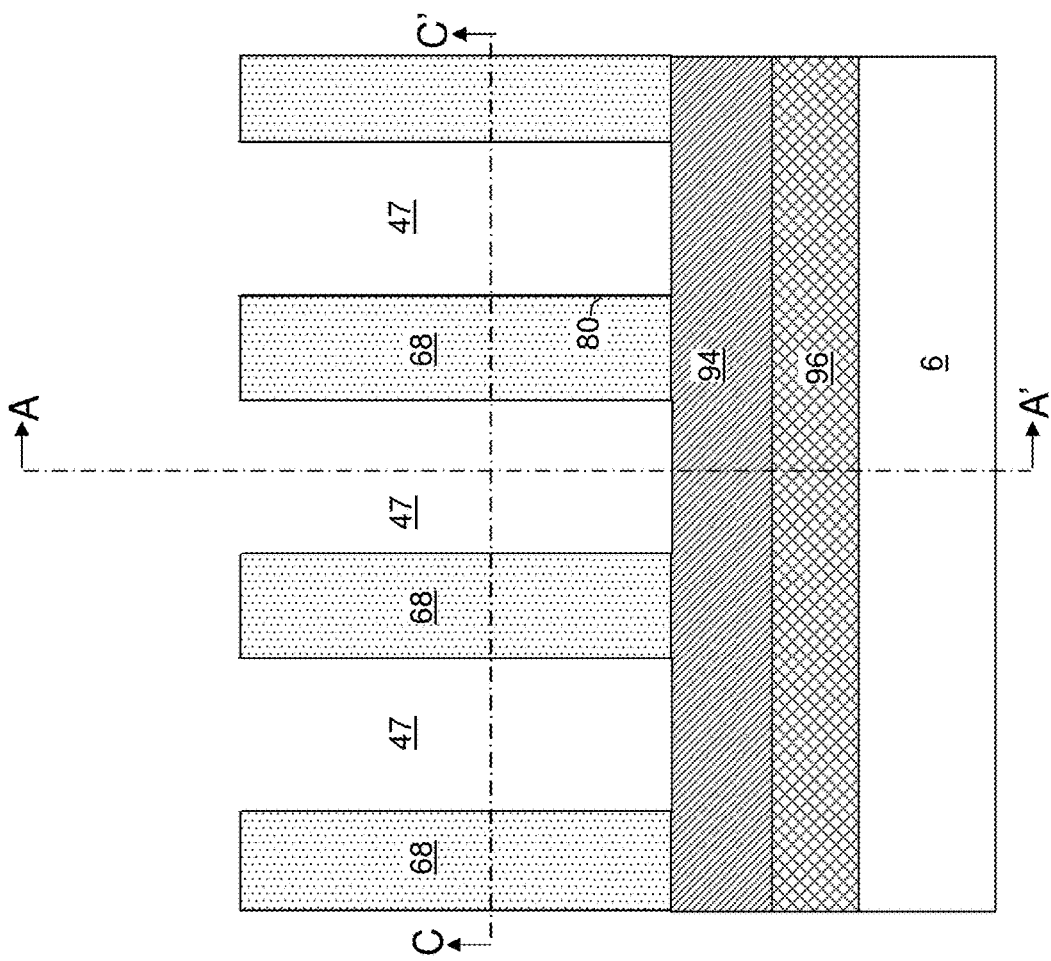
FIG. 17B is a second vertical cross-sectional view of the second exemplary structure of FIG. 17A along the vertical plane B-B'.
Figure 17C:
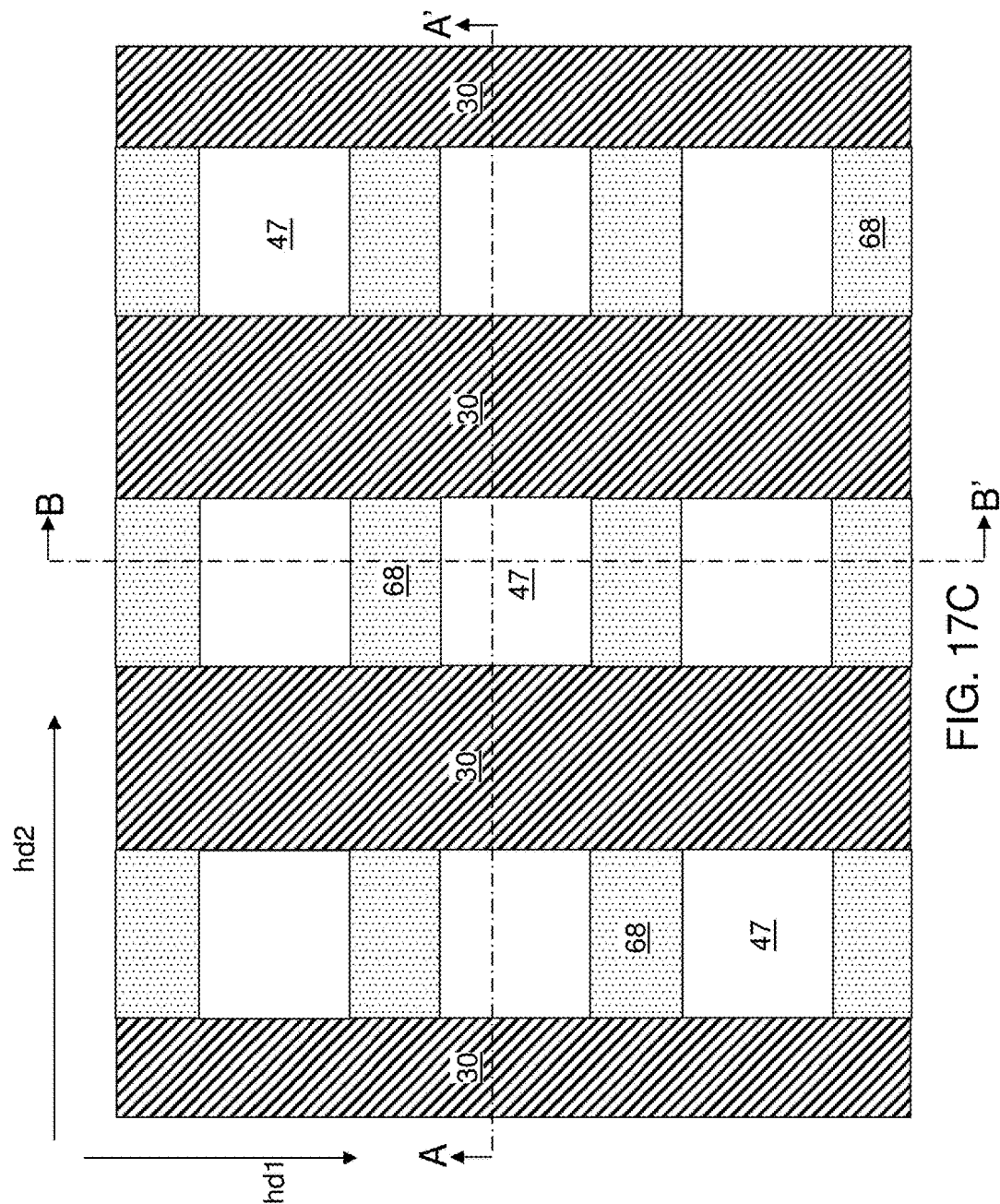
FIG. 17C is a horizontal cross-sectional view of the second exemplary structure of FIGS. 17A and 17B along the horizontal plane C-C'.

Referring to FIGS. 17A-17C, bit line cavities 47 can be formed by patterning the separator rail structures 68R into separator pillar structures 68. Specifically, a photoresist layer (not shown) can be applied over the alternating stacks (30, 60) and the separator rail structures 68R, and can be lithographically patterned to form linear portions that extend along the second horizontal direction hd2. Line trenches extending along the second horizontal direction hd2 and overlying areas of the gate lines 96 are formed between remaining portions of the photoresist layer.

An anisotropic etch that removes the dielectric material of the separator rail structures 68R selective to the topmost layer of the alternating stack (30, 60) (which may be a topmost insulating layer 60 having a greater thickness than underlying insulating layers 60) can be performed to remove portions of the separator rail structures 68R that are not covered by a combination of the photoresist layer portions and insulating cap layers 62. Bit line cavities 47 having rectangular horizontal cross-sectional areas and extending through the alternating stacks (30, 60) to top surfaces of the doped semiconductor material portions 94 (or topmost surface of diodes 93 in case the diodes 93 are employed in lieu of the doped semiconductor material portions 94) can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

Figure 18A:
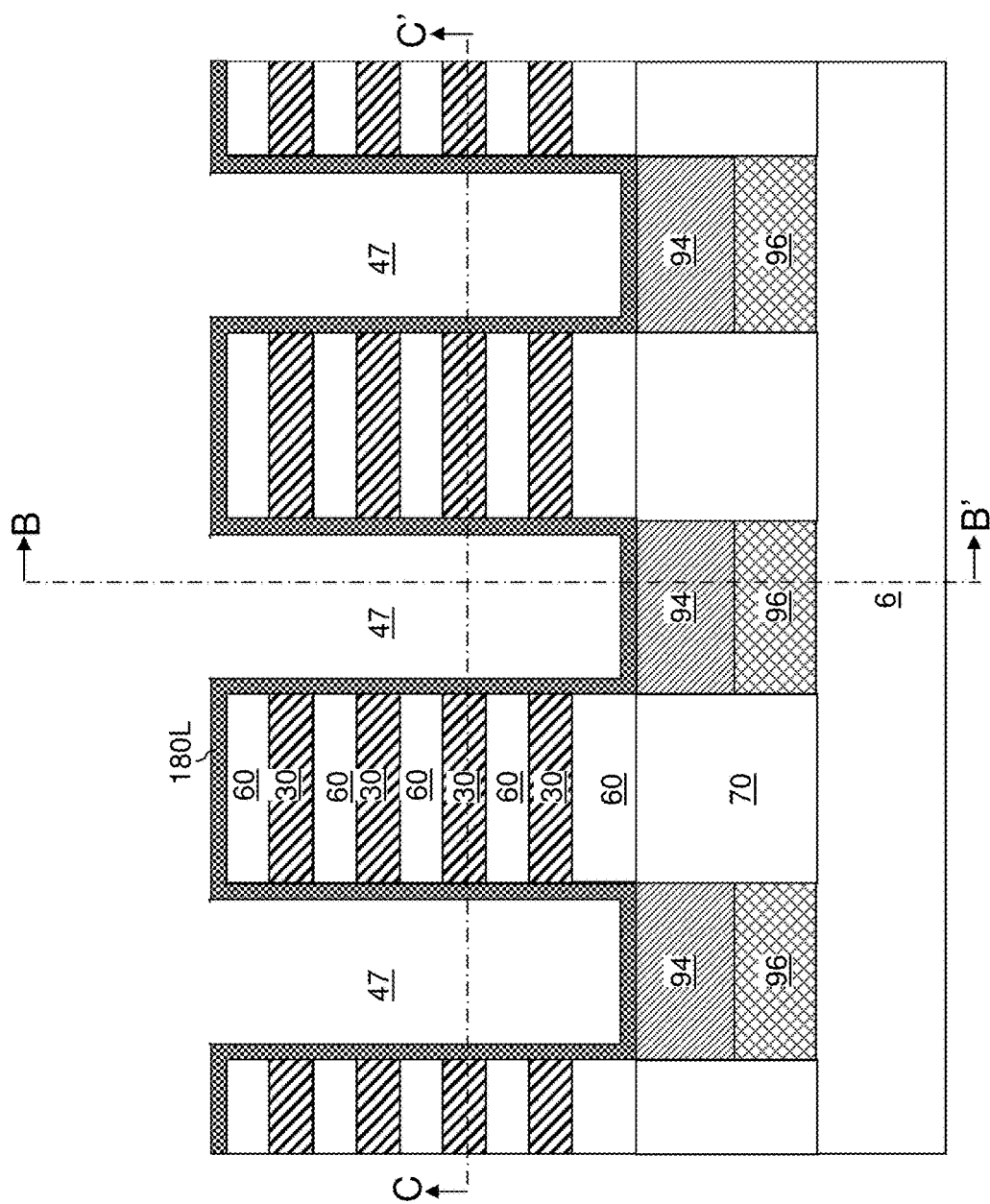
FIG. 18A is a first vertical cross-sectional view of the second exemplary structure after formation of a continuous memory material layer according to the second embodiment of the present disclosure.
Figure 18B:
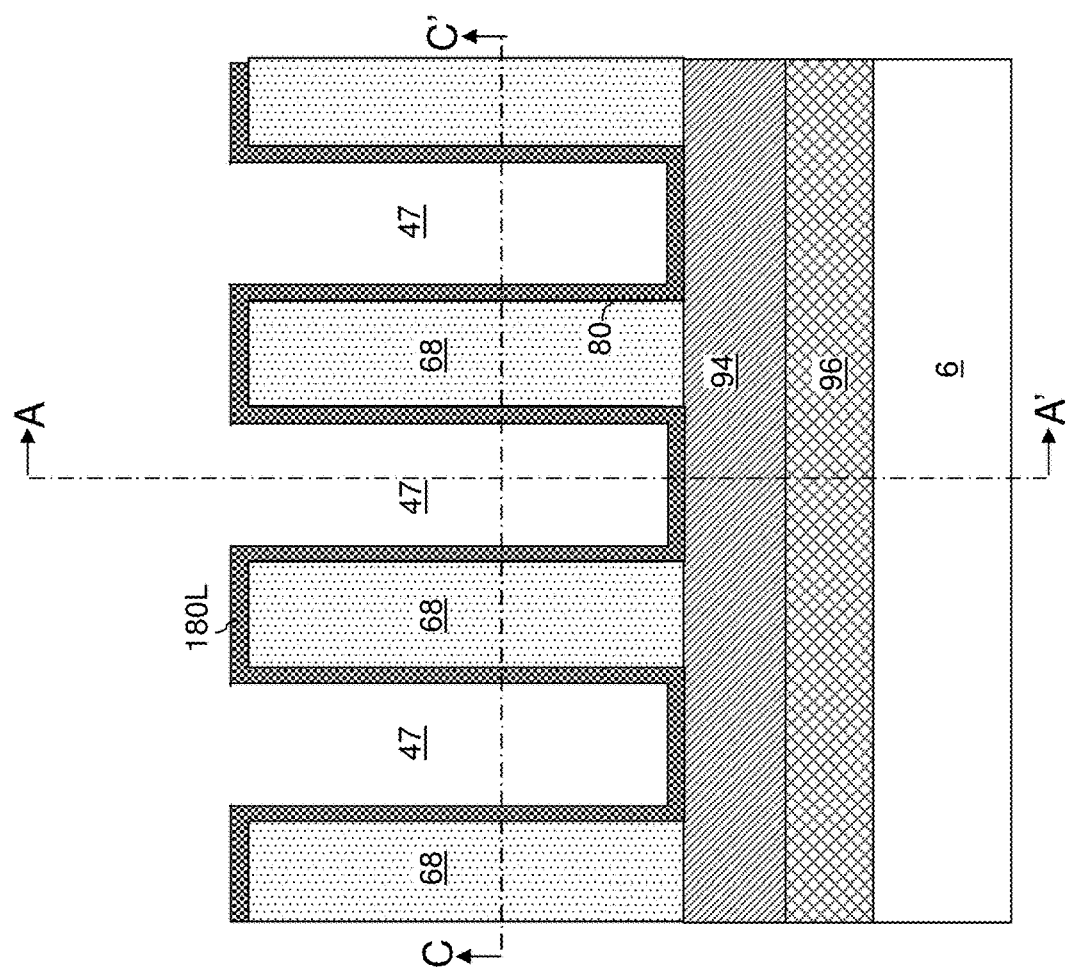
FIG. 18B is a second vertical cross-sectional view of the second exemplary structure of FIG. 18A along the vertical plane B-B'.
Figure 18C:
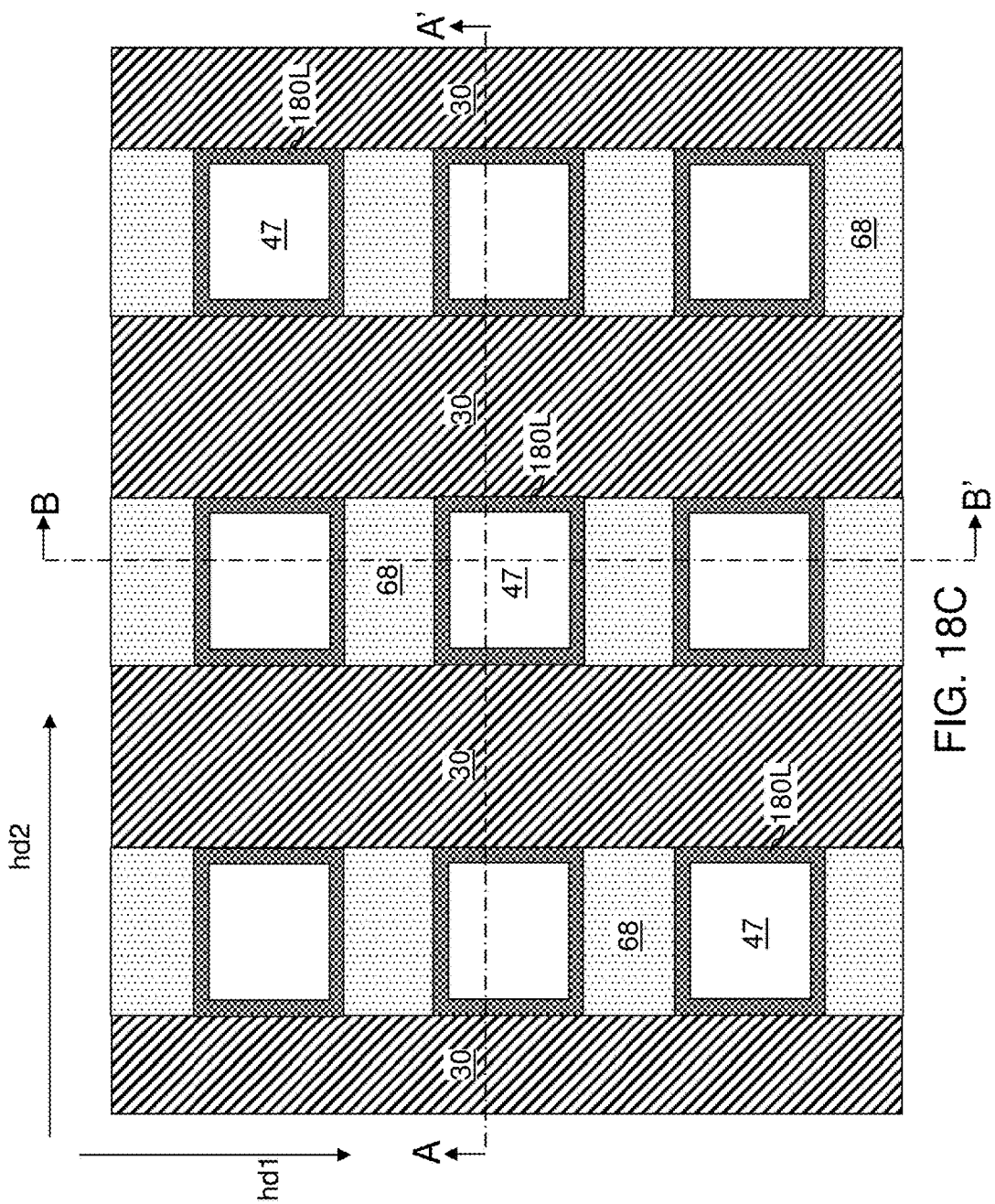
FIG. 18C is a horizontal cross-sectional view of the second exemplary structure of FIGS. 18A and 18B along the horizontal plane C-C'.

Referring to FIGS. 18A-18C, a continuous memory film 180L can be formed on each sidewall of the bit line cavities 47 and over the separator pillar structures 68. For example, the continuous memory film 180L can have the same material stack as any of the first exemplary memory film 180 of FIG. 4 and the second exemplary memory film 280 of FIG. 5.

Figure 19A:
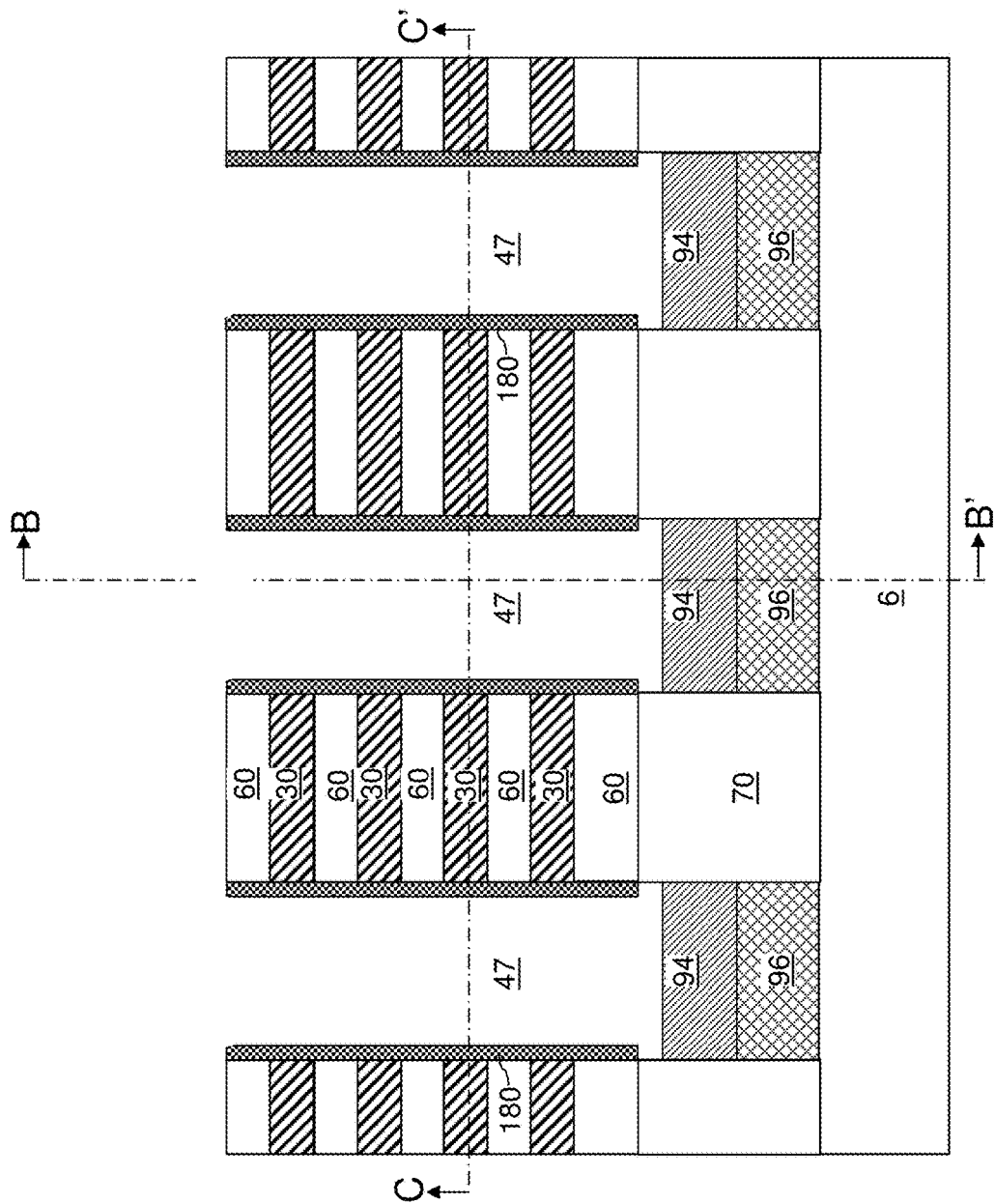
FIG. 19A is a first vertical cross-sectional view of the second exemplary structure after formation of memory material layers and optional recessing of the doped semiconductor lines according to the second embodiment of the present disclosure.
Figure 19B:
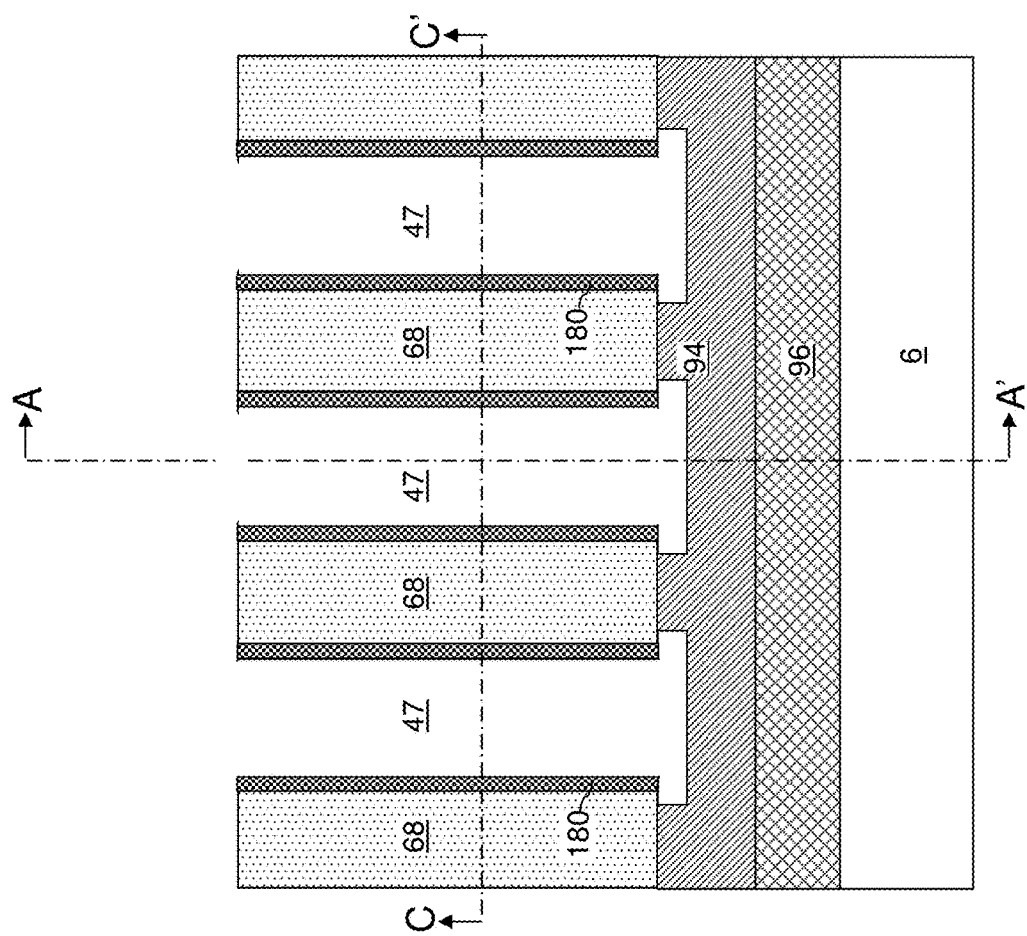
FIG. 19B is a second vertical cross-sectional view of the second exemplary structure of FIG. 19A along the vertical plane B-B'.
Figure 19C:
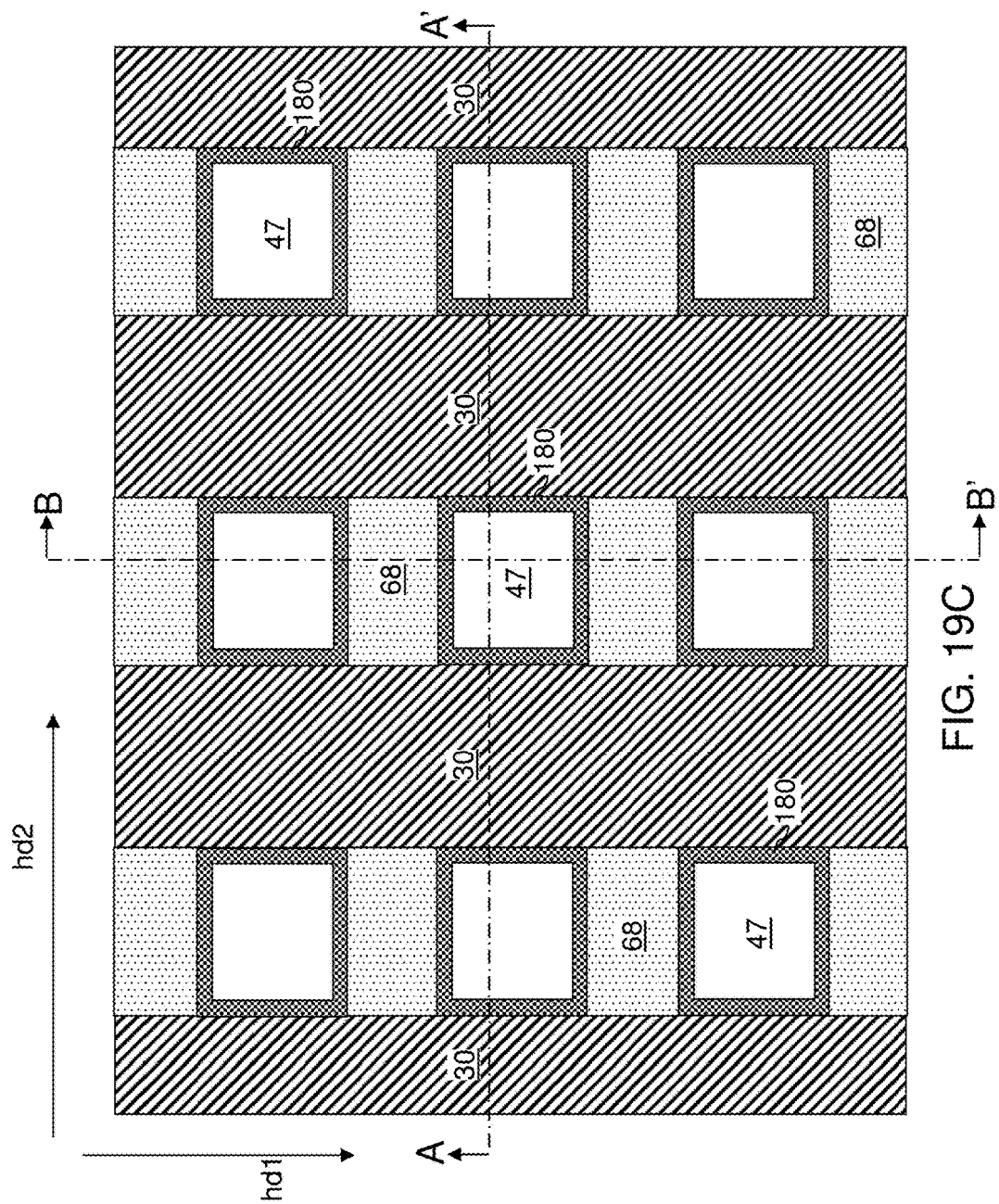
FIG. 19C is a horizontal cross-sectional view of the second exemplary structure of FIGS. 19A and 19B along the horizontal plane C-C'.

Referring to FIGS. 19A-19C, the continuous memory film 180L can be anisotropically etched to remove horizontal portions. Each remaining vertical portion of the continuous memory film constitutes a memory film 180. Each memory film 180 can be topologically homeomorphic to a torus.

Optionally, a recess etch can be performed on the doped semiconductor material portions 94 to prevent physical contact between the doped semiconductor material portions 94 and the memory films 180. The depth of recess can be in a range from 5 nm to 100 nm and/or within 1% to 50% of the thickness of the doped semiconductor material portions 94.

Figure 20A:
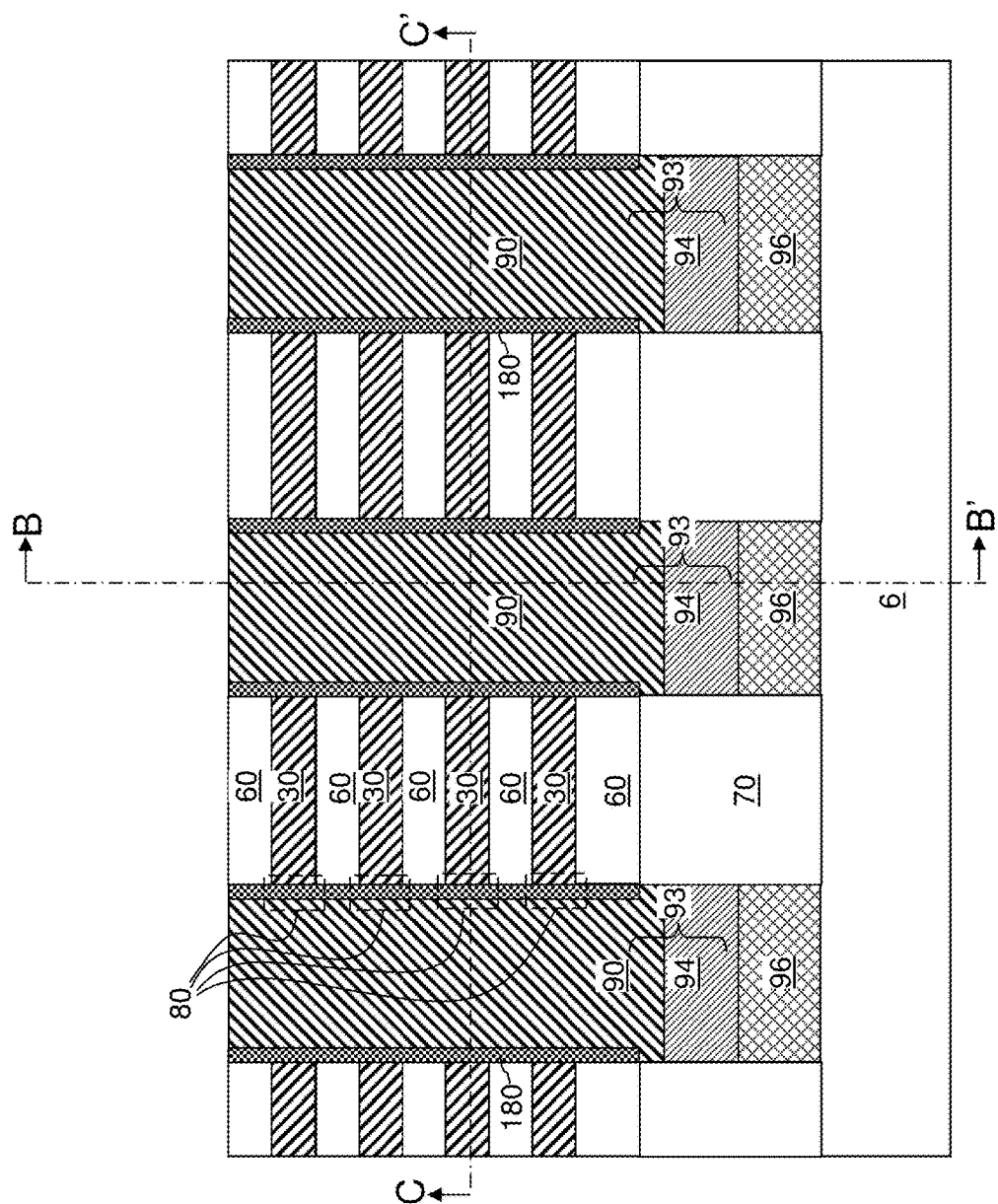
FIG. 20A is a first vertical cross-sectional view of the second exemplary structure after formation of local bit lines according to the second embodiment of the present disclosure.
Figure 20B:
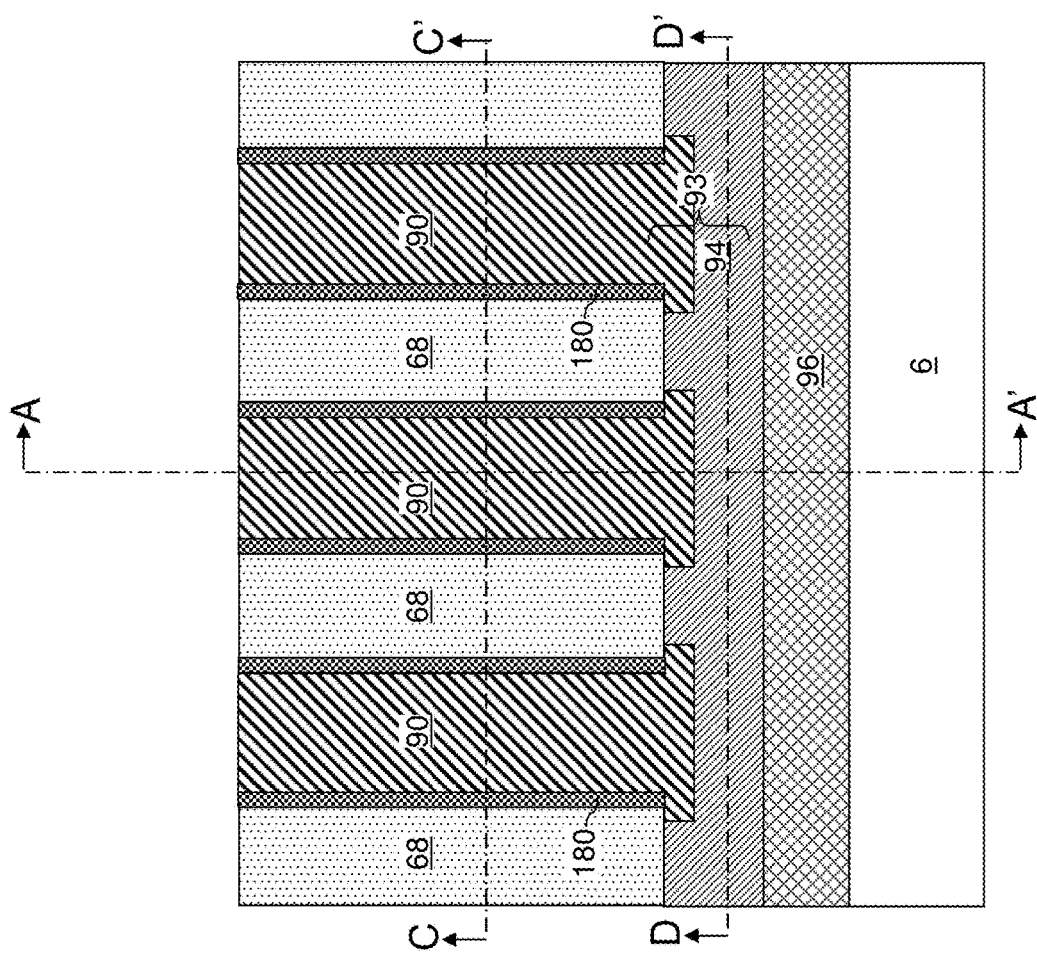
FIG. 20B is a second vertical cross-sectional view of the second exemplary structure of FIG. 20A along the vertical plane B-B'.
Figure 20C:
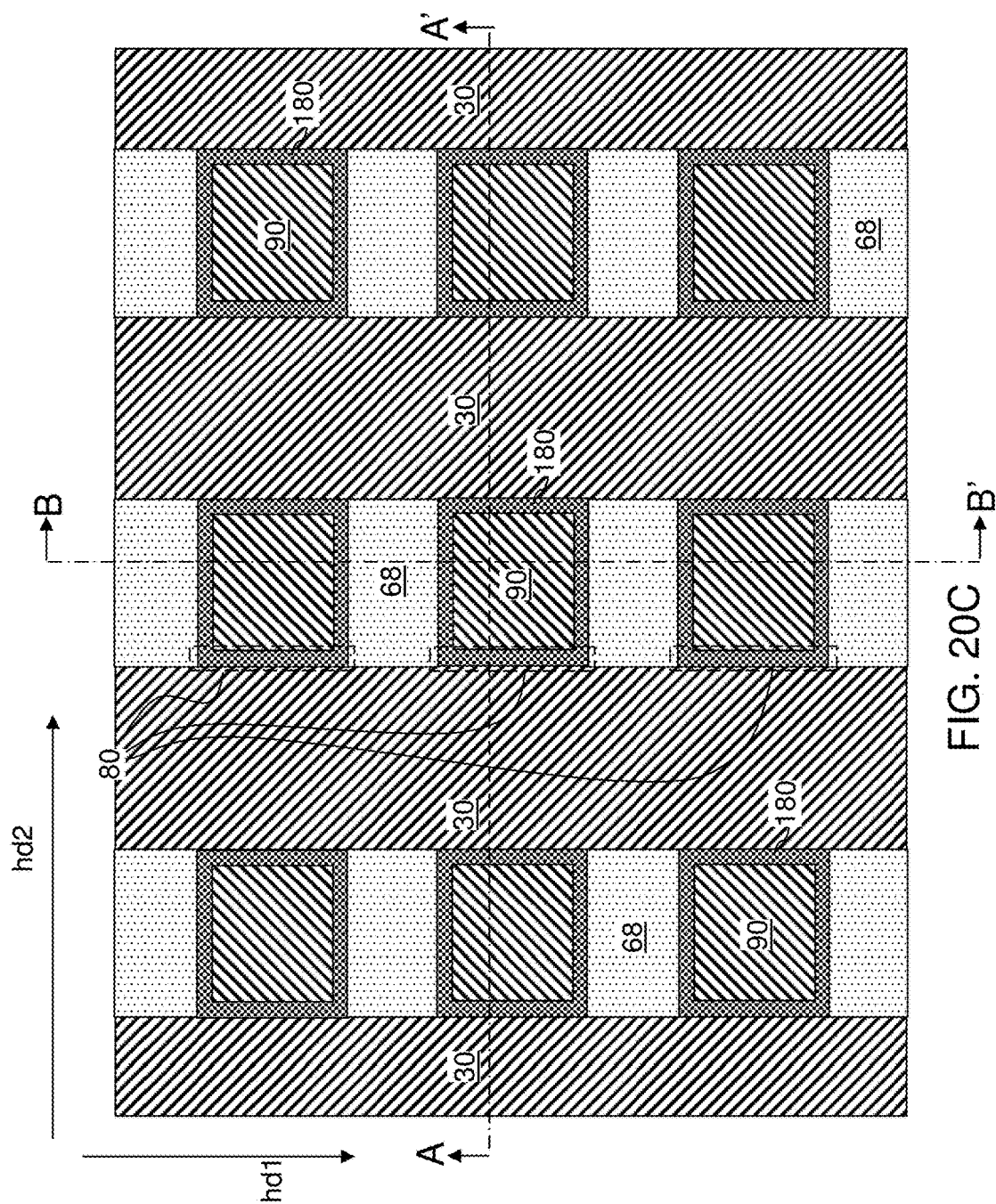
FIG. 20C is a horizontal cross-sectional view of the second exemplary structure of FIGS. 20A and 20B along the horizontal plane C-C'.
Figure 21A:
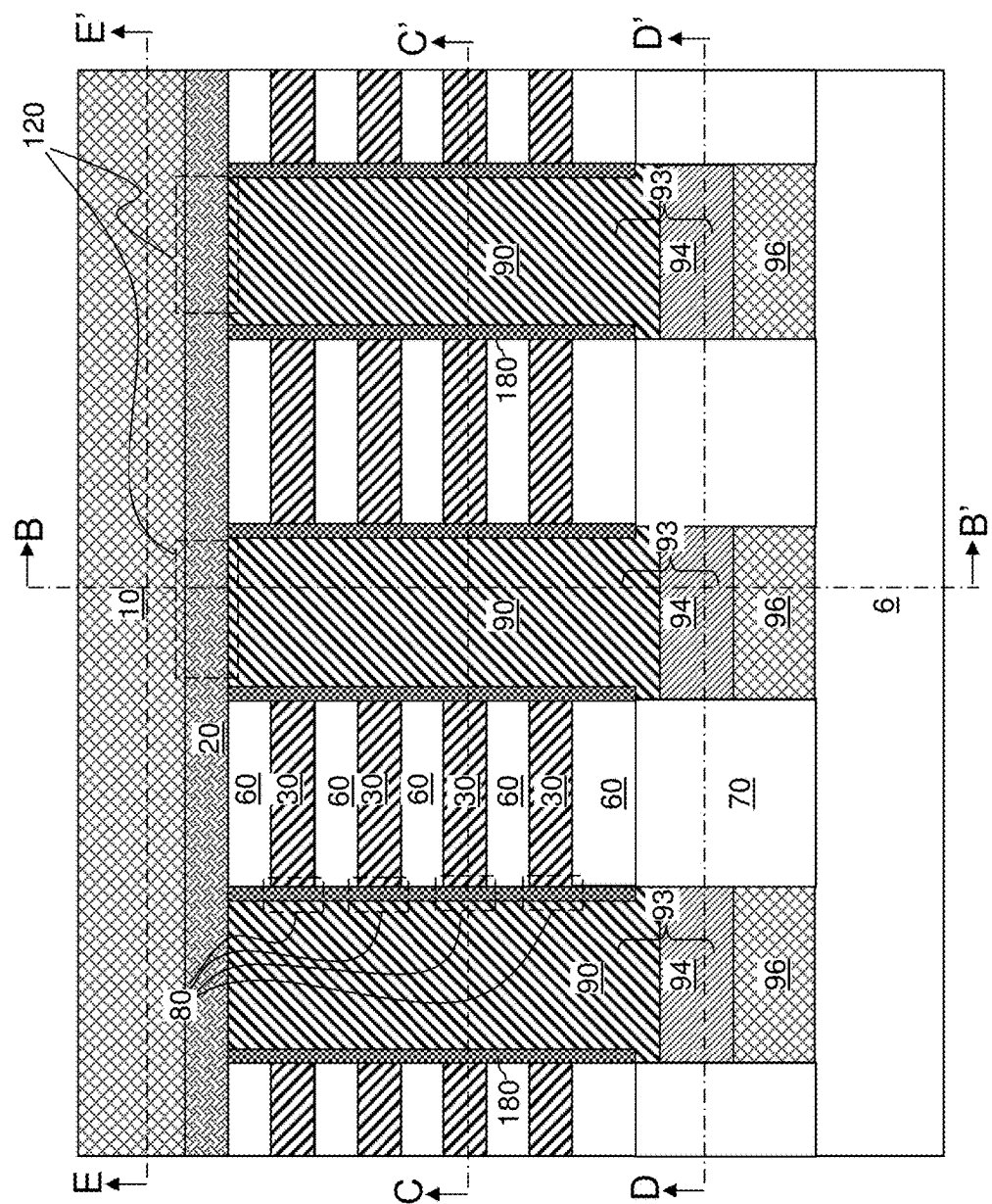
FIG. 21A is a first vertical cross-sectional view of the second exemplary structure for forming a three-dimensional memory device after forming a selector material layer and global bit lines according to the second embodiment of the present disclosure.
Figure 21B:
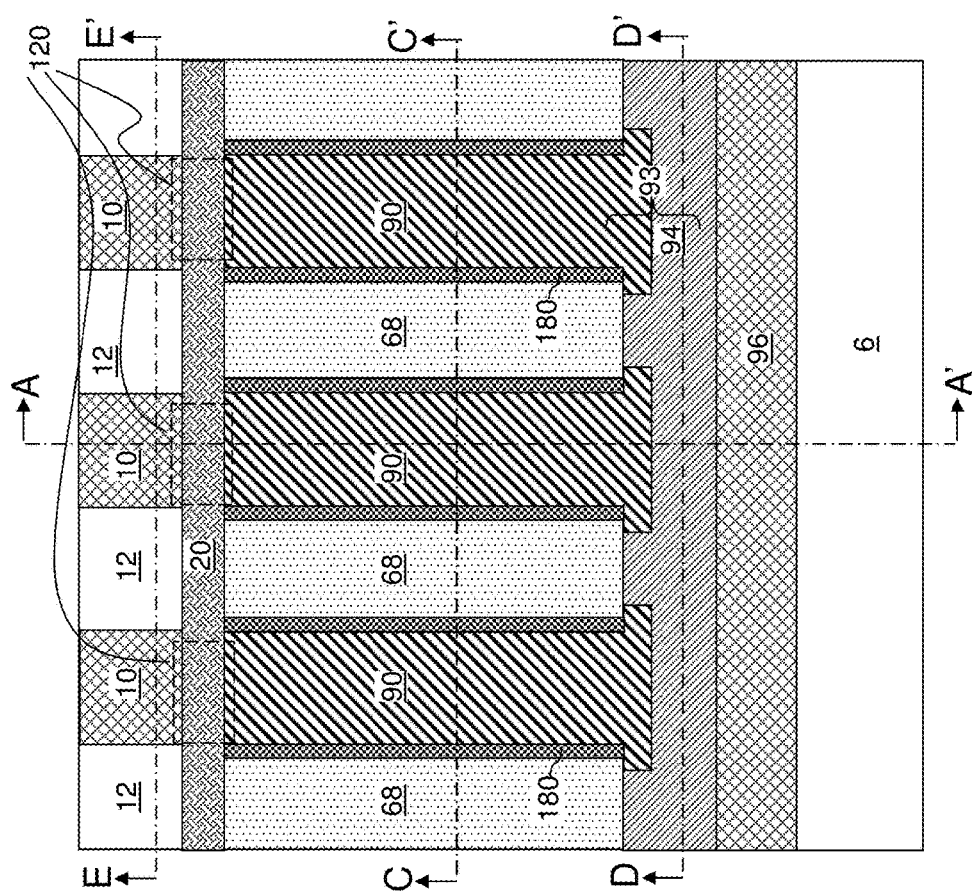
FIG. 21B is a second vertical cross-sectional view of the second exemplary structure of FIG. 21A along the vertical plane B-B'.
Figure 21C:
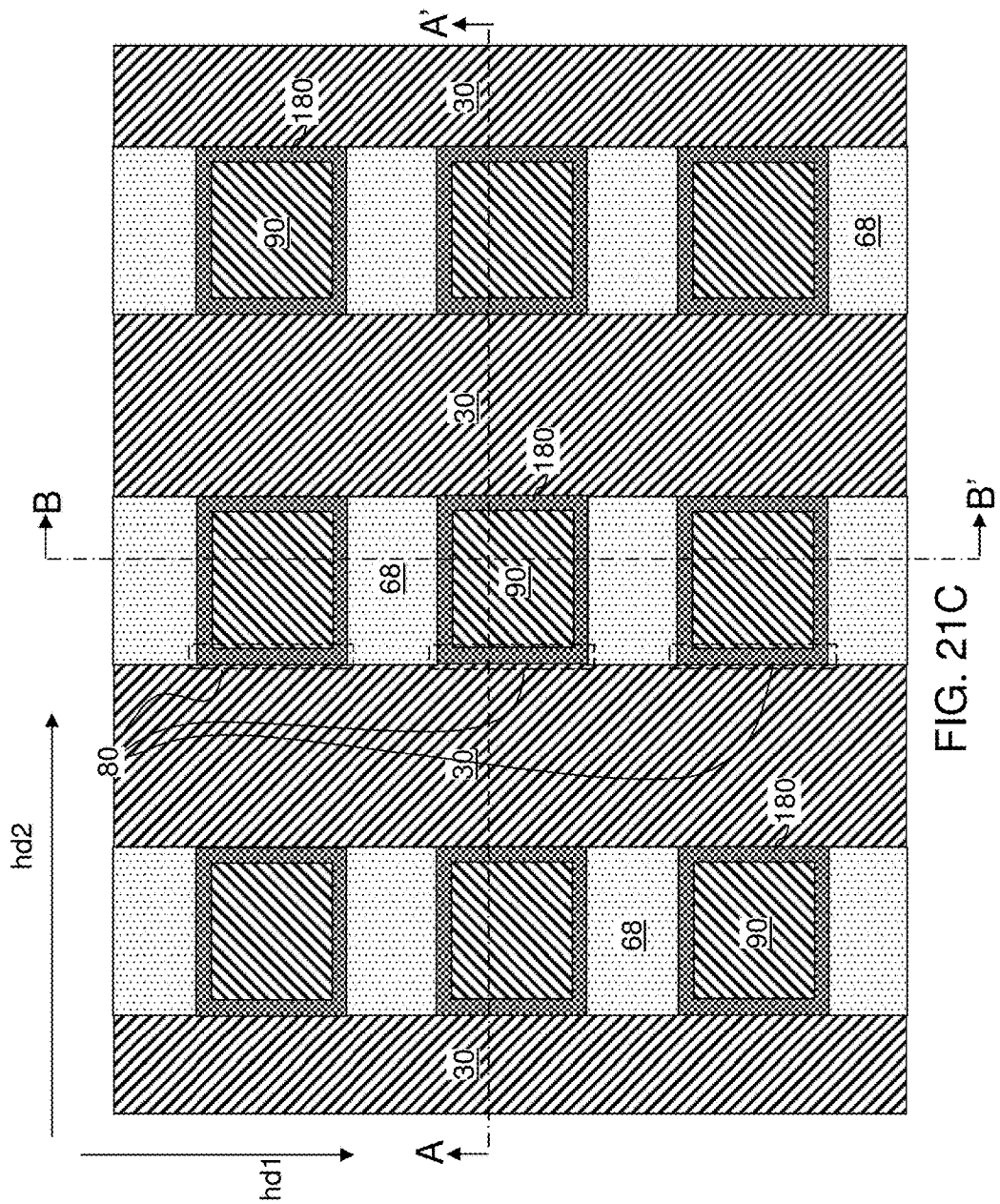
FIG. 21C is a horizontal cross-sectional view of the second exemplary structure of FIGS. 21A and 21B along the horizontal plane C-C'.
Figure 21E:
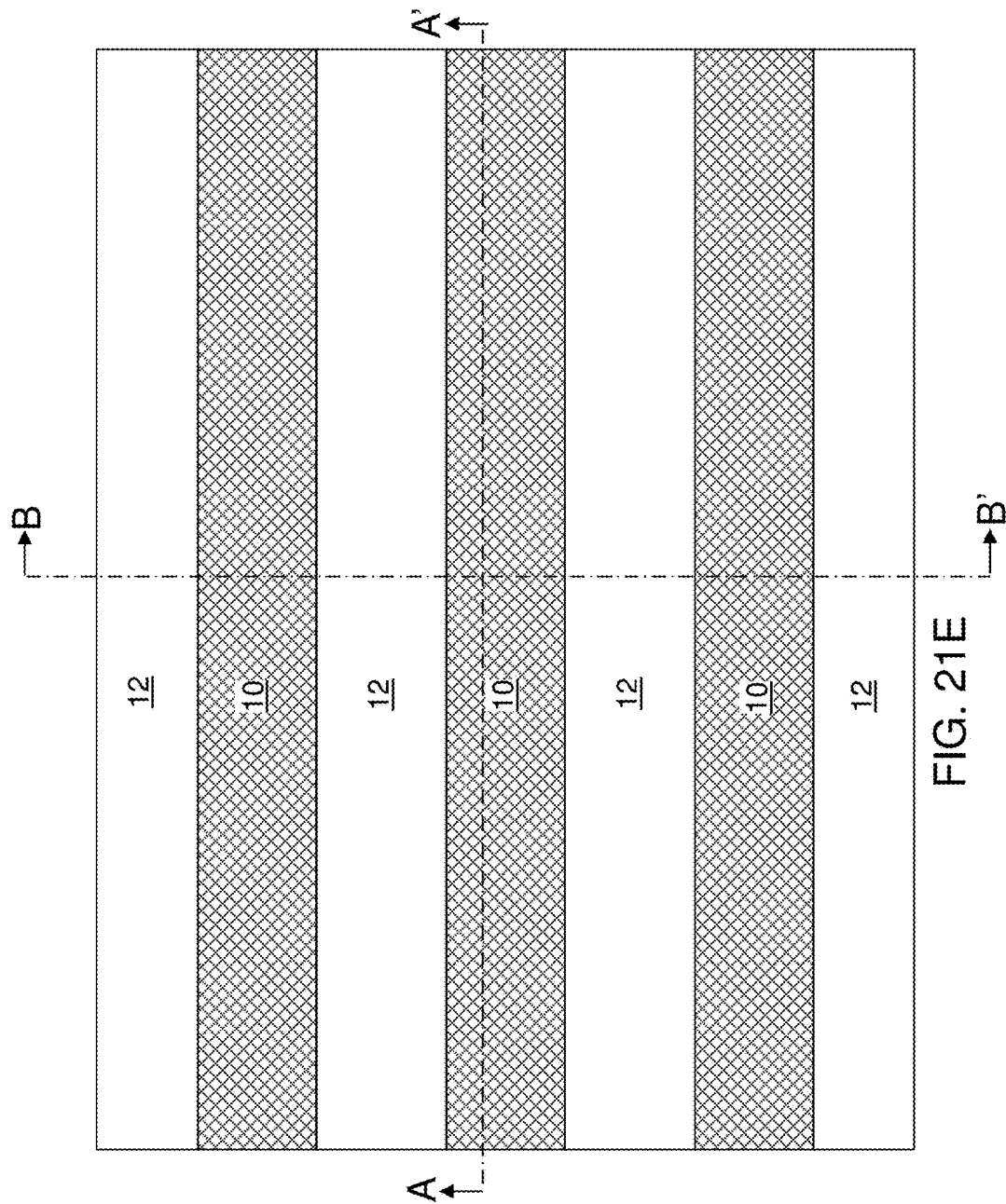
FIG. 21E is a horizontal cross-sectional view of the second exemplary structure of FIGS. 21A and 21B along the horizontal plane E-E'.

Referring to FIGS. 20A-20C, at least one conductive material is deposited in each remaining volume of the bit line cavities 47 to form local bit lines 90. The at least one conductive material can include a conductive doped semiconductor material, an elemental metal, an intermetallic alloy, and/or a conductive compound including at least one metal and at least one non-metal element such as a conductive metal nitride (e.g., TiN). In one embodiment, the at least one conductive material can include a heavily semiconductor material having dopants at an atomic concentration greater than $5.0 \times 10^{19}/cm^3$ and contacts the top surfaces of the doped semiconductor material portions 94. In one embodiment, the heavily doped semiconductor material within the local bit lines 90 can have a doping of the first conductivity type, and the doped semiconductor material within the doped semiconductor material portions 94 can have a doping of a second conductivity type that is the opposite of the first conductivity type. Excess portions of the at least one conductive material can be removed from above the top surface of the insulating cap layers 62, for example, by a planarization process (such as chemical mechanical planarization and/or a recess etch).

Each region of a memory film 180 that contacts a word line 30 and a local bit line 90 constitutes a memory element, which can be resistive memory element 80. The resistive memory elements 80 form a three-dimensional array. Two one-dimensional arrays that extent vertically can be located within a same memory film 180.

Referring to FIGS. 21A-21E, a selector material layer 20 is formed over the top surface of the local bit lines 90, the topmost insulating layer within the alternating stack (30, 60), and the separator pillar structures 68. The selector material layer 20 includes a planar layer of the above described phase change chalcogenide and/or non-Ohmic oxide material that can be employed for selector element 120. Portions of the selector material layer 20 that overlie local bit lines 90 can constitute selector elements 120 described above. The thickness of the selector material layer 20 can be in a range from 4 nm to 20 nm, although lesser and greater thicknesses can also be employed.

A one-dimensional array of global bit lines 10 and dielectric material portions 12 can be formed over the selector material layer 20. Each global bit line 10 is formed over a respective row of local bit lines 90 arranged along the second horizontal direction hd2. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof).

The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

The word lines 30, the global bit lines 10, and the gate lines 96 can be suitably electrically wired for operations as a resistive random access memory device. The second exemplary structure is advantageous in case the selector material layer 20 comprises a low temperature melting material, such as a phase change chalcogenide layer. In this structure, the selector material layer 20 is formed on top of the alternating stack (30, 60). Therefore, the selector material layer 20 is not affected by high temperature processing steps used to manufacture the alternating stack.

Figure 22:
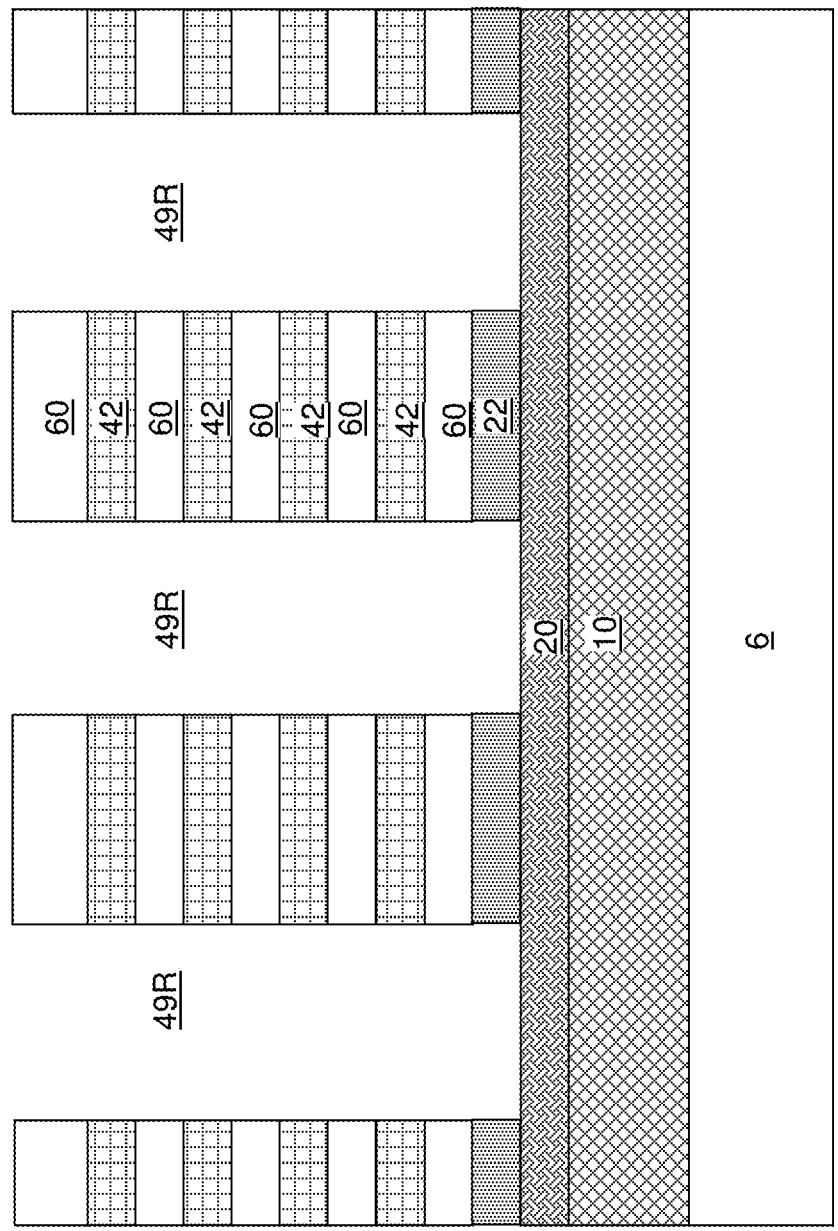
FIG. 22 is a vertical cross-sectional view of a third exemplary structure after formation and patterning of an alternating stack of insulating layers and sacrificial material layers according to a third embodiment of the present disclosure.

Referring to FIG. 22, a third exemplary structure according to an embodiment of the present disclosure can be derived from the first exemplary structure of FIGS. 7A-7C by replacing the word lines 30 with sacrificial material layers 42. The sacrificial material layers 42 have a different composition than the insulating layers 60. In one embodiment, the sacrificial material layers 42 can include germanium, a silicon-germanium alloy, amorphous or polycrystalline silicon, or silicon nitride. In case the sacrificial material layers 42 include silicon nitride, the insulating layers 60 can include undoped silicate glass (e.g., silicon oxide), and the separator pillar structures 68 to be subsequently formed can include organosilicate glass or doped silicate glass.

Figure 23:
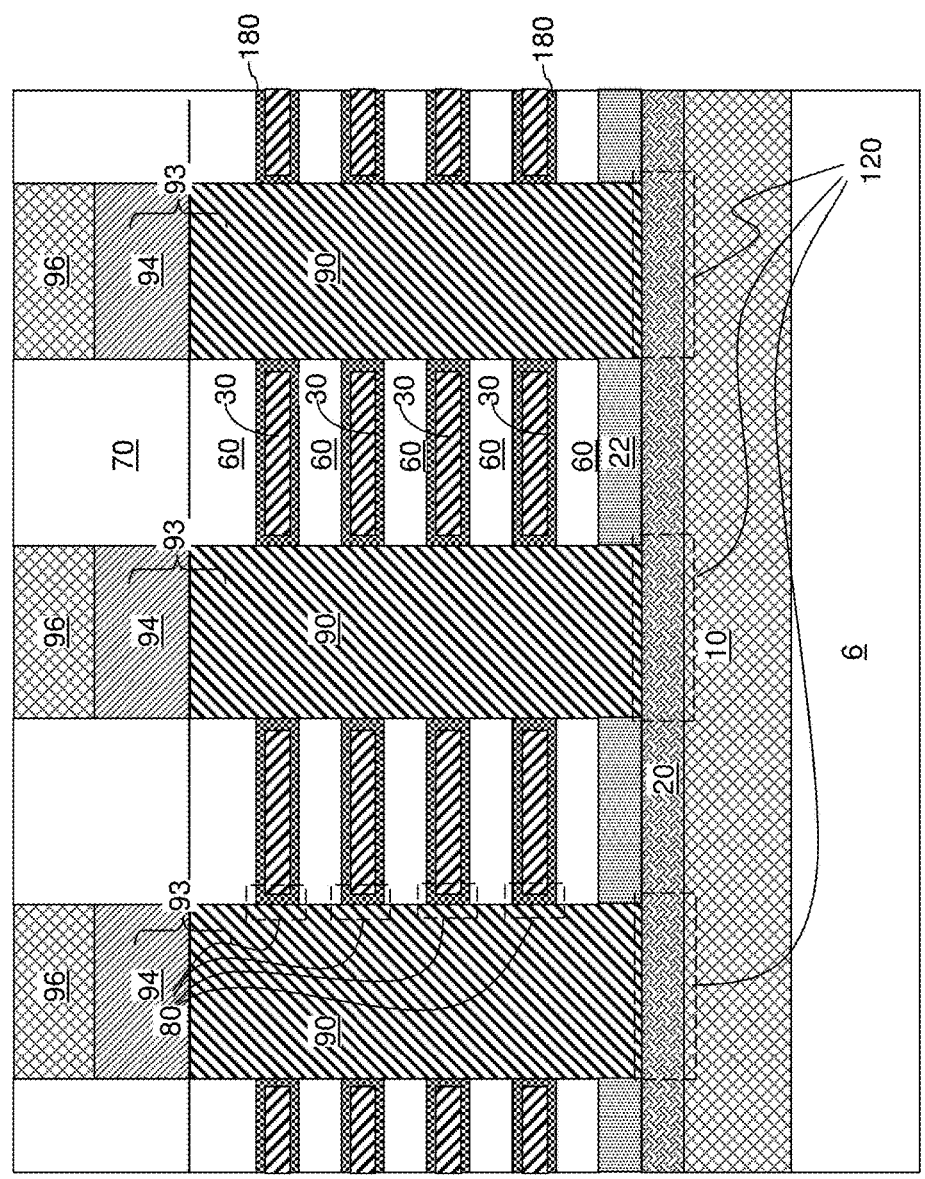
FIG. 23 is a vertical cross-sectional view of the third exemplary structure after formation of local bit lines, diodes, and gate lines according to the third embodiment of the present disclosure.

Referring to FIG. 23, the processing steps of FIGS. 8A-8C, and 9A-9C can be performed to form bit line cavities 47, and separator pillar structures 68. The local bit lines 90 can be formed directly on the sidewalls of the sacrificial material layers 42 and the insulating layers 60 employing the processing steps of FIGS. 11A and 11B. While the present disclosure is described employing an embodiment in which formation of the resistive memory elements 80 is omitted between the processing steps of FIGS. 9A-9C and the processing steps of FIGS. 11A and 11B, embodiments are expressly contemplated herein in which resistive memory elements 80 are formed employing the processing steps of FIGS. 10A-10C prior to formation of the local bit lines 90. In this case, subsequent processing sequence can be appropriately modified to avoid duplicate formation of resistive memory elements 80.

An access trench (not shown) extending through the alternating stacks (42, 60) can be formed. An etchant that etches the material of the sacrificial material layers 42 selective to the material of the insulating layers 60, and the local bit lines 90 (or resistive memory elements 80 that contact sidewalls of the alternating stacks (42, 60)) can be introduced into the access trench. For example, if the sacrificial material layers 42 include germanium or a silicon-germanium alloy, a wet etch employing a combination of hydrogen peroxide and ammonium hydroxide can be employed to remove the sacrificial material layers 42. If the sacrificial material layers 42 include silicon nitride, a wet etch employing hot phosphoric acid can be employed to remove the sacrificial material layers 42. If the sacrificial material layers 42 include amorphous or polycrystalline silicon, a wet etch employing potassium hydroxide can be employed to remove the sacrificial material layers 42. Lateral recesses can be formed in volumes from which the sacrificial material layers 42 are removed.

If the resistive memory elements 80 are not previously formed within the bit line cavities 47, the resistive memory elements 80 can be formed in the lateral recesses by deposition of suitable material layers. At least one conductive material can be deposited in remaining volumes of the lateral recesses to form word lines 30, which can function as word lines of a resistive random access memory device.

Subsequently, the processing steps of FIGS. 12A and 12B and the processing steps of FIGS. 13A-13D can be performed to form a gate level dielectric layer 70, diodes 93 and gate lines 96.

Figure 24:
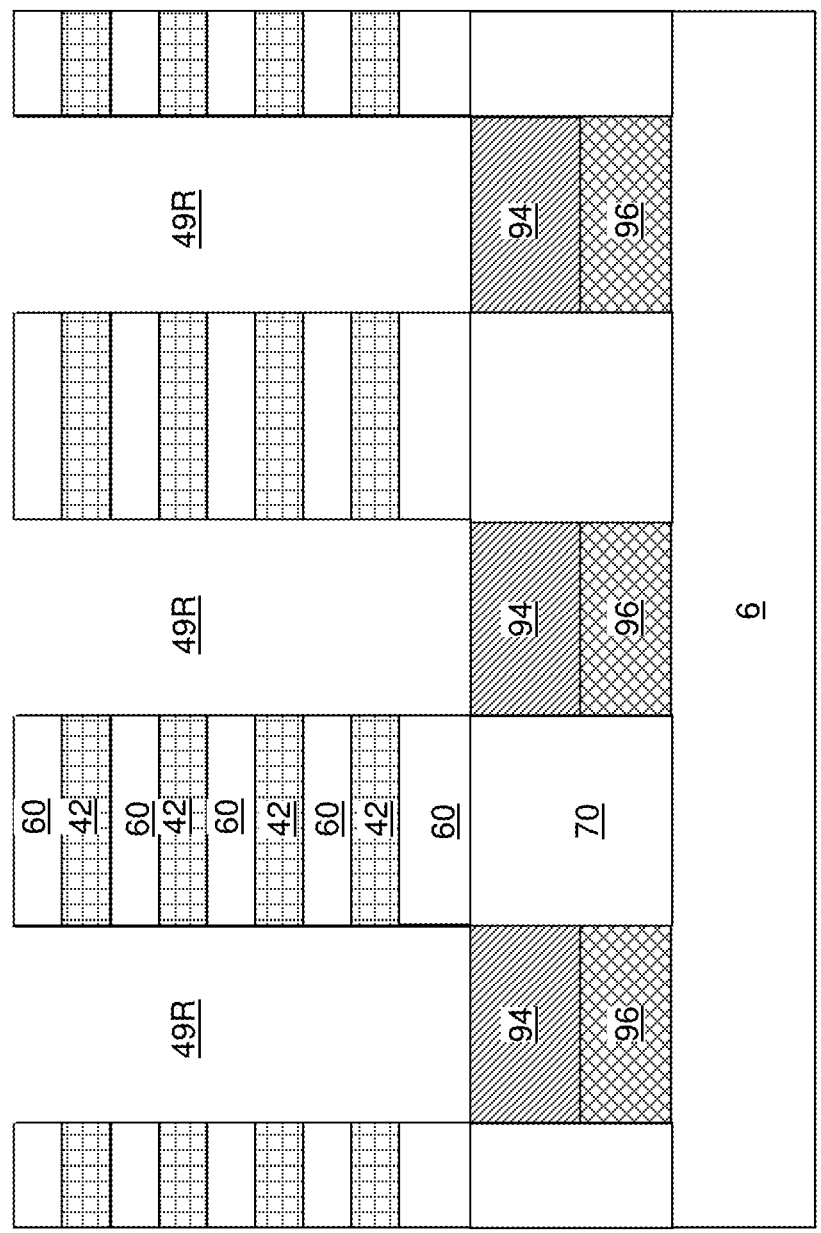
FIG. 24 is a vertical cross-sectional view of a fourth exemplary structure after formation and patterning of an alternating stack of insulating layers and sacrificial material layers according to a fourth embodiment of the present disclosure.

Referring to FIG. 24, a fourth exemplary structure according to an embodiment of the present disclosure can be derived from the second exemplary structure of FIGS. 15A-16C by replacing the word lines 30 with sacrificial material layers 42. The sacrificial material layers 42 have a different composition than the insulating layers 60. In one embodiment, the sacrificial material layers 42 can include germanium, a silicon-germanium alloy, amorphous or polycrystalline silicon, or silicon nitride. In case the sacrificial material layers 42 include silicon nitride, the insulating layers 60 can include undoped silicate glass (e.g., silicon oxide), and the separator pillar structures 68 to be subsequently formed can include organosilicate glass or doped silicate glass.

Figure 25:
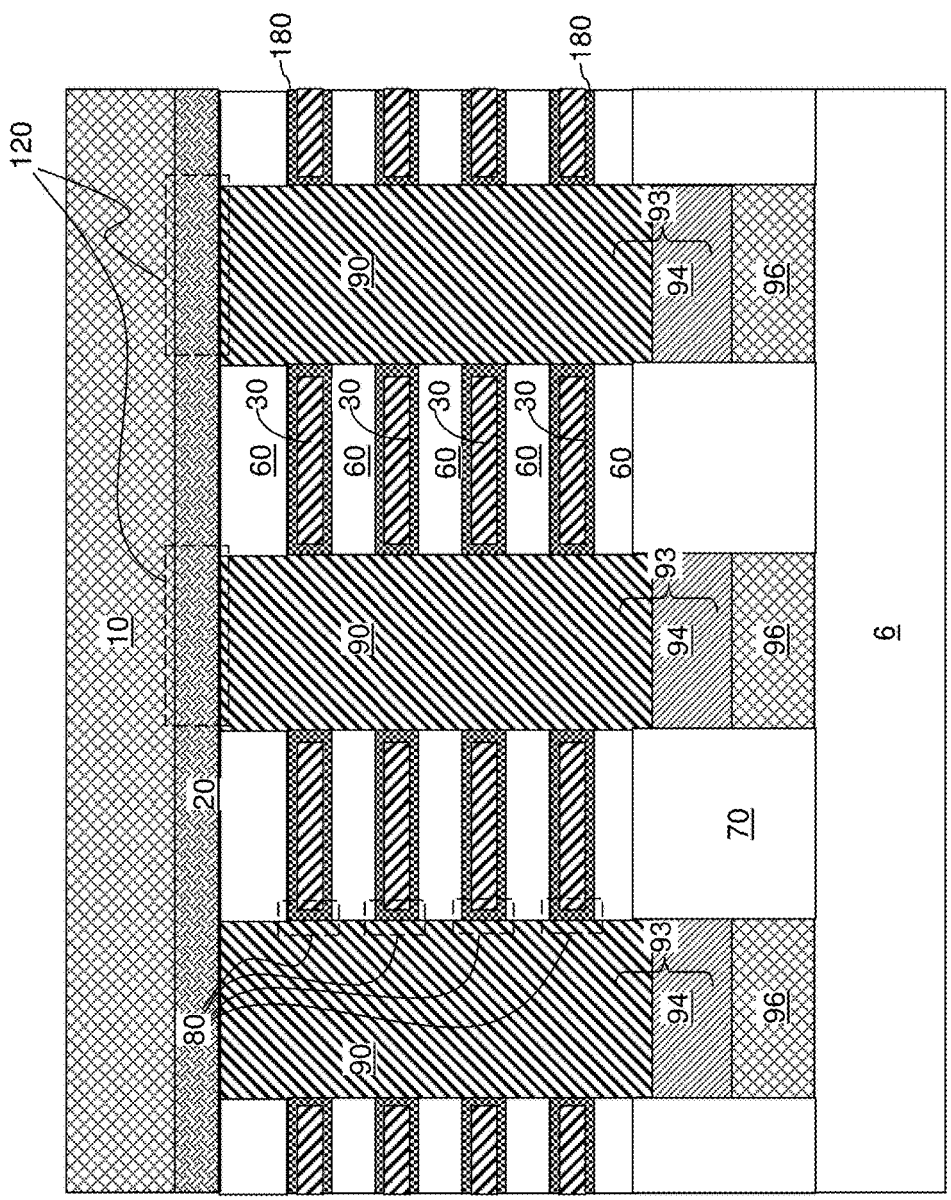
FIG. 25 is a vertical cross-sectional view of the fourth embodiment of the present disclosure.

Referring to FIG. 25, the processing steps of FIGS. 16A-16C, and 17A-17C can be performed to form bit line cavities 47, and separator pillar structures 68. The local bit lines 90 can be formed directly on the sidewalls of the sacrificial material layers 42 and the insulating layers 60 employing the processing steps of FIGS. 20A-20C. While the present disclosure is described employing an embodiment in which formation of the resistive memory elements 80 is omitted between the processing steps of FIGS. 17A-17C and the processing steps of FIGS. 20A-20C, embodiments are expressly contemplated herein in which resistive memory elements 80 are formed employing the processing steps of FIGS. 18A-18C and 19A-19C prior to formation of the local bit lines 90. In this case, subsequent processing sequence can be appropriately modified to avoid duplicate formation of resistive memory elements 80.

An access trench (not shown) extending through the alternating stacks (42, 60) can be formed. An etchant that etches the material of the sacrificial material layers 42 selective to the material of the insulating layers 60, and the local bit lines 90 (or resistive memory elements 80 that contact sidewalls of the alternating stacks (42, 60)) can be introduced into the access trench. For example, if the sacrificial material layers 42 include germanium or a silicon-germanium alloy, a wet etch employing a combination of hydrogen peroxide and ammonium hydroxide can be employed to remove the sacrificial material layers 42. If the sacrificial material layers 42 include silicon nitride, a wet etch employing hot phosphoric acid can be employed to remove the sacrificial material layers 42. If the sacrificial material layers 42 include amorphous or polycrystalline silicon, a wet etch employing potassium hydroxide can be employed to remove the sacrificial material layers 42. Lateral recesses can be formed in volumes from which the sacrificial material layers 42 are removed.

If the resistive memory elements 80 are not previously formed within the bit line cavities 47, the resistive memory elements 80 can be formed in the lateral recesses by deposition of suitable material layers. At least one conductive material can be deposited in remaining volumes of the lateral recesses to form word lines 30, which can function as word lines of a resistive random access memory device. Subsequently, the processing steps of FIGS. 21A-21E can be performed to form the global bit lines 10, the separator dielectric material portions 12 and the selector material layer 20.

Figure 26:
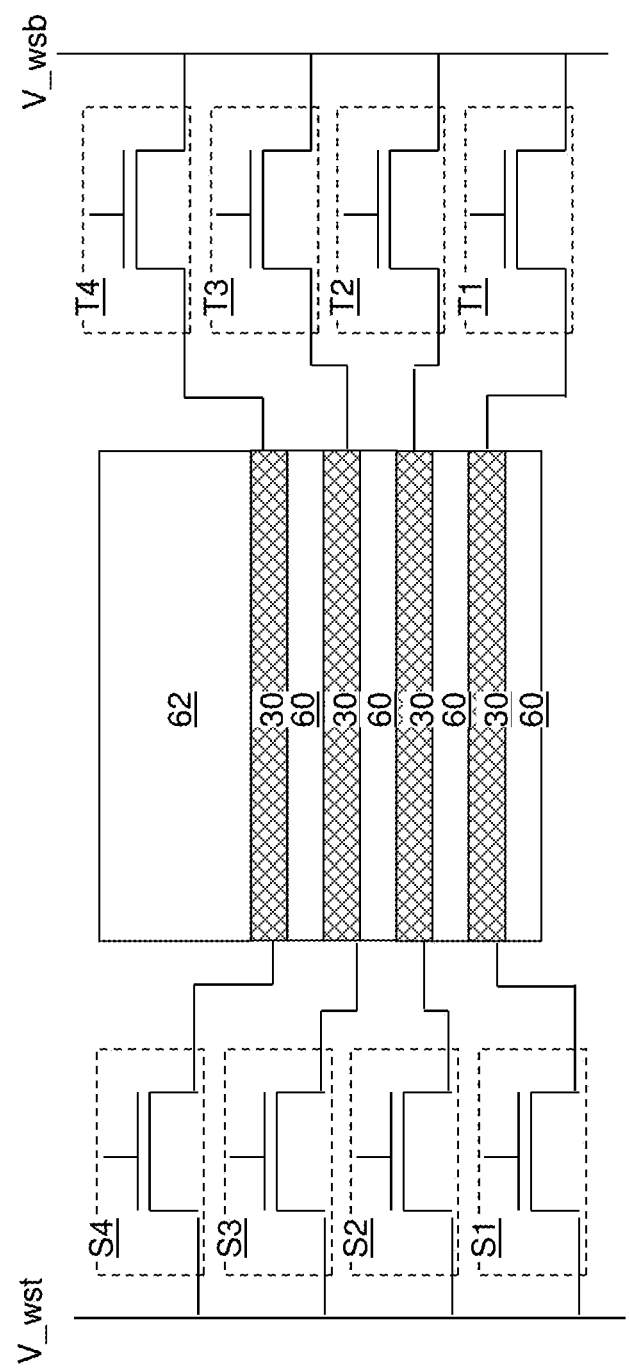
FIG. 26 illustrates an exemplary configuration that can be employed to apply control voltages to the word lines of the three-dimensional memory device of the present disclosure.

Referring to FIG. 26, an exemplary set of peripheral devices is illustrated, which can be employed to access the word lines 30 of the exemplary structures described. In this case, word line select voltage switching transistors (S1-S4) can be employed to apply the word line select voltage to a selected word line among the set of word lines 30. Word line standby voltage switching transistors (T1-T4) can be employed to apply the word line standby voltage to all other word lines along other than the selected word line among the set of word lines 30. Alternatively, a single set of switching transistors (S1-S4) may be used if the standby voltage is zero volts. A similar switching scheme can be employed to electrically bias the global bit lines 10 and the gate lines 96.

Generally speaking, the various embodiments of the present disclosure provide a three-dimensional memory device, which includes an alternating stack (30, 60) of electrically conductive layers 30 (e.g., word lines) and insulating layers 60. Each layer in the alternating stack (30, 60) laterally extends along a first horizontal direction hd1. The three-dimensional memory device includes local bit lines 90 located over sidewalls of layers of the alternating stack (30, 60) and vertically extending from a bottommost layer of the alternating stack (30, 60) to a topmost layer within the alternating stack (30, 60). Memory elements (such as resistive memory elements 80) are located at each overlap region between the electrically conductive layers 30 and the local bit lines 90. A diode 93 is located at a first end of each of the local bit lines 90, and a selector material layer 20 (e.g., a selector element 120) is located at a second end of each of the local bit lines 90. The selector element comprises a material that provides a conductivity change (and a corresponding resistivity change) of at least one order of magnitude upon application of a voltage. In one embodiment, the three-dimensional memory structure can include gate lines 96 contacting a set of diodes 93 such that each diode of the set of diodes is located in electrical series between a respective local bit line 90 and gate line 96. The gate lines 96 are arranged (i.e., extend) along the first horizontal direction hd1 and the plurality of global bit lines 10 extend in a second horizontal direction hd2 that is different from the first horizontal direction hd1.

In one embodiment, the device includes an alternating stack of word lines 30 and insulating layers 60, a plurality of gate lines 96, a plurality of global bit lines 10 and a plurality of local bit lines 90 located over sidewalls of the alternating stack and vertically extending through the alternating stack. Each local bit line 90 contacts a respective one of the plurality of gate lines 96 and a respective one of the plurality of global bit lines 10. A plurality of memory elements 80 are located at each overlap region between the word lines 60 and the local bit lines 90. Each of the plurality of diodes 93 is located in electrical series between each of the local bit lines 90 and the respective one of the plurality of gate lines 96. Each of the plurality of selector elements 120 is located in electrical series between each of the local bit lines 90 and the respective one of the plurality of global bit lines 10. The selector elements 120 comprise a material that provides a conductivity change (and a correspondence resistivity change) of at least one order of magnitude upon application of a voltage. The global bit lines 10 and the gate lines 96 form a cross point array which can be used to select a given local bit line 90. The word lines 30 may be used to select a particular memory cell (e.g., memory element 80) adjacent to the selected local bit line 90.

Figure 27:
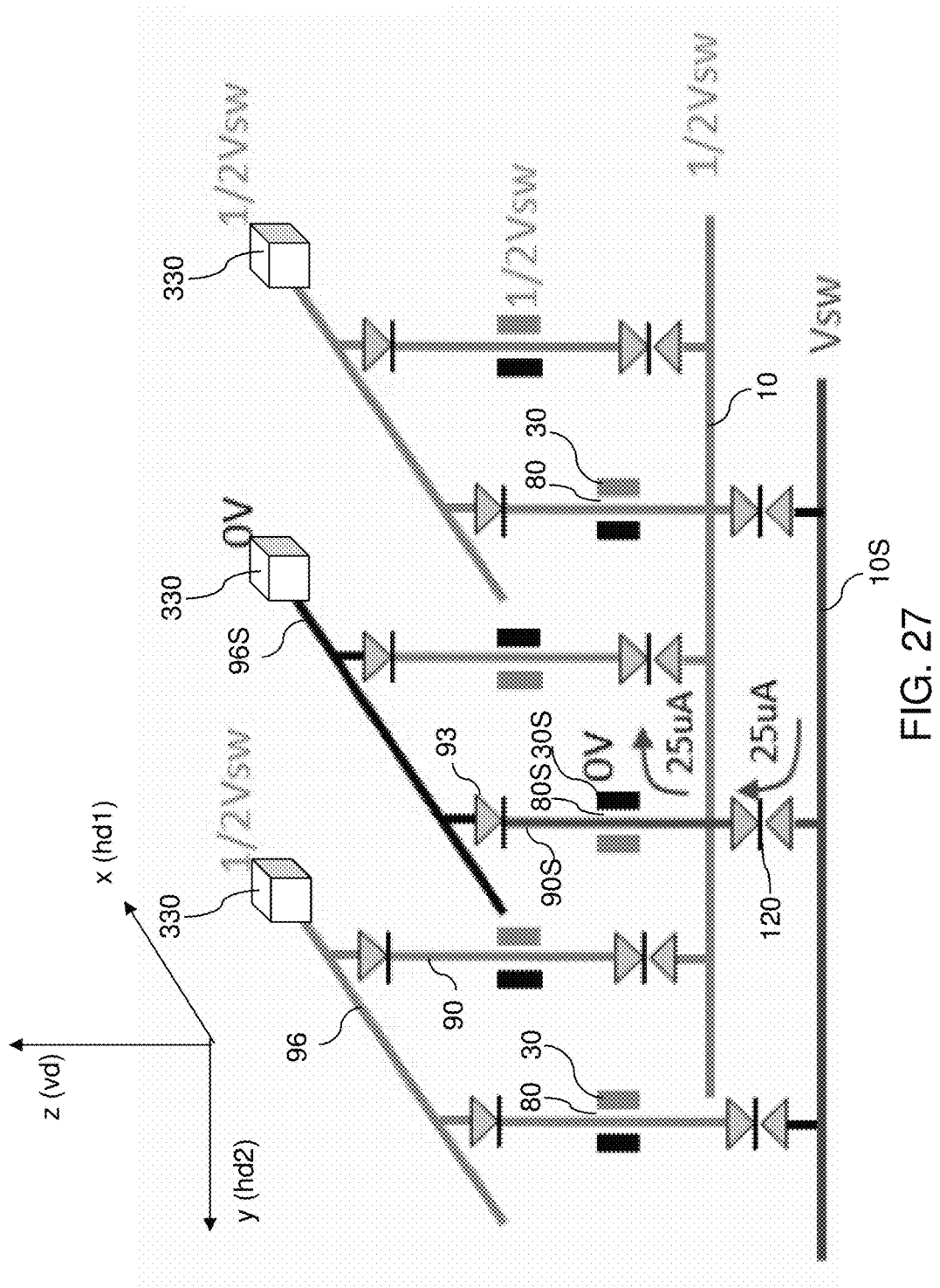
FIG. 27 illustrates a first exemplary bias scheme for programming a selected memory cell in a forward bias mode according to an embodiment of the present disclosure.
Figure 28:
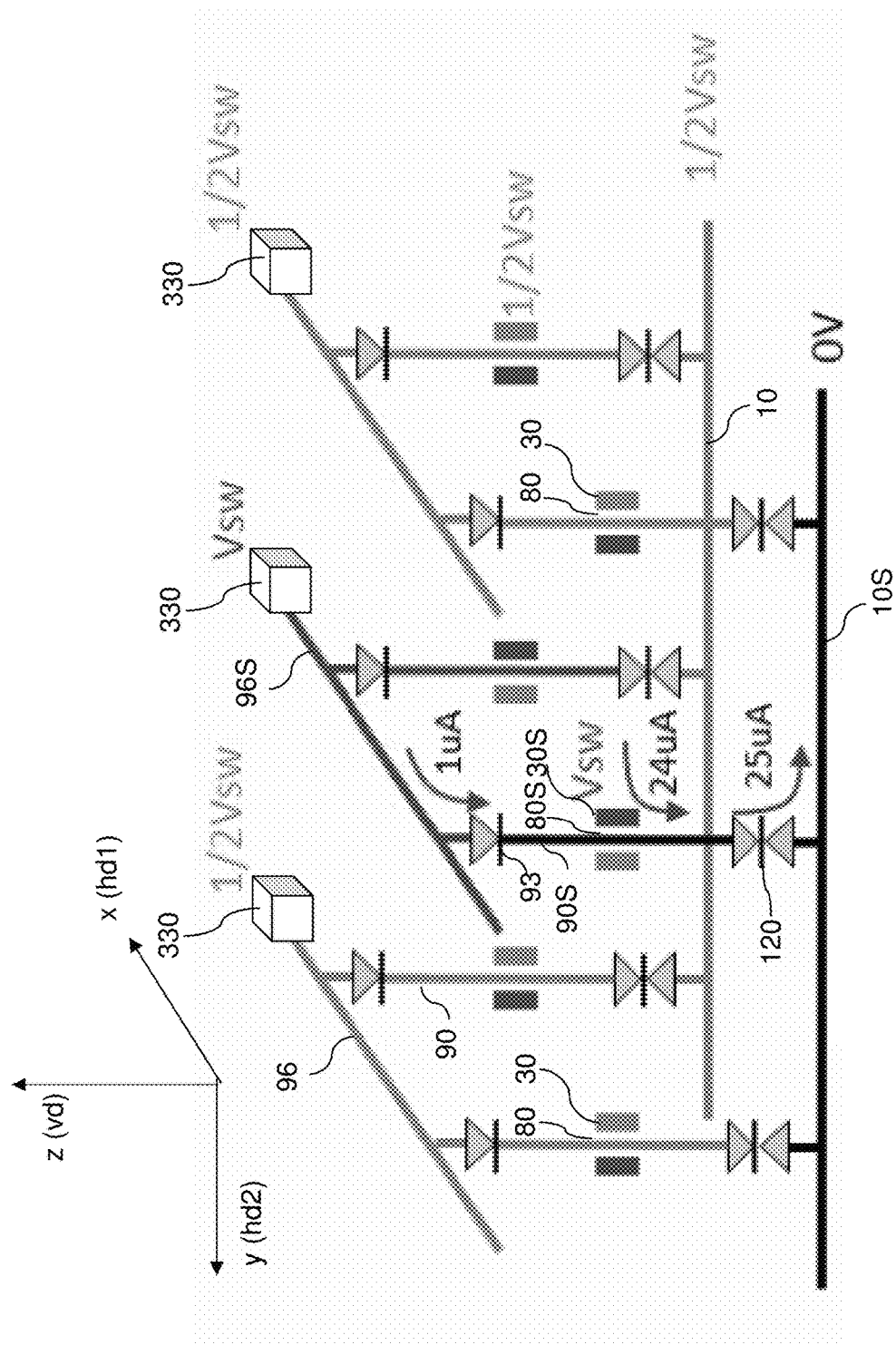
FIG. 28 illustrates the first exemplary bias scheme for programming a selected memory cell in a reverse bias mode according to an embodiment of the present disclosure.
Figure 29:
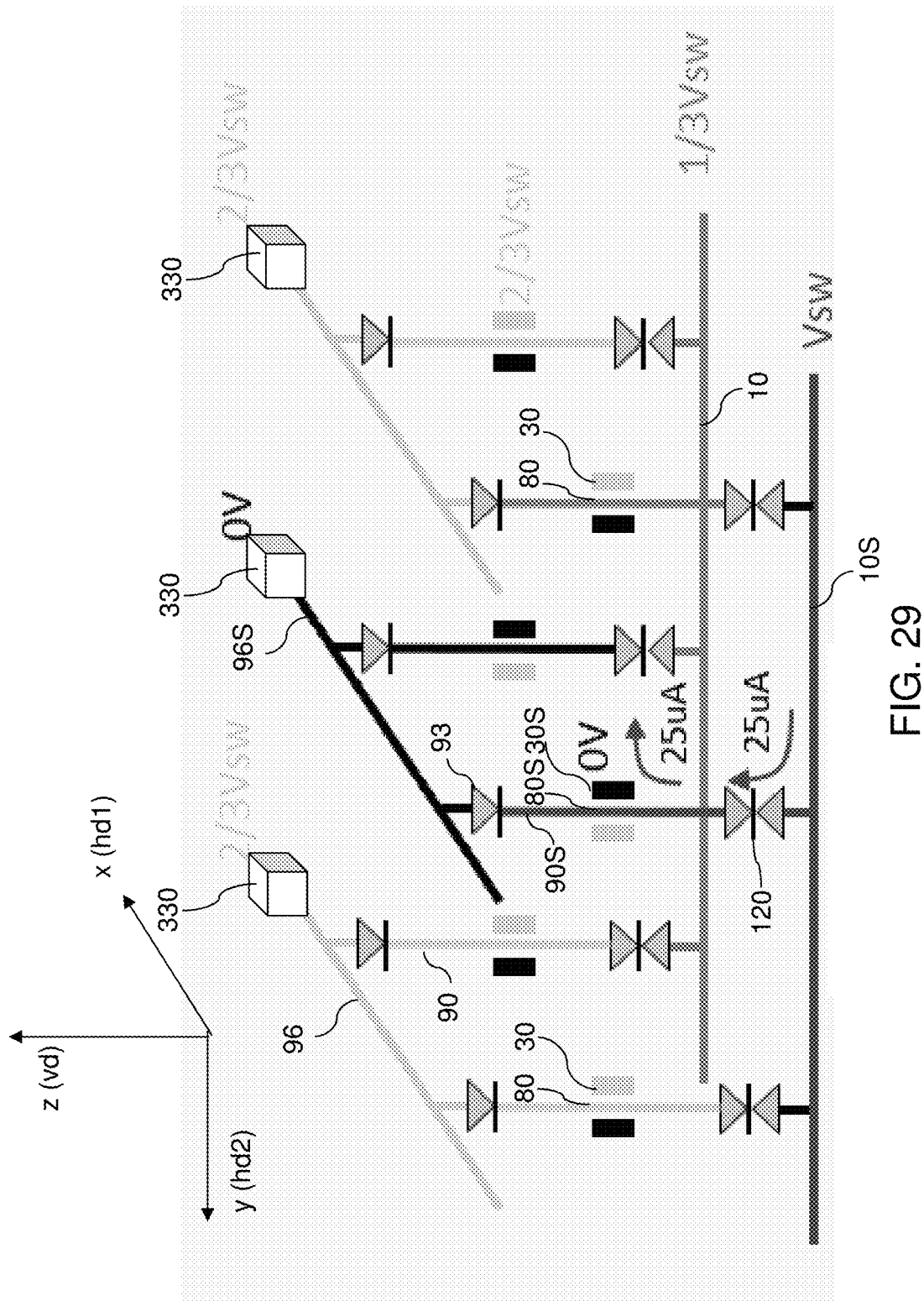
FIG. 29 illustrates a second exemplary bias scheme for programming a selected memory cell in a forward bias mode according to an embodiment of the present disclosure.
Figure 30:
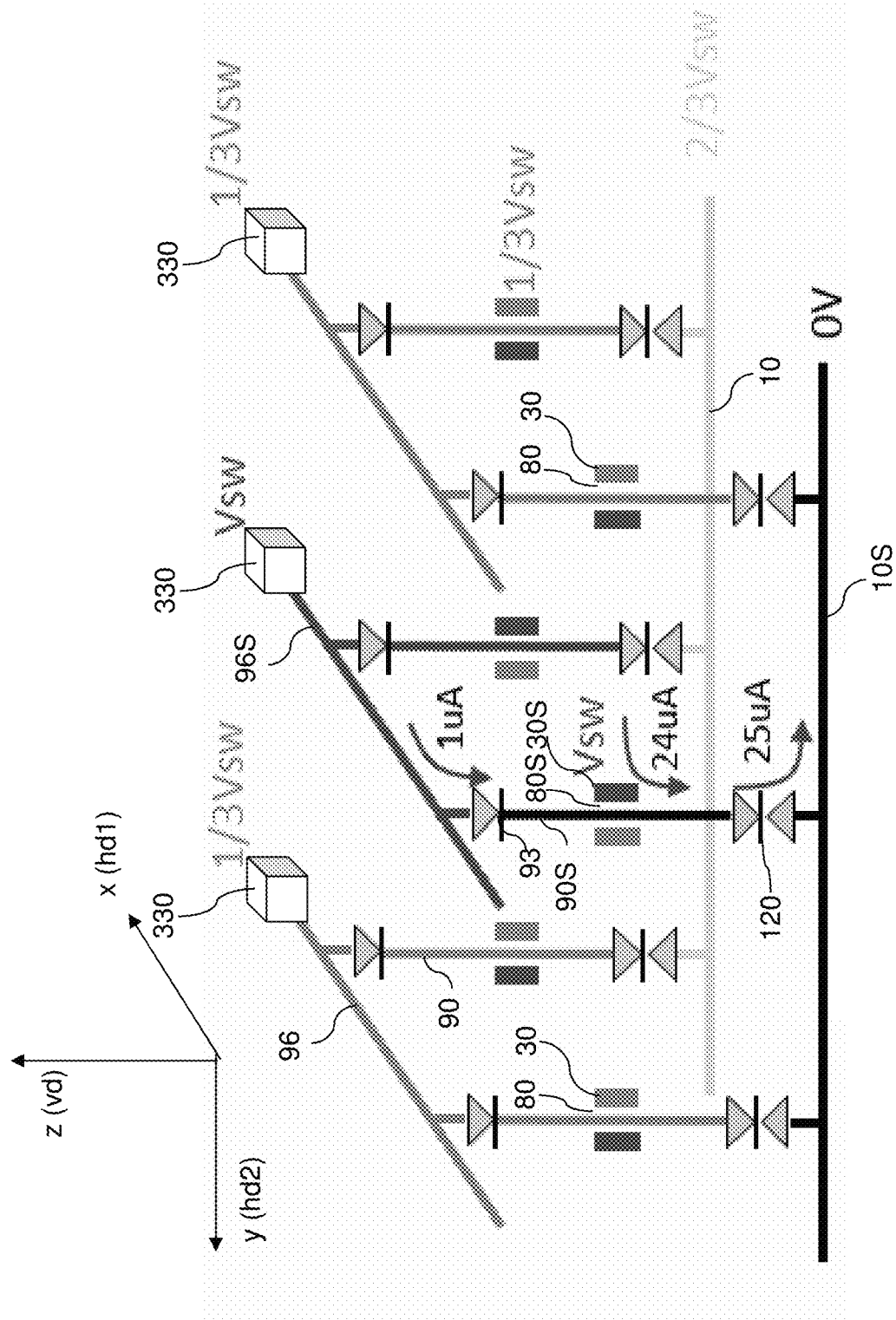
FIG. 30 illustrates the second exemplary bias scheme for programming a selected memory cell in a reverse bias mode according to an embodiment of the present disclosure.

FIGS. 27 and 28 illustrate a first exemplary bias scheme for programming a selected memory cell in a three-dimensional memory device according to an embodiment of the present disclosure. FIGS. 29 and 30 illustrate a second exemplary bias scheme for programming a selected memory cell in a three-dimensional memory device according to another embodiment of the present disclosure. FIGS. 27 and 29 illustrate exemplary bias voltages for programming in a forward bias mode. FIGS. 28 and 30 illustrate exemplary bias voltages for programming in a reverse bias mode. The word lines 30 extend in the first horizontal direction (the connection between portions of the same word line which extends the first horizontal direction hd is not shown in these figures for clarity).

Only one level of memory cells, i.e., resistive memory elements 80, and word lines 30 is illustrated in FIGS. 27-30 for clarity. As described with respect to the exemplary structures of FIGS. 13A-13D, 21A-21E, 23, and 25, multiple levels of resistive memory elements 80 and word lines 30 can be provided along the vertical direction (along the direction vd of the z-axis).

The three-dimensional memory device can be provided with an optional current limiting circuitry 330 configured to limit electrical current passing through each of the gate lines 96 to a level less than 20% (such as less than 10% and/or less than 5%) of an on-current for a single memory element among the memory elements 80. A gate line select circuitry can be configured to apply a gate select voltage V_gst that is selected from a forward switching gate voltage and a reverse switching gate voltage to a selected gate line, and to apply a gate standby voltage V_gsb that is between the forward switching voltage and the reverse switching voltage to each gate line 96 other than the selected gate line.

A voltage greater than the threshold voltage $V_{TH}$ illustrated in FIG. 3 can be selected as a switching voltage $V_{SW}$. A voltage differential greater than the threshold voltage $V_{TH}$ and applied across a selector element 120 turns on the selector element 120, and limits the voltage drop across the selector element 120 to the high conductivity state voltage drop $V_H$ described with respect to FIG. 3.

In one embodiment, the standby voltage applied to unselected global bit lines 10 and unselected gate lines 96 is between the switching voltage $V_{SW}$ applied to one of the selected global bit line 10S and the selected gate line 96S and the select voltage (which may be zero volts) applied to the other one of the selected global bit line 10S and the selected gate line 96S. The standby voltage applied to the unselected global bit lines 10 may be the same as (see FIGS. 27-28) or different from (see FIGS. 29-30) the standby voltage applied to the unselected gate lines 96. The above described threshold voltage $V_{TH}$ of the switching elements 120 (i.e., the voltage required to switch the switching elements 120 to the "on" or low resistivity state) is greater than the standby voltage applied to at least one of the unselected global bit lines 10 and/or unselected gate lines 96. Furthermore, the threshold voltage $V_{TH}$ of the switching elements 120 is between the switching voltage $V_{SW}$ and the select voltage. The word line select voltage applied to the selected word line 30S may be equal to either the switching voltage $V_{SW}$ or the select voltage, such as equal to the voltage applied to the selected gate line 96S. The word line standby voltage applied to the unselected word lines 30 may be the same as the standby voltage applied to the unselected gate lines 96.

In one embodiment, the switching voltage $V_{SW}$ is greater than the threshold voltage $V_{TH}$, and is less than twice the threshold voltage $V_{TH}$ in the case of the first exemplary biasing scheme illustrated in FIGS. 27 and 28. The switching voltage $V_{SW}$ is greater than the threshold voltage $V_{TH}$, and is less than 150% the threshold voltage $V_{TH}$ in the case of the second exemplary biasing scheme illustrated in FIGS. 29 and 30.

Referring to FIG. 27, during a forward programming mode under the first bias voltage scheme, the gate line select circuitry can apply 0 V (i.e., the select voltage) to the selected gate line 96S as the as the gate select voltage V_gst, which is the forward switching gate voltage. The unselected gate lines 96 can be biased at the voltage of ½ times the switching voltage $V_{SW}$. The selected global bit line 10S can be biased at the global bit line select voltage, which can be set to be the same as the switching voltage $V_{SW}$. The unselected global bit lines 10 can be biased at the global bit line standby voltage, which can be set at the voltage of ½ times the switching voltage $V_{SW}$. The selected word line 30S can be biased at the word line select voltage, which can be 0 V. The unselected word lines 30 can be biased at the word line standby voltage, which can be the voltage of ½ times the switching voltage $V_{SW}$. The diode at one end of the selected local bit line 90S prevents flow of electrical current from the selected local bit line 90S to the selected gate line 96. The programming current can flow from the selected global bit line 10S, through the selected selector element 120 (which is now turned-on and provided a voltage drop of the high conductivity state voltage drop $V_H$), through a portion of the selected local bit line 90S, and through the selected resistive memory element 80S to program the selected resistive memory element 80S in a forward programming mode. Depending on the orientation of the layers within the selected resistive memory element 80S, the selected resistive memory element 80S may be programmed into a high resistance state or into a low resistance state. The electrical current during programming of the selected resistive memory element 80S can be limited by the effective resistance of the selected resistive memory element 80S during programming, or may be limited by the current supply capacity of the power supply that applies the global bit line select voltage (which is $V_{SW}$ in this case) to the selected global bit line 10S. A case of a current supply capacity of 25 microampere per global bit line 10 is illustrated in FIG. 27.

Referring to FIG. 28, during a reverse programming mode under the first bias voltage scheme, the gate line select circuitry can apply $V_{SW}$ to the selected gate line 96S as the as the gate select voltage V_gst, which is the reverse switching gate voltage. The unselected gate lines 96 can be biased at the voltage of ½ times the switching voltage $V_{SW}$. The selected global bit line 10S can be biased at the global bit line select voltage, which can be set at 0 V. The unselected global bit lines 10 can be biased at the global bit line standby voltage, which can be set at the voltage of ½ times the switching voltage $V_{SW}$. The selected word line 30S can be biased at the word line select voltage, which can be set at the value of the switching voltage $V_{SW}$. The unselected word lines 30 can be biased at the word line standby voltage, which can be the voltage of ½ times the switching voltage $V_{SW}$. The current limiting circuitry 330 at one end of the selected local bit line 90S limits the electrical current from the selected gate line 96S to the selected local bit line 90S to the compliance limit of the current limiting circuitry (e.g., 1 microampere). The programming current can flow from the selected word line 30, through the selected resistive memory element 80S, through a portion of the selected local bit line 90S, through the selected selector element 120 (which is now turned-on and provided a voltage drop of the high conductivity state voltage drop $V_H$), and through the selected global bit line 10S to program the selected resistive memory element 80S in a reverse programming mode. Depending on the orientation of the layers within the selected resistive memory element 80S, the selected resistive memory element 80S may be programmed into a high resistance state or into a low resistance state. The electrical current during programming of the selected resistive memory element 80S can be limited by the effective resistance of the selected resistive memory element 80S during programming, or may be limited by the current supply capacity of the power supply that applies the global bit line select voltage (which is $V_{SW}$ in this case) to the selected global bit line 10S. A case of a current supply capacity of 25 microampere per global bit line 10 is illustrated in FIG. 28.

Referring to FIG. 29, during a forward programming mode under the second bias voltage scheme, the gate line select circuitry can apply 0 V to the selected gate line 96S as the as the gate select voltage V_gst, which is the forward switching gate voltage. The unselected gate lines 96 can be biased at the voltage of ⅔ times the switching voltage $V_{SW}$. The selected global bit line 10S can be biased at the global bit line select voltage, which can be set to be the same as the switching voltage $V_{SW}$. The unselected global bit lines 10 can be biased at the global bit line standby voltage, which can be set at the voltage of ⅓ times the switching voltage $V_{SW}$. The selected word line 30S can be biased at the word line select voltage, which can be 0 V. The unselected word lines 30 can be biased at the word line standby voltage, which can be the voltage of ⅔ times the switching voltage $V_{SW}$. The diode 93 at one end of the selected local bit line 90S prevents flow of electrical current from the selected local bit line 90S to the selected gate line 96S. The programming current can flow from the selected global bit line 10S, through the selected selector element 120 (which is now turned-on and provided a voltage drop of the high conductivity state voltage drop $V_H$), through a portion of the selected local bit line 90S, and through the selected resistive memory element 80S to program the selected resistive memory element 80S in a forward programming mode. Depending on the orientation of the layers within the selected resistive memory element 80S, the selected resistive memory element 80S may be programmed into a high resistance state or into a low resistance state. The electrical current during programming of the selected resistive memory element 80S can be limited by the effective resistance of the selected resistive memory element 80S during programming, or may be limited by the current supply capacity of the power supply that applies the global bit line select voltage (which is $V_{SW}$ in this case) to the selected global bit line 10S. A case of a current supply capacity of 25 microampere per global bit line 10 is illustrated in FIG. 29.

Referring to FIG. 30, during a reverse programming mode under the second bias voltage scheme, the gate line select circuitry can apply $V_{SW}$ to the selected gate line 96S as the as the gate select voltage V_gst, which is the reverse switching gate voltage. The unselected gate lines 96 can be biased at the voltage of ⅓ times the switching voltage $V_{SW}$. The selected global bit line 10S can be biased at the global bit line select voltage, which can be set at 0 V. The unselected global bit lines 10 can be biased at the global bit line standby voltage, which can be set at the voltage of ⅔ times the switching voltage $V_{SW}$. The selected word line 30S can be biased at the word line select voltage, which can be set at the value of the switching voltage $V_{SW}$. The unselected word lines 30 can be biased at the word line standby voltage, which can be the voltage of ⅓ times the switching voltage $V_{SW}$. The current limiting circuitry 330 at one end of the selected local bit line 90S limits the electrical current from the selected gate line 96S to the selected local bit line 90S to the compliance limit of the current limiting circuitry (e.g., 1 microampere). The programming current can flow from the selected word line 30S, through the selected resistive memory element 80S, through a portion of the selected local bit line 90S, through the selected selector element 120 (which is now turned-on and provided a voltage drop of the high conductivity state voltage drop $V_H$), and through the selected global bit line 10S to program the selected resistive memory element 80S in a reverse programming mode. Depending on the orientation of the layers within the selected resistive memory element 80S, the selected resistive memory element 80S may be programmed into a high resistance state or into a low resistance state. The electrical current during programming of the selected resistive memory element 80S can be limited by the effective resistance of the selected resistive memory element 80S during programming, or may be limited by the current supply capacity of the power supply that applies the global bit line select voltage (which is $V_{SW}$ in this case) to the selected global bit line 10. A case of a current supply capacity of 25 microampere per global bit line 10 is illustrated in FIG. 30.

In the forward programming modes shown in FIGS. 27 and 29, the switching voltage $V_{SW}$ applied to the selected global bit line 10S and the select voltage (which may be zero volts) is applied to selected gate line 96S. In the reverse programming modes shown in FIGS. 28 and 30, the switching voltage $V_{SW}$ applied to the selected gate line 96S and the select voltage (which may be zero volts) is applied to the selected global bit line 10S. The word line select voltage applied to the selected word line 30S is equal to the voltage applied to the selected gate line 96S, and the word line standby voltage applied to the unselected word lines 30 is the same as the standby voltage applied to the unselected gate lines 96.

The standby voltage applied to the unselected global bit lines 10 is the same as the standby voltage applied to the unselected gate lines 96 in FIGS. 27 and 28. The standby voltage applied to the unselected global bit lines 10 is different from the standby voltage applied to the unselected gate lines 96 in FIGS. 29 and 30. The threshold voltage $V_{TH}$ of the switching elements 120 is greater than the standby voltage applied to both the unselected global bit lines 10 and/or unselected gate lines 96 in FIGS. 27 and 28. The threshold voltage $V_{TH}$ of the switching elements 120 is greater than the standby voltage applied one of the unselected global bit lines 10 and unselected gate lines 96, but is less than the standby voltage applied to the other one of the unselected global bit lines 10 and unselected gate lines 96, in FIGS. 29 and 30, respectively.

During the forward and reverse programming modes under the first bias voltage scheme, the gate line select circuitry applies the gate line standby voltage V_gst that does not turn on unselected selector elements 120 electrically connected to each of the unselected gate lines 96 (i.e., all gate lines that are not connected to the selected local bit lines 90S). In other words, the gate line standby voltage V_gst is set at a level that does not induce a turn-on of any selector element 120 that contacts the local bit lines 90 that are connected to the unselected gate lines 96 via the diodes 93.

The three-dimensional memory device can be provided with a global bit line select circuitry configured to apply a global bit line select voltage to a selected global bit line 10, and to apply a global bit line standby voltage to each global bit line 10 other than the selected global bit line 10 (i.e., to all the unselected global bit lines). The global bit line select voltage can be selected from a forward switching global bit line voltage and a reverse switching global bit line voltage. The global bit line standby voltage is between the forward switching global bit line voltage and the reverse switching global bit line voltage. The global bit line standby voltage during the forward programming mode and the global bit line standby voltage during the reverse programming mode can be the same or different.

Application of a global bit line select voltage to a selected global bit line and concurrent application of a gate line select voltage to a selected gate line can select a single local bit line 90 among a two-dimensional array of local bit lines 90. Each local bit line 90 biased with at least one of a global bit line standby voltage and a gate line standby voltage is "unselected," i.e., is not activated for programming or sensing. Application of a suitable programming voltage to a word line 30S that is adjacent to the selected local bit line 90S can uniquely select a resistive memory element 80S (i.e., a particular memory cell in a given vertical level adjacent to the selected local bit line 90S).

The first bias voltage scheme shown in FIGS. 27 and 28 and the second bias voltage scheme shown in FIGS. 29 and 30 are merely illustrative. Other bias voltage schemes can also be employed provided that such bias voltage schemes can uniquely activate a local bit line 90 with a suitable combination of a global bit line select voltage and a gate line select voltage and uniquely select a resistive memory element with a suitable word line select voltage V_wst.

The three-dimensional memory device can be provided with a word line select circuitry configured to apply a word line select voltage V_wst to a selected electrically conductive layer within the alternating stack (30, 60) (i.e., a selected word line), and to apply a word line standby voltage V_wsb to each electrically conductive layer 30 within the alternating stack (30, 60) other than the selected electrically conductive layer (i.e., to each unselected word line) during a programming operation and during a sensing operation. The word line select voltage V_wst can be different depending on the mode of operation of the three-dimensional memory device. Further, the word line standby voltage V_wsb can be different depending on the mode of operation of the three-dimensional memory device. In one embodiment, the word line standby voltage V_wsb can be equal to both, of the gate standby voltage and the global bit line standby voltage as illustrated in FIGS. 27 and 28. In one embodiment, the word line standby voltage V_wsb can be equal to one of the gate standby voltage and the global bit line standby voltage as illustrated in FIGS. 29 and 30. Alternatively, the word line standby voltage V_wsb can be between the gate standby voltage and the global bit line standby voltage.

In one embodiment, the word line select voltage V_wst can be the same as the gate select voltage applied to the selected gate line 96S during programming of a selected memory element as illustrated in FIGS. 27, 28, 29, and 30.

The word line select circuitry can be configured to apply a word line sensing voltage to a selected set of electrically conductive layers (which may be at a same level) within the alternating stack during a sensing operation. Leakage electrical currents between selected local bit lines 90 and the selected set of word lines 30 can be simultaneously measured to determine resistive states of a plurality of memory elements 80 located between the selected local bit lines 90 and the selected set of word lines 30. In one embodiment, a row of local bit lines 90 connected to a same selected gate line 96 can be selected by selecting a plurality (or all) of the global bit lines 10 simultaneously. In this case, the sensing operation can be simultaneously performed for a row of resistive memory elements 80 that are located between the selected row of local bit lines 90 and the selected word line 30 (as embodied by word line 30S contacting each of the selected resistive memory elements 80 that are located in a row along a direction parallel to the selected word line 30S).

In one embodiment, the memory elements in the three-dimensional memory device can comprise resistive memory elements 80 configured to have two distinct resistive states (i.e., different resistivity states) that are selected based on direction of electrical bias therethrough during a programming step. Specifically, a forward programming mode and a reverse programming mode can be employed to program the resistive memory elements 80 into different resistive memory states.

In one embodiment, the three-dimensional memory device can be configured to provide a forward bias condition to a selected resistive memory element 80S contacting a selected local bit line 90S extending between the selected gate line 96S and the selected global bit line 10S, and electrically contacting the selected word line 30 upon application of the forward switching gate voltage to the selected gate line 96S and the forward switching global bit line voltage to the selected global bit line 10S. Further, the three-dimensional memory device can be configured to provide a reverse bias condition to a selected resistive memory element 80S contacting a selected local bit line 90S extending between the selected gate line 96S and the selected global bit line 10S, and electrically contacting the selected word line 30S upon application of the reverse switching gate voltage to the selected gate line 96S and the reverse switching global bit line voltage to the selected global bit line 10S. In one embodiment, each resistive memory element 80 can be configured to be programmed a respective resistive state selected from the two distinct resistive states under the forward bias condition and under the reverse bias condition, respectively.

In one embodiment, the memory elements can be provided as material portions within a single memory material layer 180 vertically extending over sidewalls of the alternating stack (30, 60) as illustrated in FIGS. 13A-13D or FIGS. 21A-21E, or as material portions within multiple memory material layers 180 including horizontal portions located between each neighboring pair of an insulating layer 60 and an electrically conductive layer 30 within the alternating stack (30, 60) as illustrated in FIGS. 23 and 25.

In one embodiment, the memory elements 80 can comprise a resistive memory material selected from a filament-forming dielectric material providing a reduced resistivity upon formation of conductive filaments therein (as illustrated in FIG. 4) and vacancy modulated conductive oxide material providing an increased resistivity upon reduction of oxygen vacancy therein (as illustrated in FIG. 5).

The three-dimensional memory devices of the present disclosure can include: an alternating stack of electrically conductive layers 30 and insulating layers 60, wherein each layer in the alternating stack (30, 60) laterally extends along a first horizontal direction hd1, local bit lines 90 located over sidewalls of layers within the alternating stack (30, 60) and vertically extending from a bottommost layer within the alternating stack (30, 60) to a topmost layer within the alternating stack (30, 60), memory elements 80 located at each overlap region between the electrically conductive layers 30 and the local bit lines 90, diodes 93 located at a first end of each of the local bit lines 90, and a selector material layer 20 located at a second end of each of the local bit lines 90 and comprising a material that provides a conductivity change of at least one order of magnitude upon application of an electrical bias voltage. A selected local bit line 90S can be activated by locally lowering resistance of a region of the selector material layer 20 that underlies, or overlies, the selected bit line 90S (for example, by applying a voltage bias that is equal to, or exceeds, the threshold voltage $V_{TH}$). A selected electrically conductive layer 30 S can be activated by applying a word line select voltage thereto. A memory element 80S located between the selected local bit line 90S and the selected electrically conductive layer 30S is selected for programming or sensing.

The three-dimensional memory device can be configured to perform each of the operations described above. By performing the operations described above on the three-dimensional memory device, the three-dimensional memory device can be operated as a resistive random access memory device. Each local bit line 90 can operate as a self-selecting, i.e., self-activating, bit line upon application of a global bit line select voltage to the global bit line 10 connected to the respective local bit line 90 and a gate line select voltage to the gate line 96 connected to the respective gate line 96.

The self selecting bit line device of embodiments of the present disclosure that lacks the transistor selector elements for local bit lines may have one or more of the following non-limiting advantages over prior art devices having transistor selector elements for local bit lines: simpler structure, lower manufacturing cost, and more uniform and higher switching current and lower leakage current because the lower quality polysilicon channel of the selector transistor channel is omitted.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of word lines and insulating layers;
   a plurality of gate lines;
   a plurality of global bit lines;
   a plurality of local bit lines vertically extending through the alternating stack, wherein each local bit line of the plurality of local bit lines contacts a respective one of the plurality of gate lines and a respective one of the plurality of global bit lines;
   a plurality of memory elements located at each overlap region between the word lines and the local bit lines;
   a plurality of diodes, wherein each of the plurality of diodes is located in electrical series between each of the local bit lines and the respective one of the plurality of gate lines; and
   a plurality of selector elements, wherein each of the plurality of selector elements is located in electrical series between each of the local bit lines and the respective one of the plurality of global bit lines, and wherein the plurality of selector elements comprise a material that provides a conductivity change of at least one order of magnitude upon application of a voltage.

2. The three-dimensional memory device of claim 1, wherein the plurality of gate lines extend along first horizontal direction, and the plurality of global bit lines extend in a second horizontal direction that is different from the first horizontal direction.

3. The three-dimensional memory device of claim 2, further comprising a current limiting circuitry configured to limit electrical current passing through each of the gate lines to a level less than 20% of an on-current for a single memory element among the plurality of memory elements.

4. The three-dimensional memory device of claim 2, wherein:
   each of the plurality of diodes contacts an upper end of a respective one of the plurality of the local bit lines;
   each of the plurality of selector elements contacts a lower end of a respective one of the plurality of the local bit lines;
   the plurality of gate lines are located above the alternating stack; and
   the plurality of global bit lines are located below the alternating stack.

5. The three-dimensional memory device of claim 2, wherein:
   each of the plurality of diodes contacts a lower end of a respective one of the plurality of the local bit lines;
   each of the plurality of selector elements contacts an upper end of a respective one of the plurality of the local bit lines;
   the plurality of gate lines are located below the alternating stack; and
   the plurality of global bit lines are located above the alternating stack.

6. The three-dimensional memory device of claim 2, wherein the plurality of selector elements comprise ovonic threshold switch elements.

7. The three-dimensional memory device of claim 2, wherein the plurality of selector elements comprise volatile sub-stoichiometric, non-Ohmic oxide material elements.

8. The three-dimensional memory device of claim 2, further comprising:
   a gate line select circuitry configured to apply a gate select voltage that is selected from a forward switching gate voltage and a reverse switching gate voltage to a selected gate line, and to apply a gate standby voltage that is between the forward switching voltage and the reverse switching voltage to each gate line other than the selected gate line;
   a global bit line select circuitry configured to apply a global bit line select voltage that is selected from a forward switching global bit line voltage and a reverse switching global bit line voltage to a selected global bit line, and to apply a global bit line standby voltage that is between the forward switching global bit line voltage and the reverse switching global bit line voltage to each global bit line other than the selected global bit line; and a word line select circuitry configured to apply a word line select voltage to a selected word line within the alternating stack, and to apply a word line standby voltage to each word line within the alternating stack other than the selected word line during a programming operation.

9. The three-dimensional memory device of claim 8, wherein the word line standby voltage is between, or equal to one of, the gate standby voltage and the global bit line standby voltage and wherein the word line select voltage is the same as the gate select voltage applied to the selected gate line during programming of a selected memory element.

10. The three-dimensional memory device of claim 1, wherein the memory elements comprise a resistive memory material selected from a filament-forming dielectric material providing a reduced resistivity upon formation of conductive filaments therein and vacancy modulated conductive oxide material providing an increased resistivity upon reduction of oxygen vacancy therein.

11. The three-dimensional memory device of claim 10, wherein the memory elements are provided as material portions within a single memory material layer vertically extending over sidewalls of the alternating stack, or as material portions within multiple memory material layers including horizontal portions located between each neighboring pair of an insulating layer and a word line within the alternating stack.

12. The three-dimensional memory device of claim 1, wherein there are no transistors connected in electrical series between the plurality of local bit lines and the plurality of global bit lines.

13. A method of operating a three-dimensional memory device, comprising:
providing a three-dimensional memory device, which comprises a plurality of gate lines, a plurality of global bit lines, a plurality of word lines, a plurality of diodes, a plurality of selector elements, a plurality of local bit lines, and a plurality of memory elements, wherein each local bit line of the plurality of bit lines contacts a respective one of the plurality of gate lines and a respective one of the plurality of global bit lines, and each memory element of the plurality of memory elements is located at each overlap region between the word lines and the local bit lines;
applying a word line select voltage to a selected word line; and
applying a switching voltage to a selected local bit line through one of the plurality of selector elements and through one of the plurality of diodes to program a selected memory element located between the selected word line and the selected local bit line.

14. The method of claim 13, wherein:
the plurality of local bit lines vertically extend through an alternating stack of insulating layers and the word lines;
each of the plurality of diodes is located in electrical series between each of the local bit lines and a respective one of the plurality of gate lines; and
each of the plurality of selector elements is located in electrical series between each of the local bit lines and a respective one of the plurality of global bit lines; and the plurality of selector elements comprise a material that provides a conductivity change of at least one order of magnitude upon application of a voltage.

15. The method of claim 14, wherein:
the plurality of global bit lines and the plurality of gate lines form a cross point array in which a selected global bit line and a selected gate line are used to select the selected local bit line; and
applying the switching voltage to the selected local bit line comprises activating the selected local bit line by lowering a resistance of the selector element that underlies or overlies the selected bit line.

16. The method of claim 15, further comprising:
applying the switching voltage to one of the selected global bit line and the selected gate line, and applying a select voltage to the other one of the selected global bit line and the selected gate line;
applying a standby voltage which is between the switching voltage and the select voltage to unselected global bit lines and to unselected gate lines; and
applying a word line standby voltage to unselected word lines.

17. The method of claim 16, wherein:
the switching voltage is applied to the selected global bit line and the select voltage is applied to selected gate line in a forward programming mode;
the switching voltage is applied to the selected gate line and the select voltage is applied to the selected global bit line in a reverse programming modes;
a threshold voltage of the plurality of selector elements required to lower the resistance of the selector element is greater than the standby voltage applied to at least one of the unselected global bit lines and the unselected gate lines; and
the threshold voltage of the switching elements is between the switching voltage and the select voltage.

18. The method of claim 17, wherein:
the switching voltage is zero volts;
the standby voltage applied to the unselected global bit lines is the same as or different from the standby voltage applied to the unselected gate lines;
the word line select voltage is equal to the voltage applied to the selected gate line; and
the word line standby voltage is equal to the standby voltage applied to the unselected gate lines.

19. The method of claim 15, further comprising limiting electrical current passing through each of the gate lines to a level less than 20% of an on-current for a single memory element among the plurality of memory elements.

20. The method of claim 13, wherein the plurality of memory elements comprise a resistive memory material selected from a filament-forming dielectric material providing a reduced resistivity upon formation of conductive filaments therein and vacancy modulated conductive oxide material providing an increased resistivity upon reduction of oxygen vacancy therein.

21. The method of claim 13, wherein the plurality of selector elements comprise ovonic threshold switch elements or volatile sub-stoichiometric, non-Ohmic oxide material elements.

22. The method of claim 13, wherein there are no transistors connected in electrical series between the plurality of local bit lines and the plurality of global bit lines.

* * * * *